(12) United States Patent
Tozawa et al.

(10) Patent No.: US 9,793,456 B2
(45) Date of Patent: Oct. 17, 2017

(54) MOLDED RESIN BODY FOR SURFACE-MOUNTED LIGHT-EMITTING DEVICE, MANUFACTURING METHOD THEREOF, AND SURFACE-MOUNTED LIGHT-EMITTING DEVICE

(71) Applicant: KANEKA CORPORATION, Osaka-shi, Osaka (JP)

(72) Inventors: Tomokazu Tozawa, Settsu (JP); Takahisa Iwahara, Settsu (JP); Hiroshi Ogoshi, Settsu (JP); Kazuhiko Hirabayashi, Settsu (JP); Shuhei Ozaki, Settsu (JP); Satoaki Iba, Settsu (JP); Kazuaki Kanai, Settsu (JP); Yasushi Kakehashi, Settsu (JP); Takao Manabe, Settsu (JP); Mitsuhiro Hori, Settsu (JP); Ryoichi Narita, Settsu (JP)

(73) Assignee: KANEKA CORPORATION, Osaka (JP)

( * ) Notice: Subject to any disclaimer, the term of this patent is extended or adjusted under 35 U.S.C. 154(b) by 577 days.

(21) Appl. No.: 14/344,075

(22) PCT Filed: Sep. 26, 2012

(86) PCT No.: PCT/JP2012/074757
§ 371 (c)(1),
(2) Date: Mar. 11, 2014

(87) PCT Pub. No.: WO2013/047606
PCT Pub. Date: Apr. 4, 2013

(65) Prior Publication Data
US 2015/0008455 A1 Jan. 8, 2015

(30) Foreign Application Priority Data

Sep. 30, 2011 (JP) ................................. 2011-217103
Mar. 9, 2012 (JP) ................................. 2012-053078
Jun. 4, 2012 (JP) ................................. 2012-127114

(51) Int. Cl.
*H01L 33/62* (2010.01)
*H01L 33/60* (2010.01)
(Continued)

(52) U.S. Cl.
CPC ........ *H01L 33/62* (2013.01); *B29C 45/14655* (2013.01); *B29C 45/372* (2013.01);
(Continued)

(58) Field of Classification Search
CPC ....................... H01L 21/565; Y10T 428/24802
See application file for complete search history.

(56) References Cited

U.S. PATENT DOCUMENTS

| | | | |
|---|---|---|---|
| 6,495,861 B1 * | 12/2002 | Ishinaga | G09F 9/33 257/99 |
| 7,943,946 B2 * | 5/2011 | Ito | H01L 33/60 257/98 |
| 2009/0267104 A1 * | 10/2009 | Hsu | H01L 33/60 257/99 |

FOREIGN PATENT DOCUMENTS

| | | |
|---|---|---|
| JP | 61-269338 A | 11/1986 |
| JP | 63-107532 A | 5/1988 |

(Continued)

OTHER PUBLICATIONS

Machine translation of detailed description of JP 11-307820 acquired on Aug. 4, 2016.*

(Continued)

*Primary Examiner* — Gerard Higgins
(74) *Attorney, Agent, or Firm* — Westerman, Hattori, Daniels & Adrian, LLP

(57) ABSTRACT

A molded resin body for surface-mounted light-emitting device has a cured resin body integrally molded with a plurality of leads and a concave portion to which the (Continued)

plurality of leads are exposed at the bottom portion, in which the ten-point average roughness (Rz) of the opening surface of the concave portion is 1 μm to 10 μm, the glass transition temperature of the cured resin body is 10° C. or higher and the glass transition temperature is a value measured using a thermomechanical analyzer (TMA) under the conditions of a temperature range of −50 to 250° C., a temperature elevation rate of 5° C./min, and a sample size length of 1 to 5 mm, and the optical reflectance at 460 nm of the opening surface of the concave portion is 80% or more and the optical reflectance retention rate on the opening surface after heating the molded resin body at 180° C. for 72 hours is 90% or more.

14 Claims, 8 Drawing Sheets

(51) Int. Cl.
| | | |
|---|---|---|
| *B29C 45/14* | (2006.01) |
| *B29C 45/37* | (2006.01) |
| *C08L 83/04* | (2006.01) |
| *H01L 23/00* | (2006.01) |
| *H05K 13/00* | (2006.01) |
| *C08G 77/54* | (2006.01) |
| *C08K 5/3492* | (2006.01) |
| *C08G 77/12* | (2006.01) |
| *C08G 77/20* | (2006.01) |
| *C08G 77/14* | (2006.01) |

(52) U.S. Cl.
CPC .......... *C08G 77/54* (2013.01); *C08K 5/34924* (2013.01); *C08L 83/04* (2013.01); *H01L 24/97* (2013.01); *H01L 33/60* (2013.01); *H05K 13/00* (2013.01); *C08G 77/12* (2013.01); *C08G 77/14* (2013.01); *C08G 77/20* (2013.01); *H01L 2224/45144* (2013.01); *H01L 2224/48091* (2013.01); *H01L 2224/48247* (2013.01); *H01L 2224/48257* (2013.01); *H01L 2924/01322* (2013.01); *H01L 2924/12036* (2013.01); *H01L 2924/12041* (2013.01); *H01L 2924/12042* (2013.01); *H01L 2924/12044* (2013.01); *H01L 2924/15747* (2013.01); *H01L 2924/181* (2013.01); *H01L 2933/0033* (2013.01); *H01L 2933/0066* (2013.01); *Y10T 428/24802* (2015.01); *Y10T 428/24851* (2015.01); *Y10T 428/24917* (2015.01)

(56) References Cited

FOREIGN PATENT DOCUMENTS

| | | | |
|---|---|---|---|
| JP | 11-307820 | A | 11/1999 |
| JP | 2003-282948 | A | 10/2003 |
| JP | 2004-152952 | A | 5/2004 |
| JP | 2005-146191 | A | 6/2005 |
| JP | 2007218980 | A * | 8/2007 |
| JP | 2007-235085 | A | 9/2007 |
| JP | 2008-91818 | A | 4/2008 |
| JP | 2008-162016 | A | 7/2008 |
| JP | 2009-155415 | A | 7/2009 |
| JP | 4608294 | B2 | 1/2011 |

OTHER PUBLICATIONS

Machine translation of detailed description of JP 2008-091818 acquired on Aug. 4, 2016.*
Machine translation of detailed description of JP 2007-218980 acquired on Aug. 4, 2016.*
Machine translation of detailed description of JP 2005-146191 acquired on Aug. 4, 2016.*
International Search Report dated Dec. 25, 2012, issued in corresponding application No. PCT/JP2012/074757.

* cited by examiner

[Fig. 1]
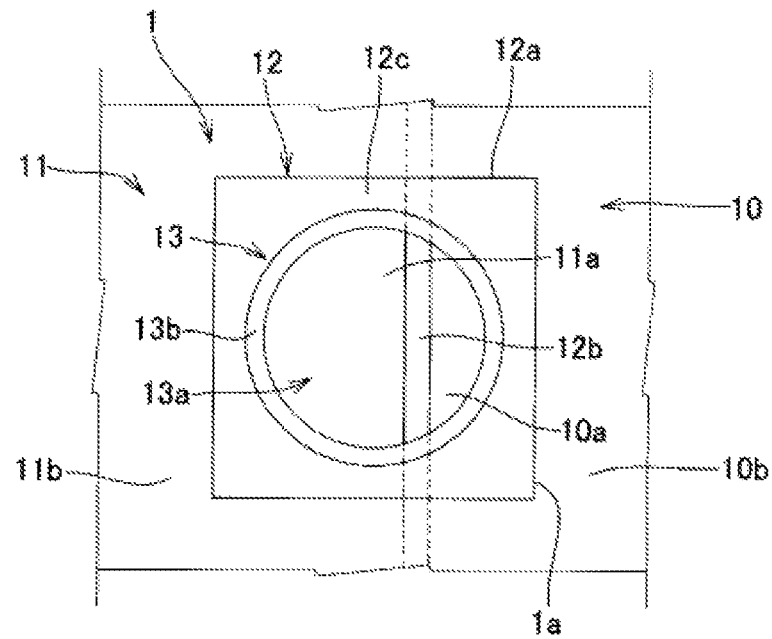
[Fig. 2]
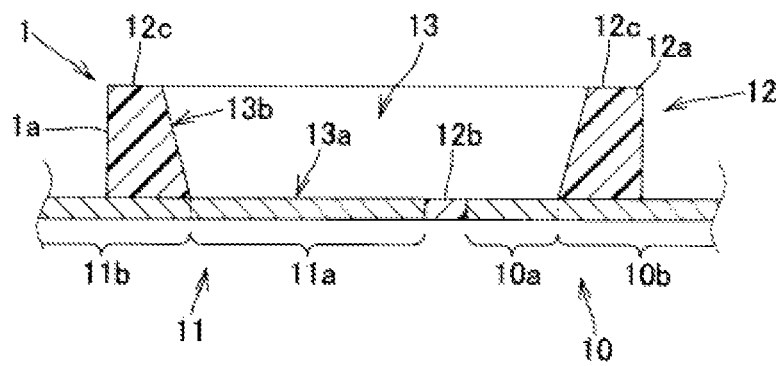
[Fig. 3]
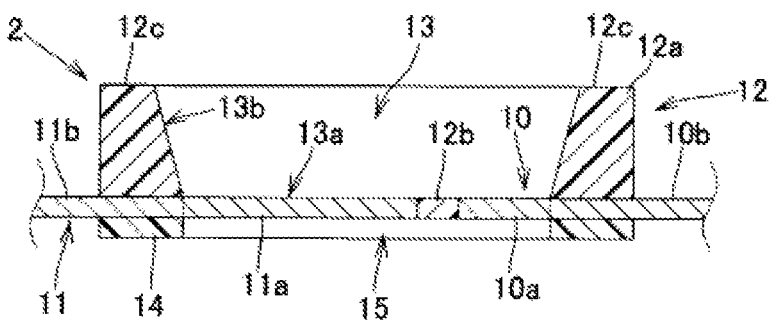

[Fig. 4]
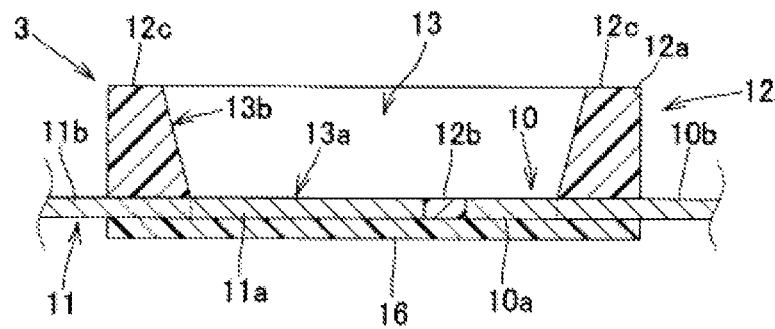
[Fig. 5]
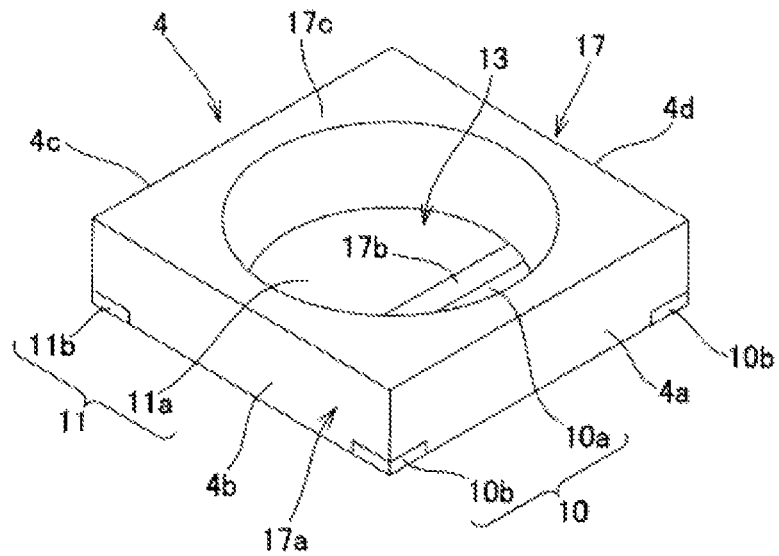
[Fig. 6]
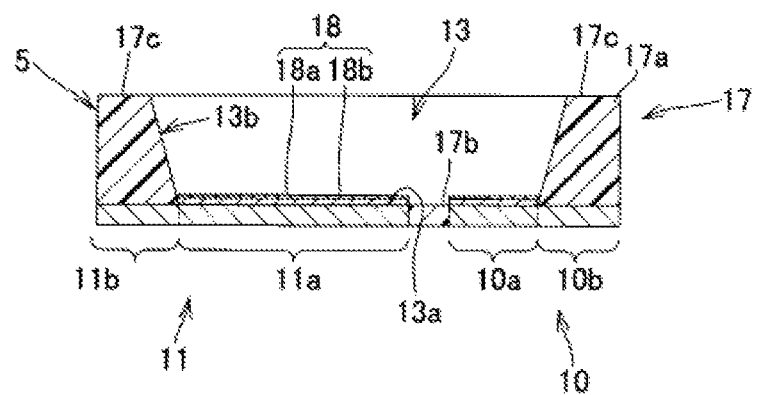

[Fig. 7]
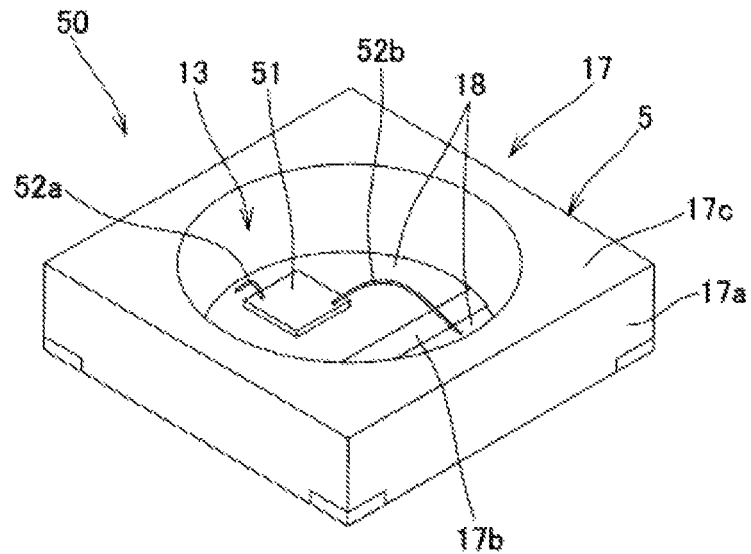
[Fig. 8]
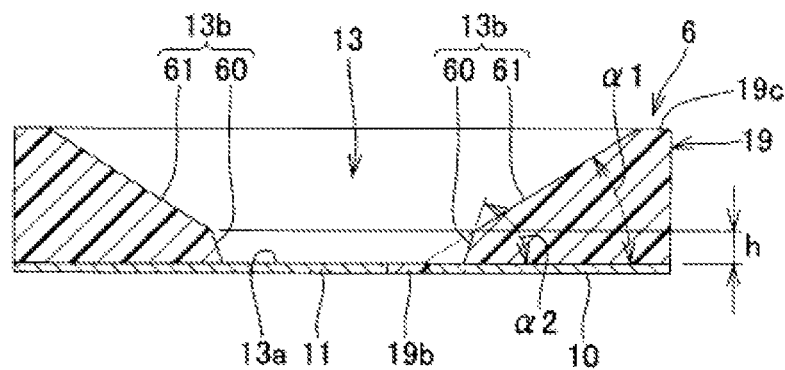

[Fig. 9]
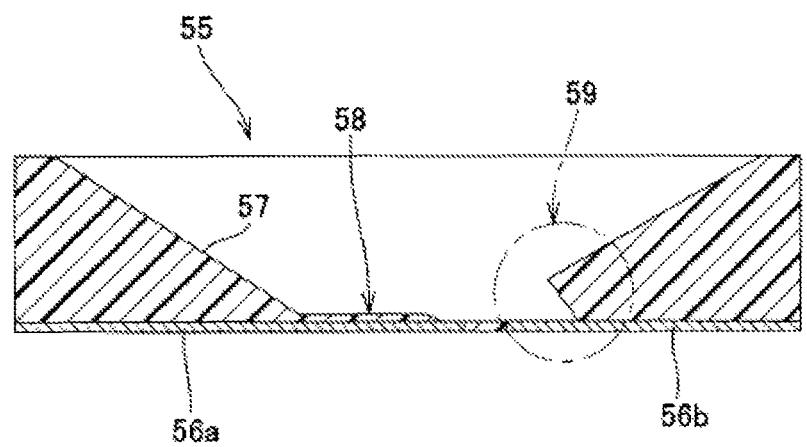

[Fig. 10]
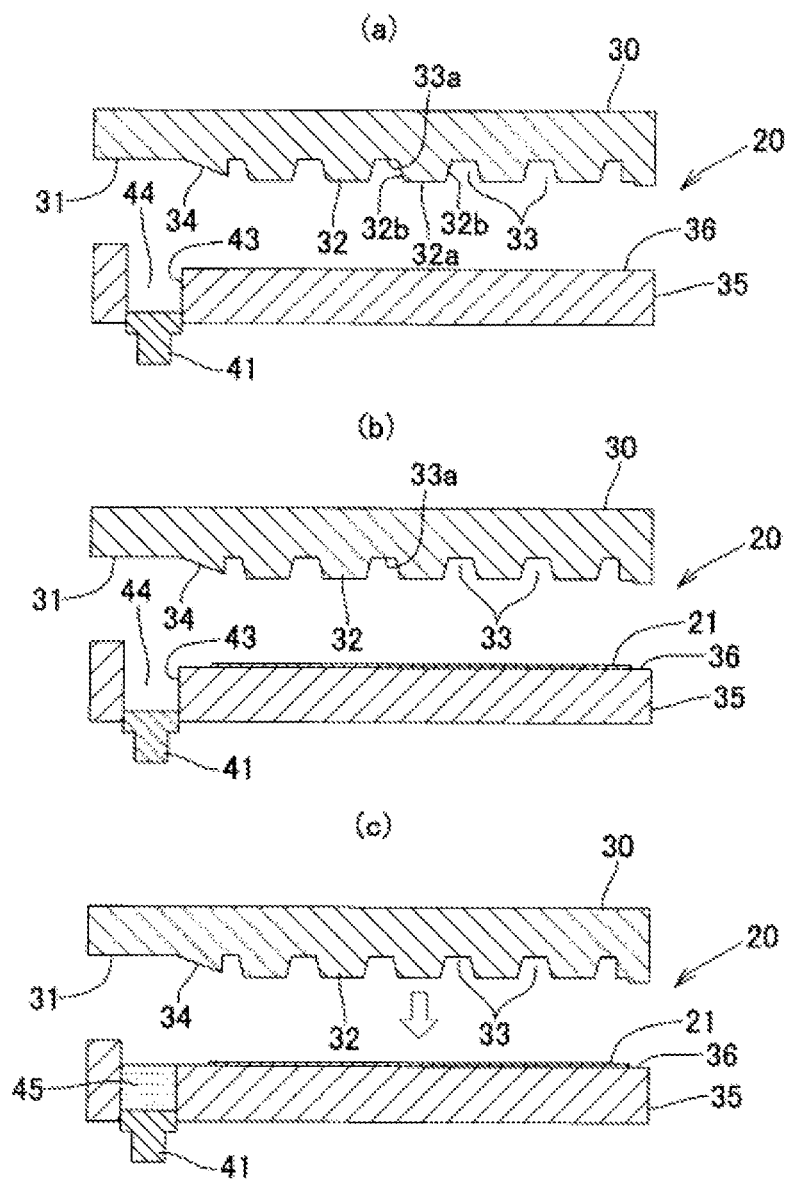

[Fig. 11]
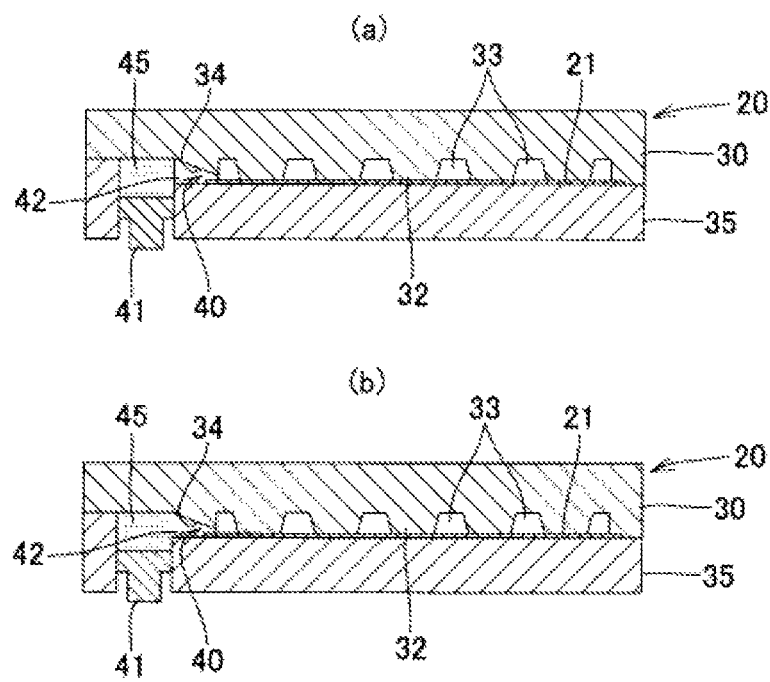
[Fig. 12]
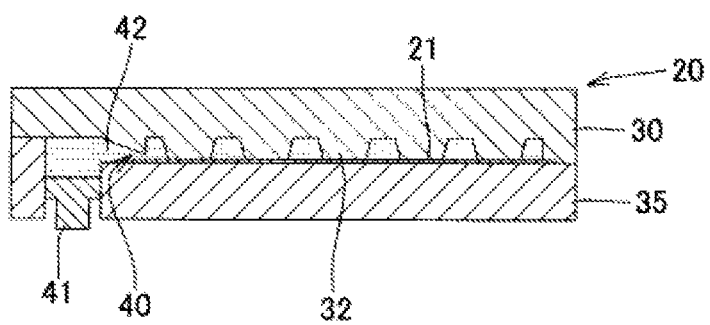

[Fig. 13]
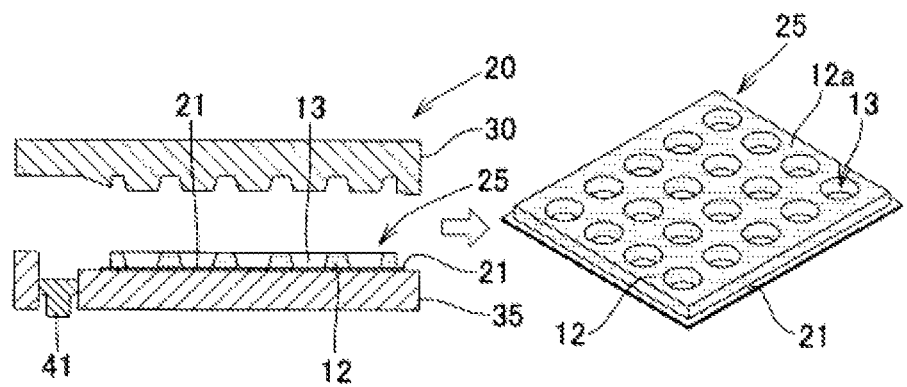
[Fig. 14]
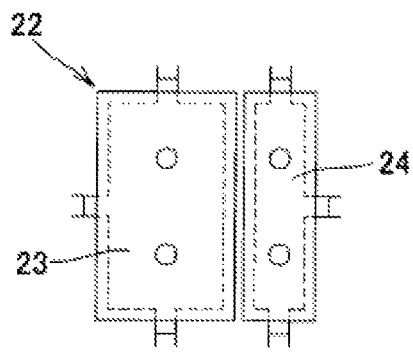

[Fig. 15]
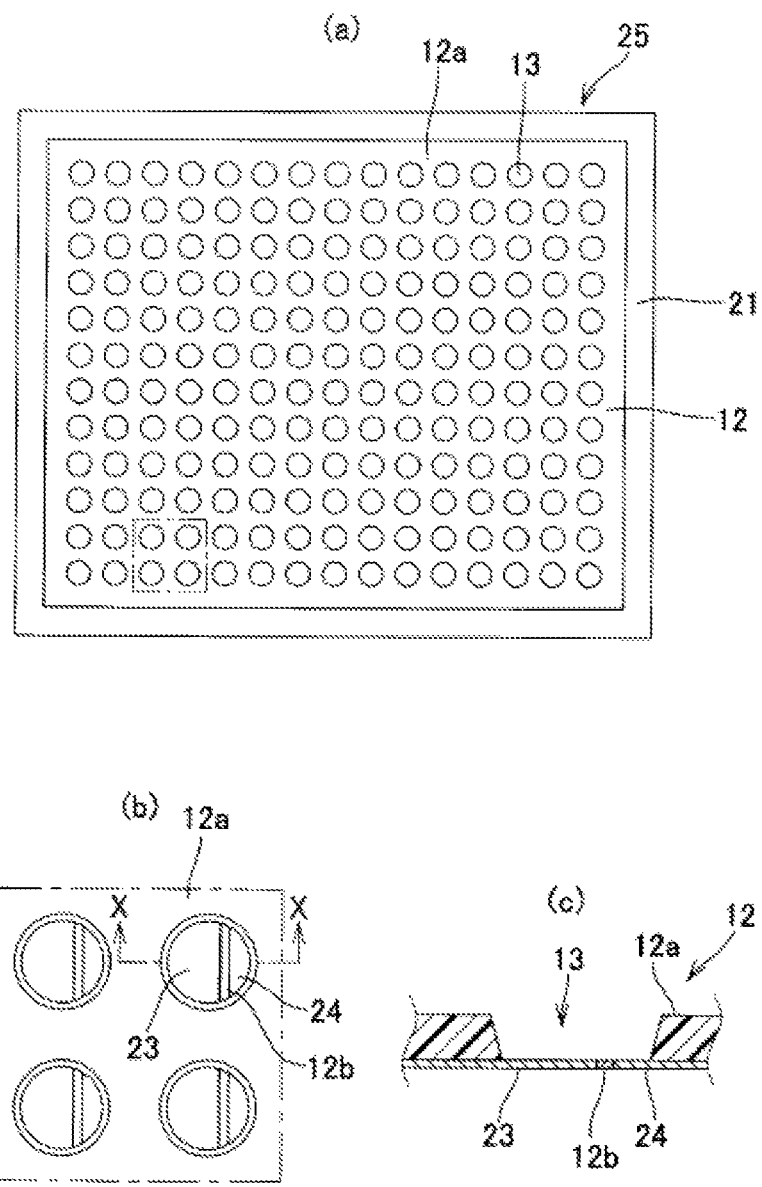

MOLDED RESIN BODY FOR SURFACE-MOUNTED LIGHT-EMITTING DEVICE, MANUFACTURING METHOD THEREOF, AND SURFACE-MOUNTED LIGHT-EMITTING DEVICE

TECHNICAL FIELD

The present invention relates to a molded resin body for surface-mounted light-emitting device, a manufacturing method thereof, and a surface-mounted light-emitting device.

BACKGROUND ART

A surface-mounted light-emitting device on which light-emitting elements, such as a light-emitting diode (LED) and a laser diode (LD), are mounted has a large number of advantages in that color reproduction of light with high-intensity light excellent in visibility can be achieved, the size thereof can be reduced, the power consumption is low, and long-life is achieved. Therefore, the surface-mounted light-emitting device is used as lighting devices, such as electric bulbs, downlights, base lights, streetlights, and signals, back light sources of liquid crystal displays and the like, and the like, for example, and the use thereof has rapidly expanded.

A typical surface-mounted light-emitting device has a lead frame in which a pair of leads are disposed in such a manner as to be separated from each other, a molded resin body having a concave portion to which the lead frame is exposed at the bottom portion and an insulation portion which insulates the pair of leads, a light-emitting element mounted on the lead frame exposed to the bottom portion of the concave portion and connected to the pair of leads in such a manner that electricity can be conducted therebetween, and a transparent resin layer formed by filling the concave portion with a transparent resin, for example (Patent Documents 1 and 2). Herein, the molded resin body has a function of protecting the light-emitting element and reflecting light emitted from the light-emitting element to the front of the light-emitting device to increase the luminance.

When such a surface-mounted light-emitting device is disposed in such a manner that the light-emitting element faces upward in a perpendicular direction, the light emitted downward from the light-emitting element enters the surface of the lead frame exposed to the bottom portion of the concave portion, and the light in the transverse direction (horizontal direction) emitted from the light-emitting element enters the inner wall surface of the concave portion of the molded resin body. In order to reflect the light entering from the light-emitting element to the front to increase the luminance, an increase in the optical reflectance of the surface of the lead frame and the surface of the molded resin body (hereinafter referred to as "optical reflectance") has been demanded. Therefore, for example, an Ag plating layer is formed as a reflective film on the lead frame surface.

Herein, since Ag used as the plating layer on the lead frame surface shows the highest optical reflectance among metals, Ag is suitable as the material of the reflective film in order to reflect much light. However, Ag has a problem in that Ag reacts with halogen ion and sulfur contained in the atmosphere or sealing resin to generate substances which discolor the reflective film surface into dark brown, such as halides, e.g., chlorides (AgCl) and sulfides ($Ag_2S$), with the progress of the operation time of the surface-mounted light-emitting device, so that the optical reflectance is reduced. Moreover, Ag has a characteristic of aggregating due to the heat generated from the light-emitting element. Also due to the characteristic, Ag has a problem of reducing the optical reflectance.

In order to solve the problems, Patent Document 3 discloses a lead frame in which silicone resin is used for sealing resin and a pure Ag plating layer on a reflective surface is further coated with an Ag—Au alloy plating layer which is difficult to form chlorides and sulfides, for example. However, since the Ag—Au alloy plating layer contains an alloy containing Au in which the Ag content is limited to less than 50 mass % as the main component, the formation operation thereof is complicated. Further, since the thickness is 0.1 µm or more and 0.6 µm or less, the cost also becomes high.

On the other hand, the surface-mounted light-emitting device is manufactured by transfer molding using thermosetting resin as a resin material which gives a molded resin body, for example. More specifically, the surface-mounted light-emitting device is manufactured using a mold having an upper mold having an upper mating surface in which a concave portion corresponding to the three dimensional shape of the molded resin body is formed at a predetermined position, a lower mold having a flat lower mating surface, and a resin injection hole by a method including following (a) to (f) processes (Patent Documents 1 and 4).
(a) Process of holding and fixing the lead frame by the upper mating surface and the lower mating surface.
(b) Process of injecting liquid thermosetting resin into the internal space formed with the concave portion of the upper mating surface and the lead frame and/or the lower mating surface from the resin injection hole.
(c) Process of heating a mold to cure the injected liquid thermosetting resin, and then bonding the cured resin body to a predetermined position of the lead frame.
(d) Process of removing the same from the mold to thereby obtain a molded resin body in which the lead frame and the cured resin body are integrally formed and which has a concave portion to which the lead frame is exposed at the bottom portion.
(e) Process of mounting a light-emitting element on the lead frame exposed to the bottom portion of the concave portion in such a manner that electricity can be conducted therebetween.
(f) Process of filling the concave portion with transparent resin to seal the light-emitting element.

According to the above-described former manufacturing method, an advantage that a large number of surface-mounted light-emitting devices can be manufactured at once is obtained by utilizing the transfer molding. However, in the mold release process of (d), the mold releasability of the molded resin body from the mold is very poor, and therefore there is a problem in that the deformation of the molded resin body is likely to occur and, depending on circumstances, the cohesive failure occurs, so that the molded resin body is broken. Therefore, in the former manufacturing method, the defective product ratio sometimes becomes very high.

Furthermore, in the above-described former manufacturing method, there is a problem in that chipping occurs in the molded resin body in a portion where the molded resin body having the concave portion and the lead frame contact each other and a resin burr is formed at the bottom portion of the concave portion of the molded resin body, so that the product yield decreases.

CITATION LIST

Patent Literatures

Patent Document 1: JP-A No. H11-307820
Patent Document 2: Japanese Patent No. 4608294

Patent Document 3: JP-A No. 2008-091818
Patent Document 4: JP-A No. 2007-235085

SUMMARY OF INVENTION

Technical Problem

It is an object of the present invention to provide a molded resin body for surface-mounted light-emitting device which is excellent in releasability from a mold, in which deformation, resin chipping, and cohesive failure are difficult to occur in the release from the mold, and the adhesion of a resin burr to a lead frame portion is suppressed, a manufacturing method thereof, and a surface-mounted light-emitting device employing the same.

Solution to Problem

The present inventors have repeatedly conducted research in order to solve the above-described problems. As a result, the present inventors found that when the ten-point average roughness (Rz) of the bottom surface of the upper concave portion to be formed on the upper mating surface of the upper mold is adjusted in a specific range, the mold releasability of the molded resin body from a mold notably improves without adversely affecting the optical reflectance and the like of the molded resin body to be obtained, and when releasing the molded resin body from the mold, the deformation of the molded resin body, resin chipping, cohesive failure, adhesion of a resin burr to a lead frame portion, and the like hardly occur. The present inventors also found that, by carrying out transfer molding using the mold containing the upper mold having such an upper concave portion, molded resin bodies with almost the same three dimensional shape can be efficiently mass-produced. The present inventors have accomplished the present invention based on these findings.

More specifically, the present invention provides a molded resin body for surface-mounted light-emitting device, a manufacturing method thereof, and the surface-mounted light-emitting device employing the molded resin body described below.

1. A molded resin body for surface-mounted light-emitting device has a cured resin body integrally molded with a plurality of leads and a concave portion to which the plurality of leads are exposed at the bottom portion, in which the ten-point average roughness (Rz) of the opening surface of the concave portion is 1 μm or more and 10 μm or less and the glass transition temperature of the cured resin body is 10° C. or higher, the glass transition temperature is a value measured using a thermomechanical analyzer (TMA) under the conditions of a temperature range of −50 to 250° C., a temperature elevation rate of 5° C. /min, and a sample size length of 1 to 5 mm, and the optical reflectance at 460 nm of the opening surface of the concave portion is 80% or more and the optical reflectance retention rate on the opening surface after heating the molded resin body at 180° C. for 72 hours is 90% or more.

2. The molded resin body for surface-mounted light-emitting device according to 1 above, in which at least one peak top in the solid $^{13}$C-nuclear magnetic resonance spectrum of the cured resin body is present in the range of −1 ppm to 2 ppm and 13 ppm to 18 ppm.

3. The molded resin body for surface-mounted light-emitting device according to 1 or 2 above, in which the cured resin body is a cured substance of a thermosetting resin composition (X) containing (A) an organic compound containing at least two carbon-carbon double bonds having reactivity with an SiH group in one molecule, (B) a compound containing at least two SiH groups in one molecule, (C) a hydrosilylation catalyst, (D) a silicone compound containing at least one carbon-carbon double bond having reactivity with an SiH group in one molecule, and (E) an inorganic filler.

4. The molded resin body for surface-mounted light-emitting device according to any of 1 to 3 above, in which at least one of the plurality of leads has a metal layer on the surface thereof, the metal layer has an outermost surface layer on the surface side thereof, and the outermost surface layer is an Au layer, an Au alloy layer, or a glossy Ni layer having a thickness of 0.003 to 0.05 μm.

5. The molded resin body for surface-mounted light-emitting device according to 4 above, in which the metal layer has the outermost surface layer and a second metal layer provided between the lead surface and the outermost surface layer, and the second metal layer is an Ag layer, a Pd layer, or a laminated body of an Ag layer and a Pd layer.

6. The molded resin body for surface-mounted light-emitting device according to 4 or 5 above, in which the metal layer is a plating layer.

7. The molded resin body for surface-mounted light-emitting device according to any of 1 to 6 above, in which the concave portion has a bottom surface which is the surface of the plurality of leads exposed to the bottom portion, the inner wall surface of the concave portion has a second inclined surface which is continuous to the bottom surface and rises from the periphery of the bottom surface and has an inclination angle to the bottom surface of 45° to 90° and a first inclined surface which is continuous to the second inclined surface and rises from the periphery of the second inclined surface towards the opening surface and has an inclination angle to the bottom surface of more than 0° and 45° or less, and the boundary of the first inclined surface and the second inclined surface is located at a position where the height from the bottom surface in the inner wall surface of the concave portion is more than 0 μm and 100 μm or less.

8. The molded resin body for surface-mounted light-emitting device according to any of 1 to 7 above, in which the plurality of leads include a first lead and a second lead which are disposed in such a manner as to be separated from each other, the cured resin body contains an insulation portion which is provided between the first lead and the second lead and insulates the leads, and the insulation portion is exposed to the bottom portion of the concave portion in the state where the insulation portion is sandwiched between the first lead and the second lead.

9. The molded resin body for surface-mounted light-emitting device according to 8 above, in which the first lead contains a first inner lead portion exposed to the bottom portion of the concave portion and a first outer lead portion in contact with the cured resin body and the second lead contains a second inner lead portion exposed to the bottom portion of the concave portion and a second outer lead portion in contact with the cured resin body.

10. The molded resin body for surface-mounted light-emitting device according to 9 above, in which the first outer lead portion and/or the second outer lead portion are/is exposed to the outer surface.

11. The molded resin body for surface-mounted light-emitting device according to 10 above, in which the exposed surface of the cured resin body and the exposed surface(s) of the first outer lead portion and/or the second outer lead portion are/is present on almost the same plane on the outer surface.

12. The molded resin body for surface-mounted light-emitting device according to any of 9 to 11 above, in which the first inner lead portion and the second inner lead portion have the metal layer on the surfaces thereof and the first outer lead portion and the second outer lead portion do not have a metal layer on the surfaces thereof.

13. The molded resin body for surface-mounted light-emitting device according to any of 1 to 12 above, in which the plurality of leads have a notched portion filled with the cured resin body.

14. A method for manufacturing a molded resin body for surface-mounted light-emitting device having a cured resin body integrally molded with a plurality of leads and a concave portion to which the plurality of leads are exposed at the bottom portion, in which the ten-point average roughness (Rz) of the opening surface of the concave portion in the cured resin body is 1 μm or more and 10 μm or less includes a process (1) of using a mold having an upper mold having an internal space corresponding to the three dimensional shape of the cured resin body and having an upper mating surface in which an upper concave portion having a ten-point average roughness (Rz) of the bottom surface of 0.5 μm or more and 15 μm or less is formed at a predetermined position, a lower mold having a flat lower mating surface, and a resin injection hole, and holding and fixing the plurality of leads by the upper mating surface and the lower mating surface, a process (2) of injecting a liquid thermosetting resin into the internal space formed with the upper concave portion and the plurality of leads and/or the lower mating surface in the mold from the resin injection hole, a process (3) of heating the mold to a predetermined temperature to cure the liquid thermosetting resin to thereby produce a molded resin body in which the cured resin body containing a cured substance of the thermosetting resin is integrally molded at a predetermined position of the plurality of leads, and a process (4) of releasing the molded resin body from the mold.

15. The method for manufacturing a molded resin body for surface-mounted light-emitting device according to 14 above, in which the plurality of leads contain a first lead and a second lead which are disposed in such a manner as to be separated from each other and, in the process (2), the liquid thermosetting resin is injected into the space between the first lead and the second lead.

16. The method for manufacturing a molded resin body for surface-mounted light-emitting device according to 14 or 15 above, including using the upper mold in which the upper concave portion is formed at a predetermined position of the upper mating surface, the lower mold having the flat lower mating surface, and the plurality of leads in which notched portions are formed in length and width directions with a predetermined interval to form the cured resin body for each region surrounded with the notched portions of the plurality of leads, and then cutting the plurality of leads along the notched portions to thereby obtain two or more of the molded resin bodies.

17. The method for manufacturing a molded resin body for surface-mounted light-emitting device according to 16 above, in which at least one of the plurality of leads has a metal layer on the surface.

18. The method for manufacturing a molded resin body for surface-mounted light-emitting device according to 16 or 17 above, in which the notched portions of the plurality of leads are held by a region, in which the upper concave portion of the upper mating surface is not formed, and the lower mating surface.

19. A surface-mounted light-emitting device has the molded resin body for surface-mounted light-emitting device according to any of 1 to 13 above, a light-emitting element which is mounted on the bottom portion of the concave portion of the molded resin body and is connected to the plurality of leads in such a manner that electricity can be conducted therebetween, and a transparent resin layer which seals the light-emitting element.

20. The surface-mounted light-emitting device according to 19 above, on which the plurality of light-emitting elements are mounted.

Advantageous Effects of Invention

The surface-mounted molded resin body (hereinafter sometimes simply referred to as a "molded resin body" unless otherwise specified) of the present invention has a high optical reflectance and is suitable for mass production due to the fact that opening surface of the concave portion has a ten-point average roughness in a specific range. Moreover, according to the present invention, since the mold releasability from the mold of the molded resin body is good when releasing the molded resin body from the mold, the deformation and breakage of the molded resin body are notably suppressed. Therefore, according to the present invention, molded resin bodies for surface-mounted light-emitting device having a uniform three dimensional shape can be mass-produced with good efficiency and low defective product ratio. Moreover, according to the present invention, by the use of a cured substance having a predetermined glass transition temperature, a predetermined optical reflectance, and a predetermined optical reflectance retention rate as the cured resin body in the molded resin body, a molded resin body which can hold good light emission luminance over a long period of time can be provided at low cost.

In the molded resin body of the present invention having the technical features of 4 to 6 above, chemical degradation due to halogen ion, sulfur, and the like present in the atmosphere or sealing resin can be notably suppressed by the Au layer, the Au alloy layer, or the glossy Ni layer formed as the outermost surface layer in the lead frame thickness direction. Therefore, a molded resin body capable of holding more favorable light emission luminance over a long period of time can be provided. Moreover, since the effect of suppressing the chemical degradation is demonstrated even when the thickness of the Au layer, the Au alloy layer, or the glossy Ni layer is reduced to be very thin, and thus the molded resin body of the present invention is advantageous also in terms of cost.

In the molded resin body of the present invention having the technical feature of 7 above, by designing the inner wall surface of the concave portion of the molded resin body to have two steps of a first inclined surface and a second inclined surface different in the inclination angle to the bottom surface of the concave portion and setting the inclination angle of the second inclined surface to particularly 45° to 90°, resin chipping of a lead contact portion in mold opening and the formation of a resin burr which has been likely to occur in the lead portion on the bottom surface of the concave portion can be remarkably suppressed. Furthermore, according to the present invention, the product yield improves due to the fact that the resin chipping and the resin burr are suppressed and also a manufacturing process can be simplified, e.g., a burr removing process can be skipped, and therefore a surface-mounted light-emitting device can be provided at lower cost. Moreover, by setting the inclination angle to the bottom surface of the concave portion of the first inclined surface to 45° exceeding 0° and setting the boundary of the first inclined surface and the second inclined surface into a region at a predetermined height from the bottom surface of the concave portion, the inclination as the entire inner wall surface of the concave portion can be gentle and the optical reflectance of the molded resin body can be increased.

BRIEF DESCRIPTION OF THE DRAWINGS

FIG. 1 is a plan view schematically illustrating the configuration of one embodiment of a molded resin body according to the present invention.

FIG. 2 is a cross sectional view of the molded resin body illustrated in FIG. 1.

FIG. 3 is a cross sectional view schematically illustrating the configuration of another embodiment of the molded resin body according to the present invention.

FIG. 4 is a cross sectional view schematically illustrating the configuration of another embodiment of the molded resin body according to the present invention.

FIG. 5 is a perspective view schematically illustrating the configuration of another embodiment of the molded resin body according to the present invention.

FIG. 6 is a cross sectional view schematically illustrating the configuration of another embodiment of the molded resin body according to the present invention.

FIG. 7 is a perspective view schematically illustrating the configuration of a surface-mounted light-emitting device including the molded resin body illustrated in FIG. 6.

FIG. 8 is a cross sectional view schematically illustrating the configuration of another embodiment of the molded resin body according to the present invention.

FIG. 9 is a cross sectional view schematically illustrating the occurrence of resin chipping and the formation of a resin burr in a former molded resin body.

FIG. 10 is a side view schematically illustrating a process (1) of one embodiment of a method for manufacturing the molded resin body according to the present invention.

FIG. 11 is a side view schematically illustrating a process (2) of one embodiment of the method for manufacturing the molded resin body according to the present invention.

FIG. 12 is a side view schematically illustrating a process (3) of one embodiment of the method for manufacturing the molded resin body according to the present invention.

FIG. 13 is a side view schematically illustrating a process (4) of one embodiment of the method for manufacturing the molded resin body according to the present invention.

FIG. 14 is a plan view of a frame unit constituting a lead frame for use in the molded resin body according to the present invention.

FIG. 15 is a view schematically illustrating the configuration of the molded resin body obtained by the method for manufacturing a molded resin body according to the present invention. FIG. 15(a) is a plan view, FIG. 15(b) is a partially enlarged plan view, and FIG. 15(c) is a partially enlarged cross sectional view along the X-X line of FIG. 15(c).

DESCRIPTION OF EMBODIMENTS

[Molded Resin Body for Surface-Mounted Light-Emitting Device]

A molded resin body of the present invention has a feature of having a cured resin body integrally molded with a plurality of leads and a concave portion to which the plurality of leads are exposed at the bottom portion and having a ten-point average roughness (hereinafter, sometimes simply referred to as "Rz") of the opening surface of the concave portion of 1 µm or more and 10 µm or less.

More specifically, the molded resin body of the present invention is an integrally molded article of a cured resin body having a through-hole in the thickness direction and a plurality of leads. The plurality of leads adheres to one surface in the thickness direction of the cured resin body by integral molding. Thus, at least one part of one opening of the through-hole of the cured resin body is closed by the plurality of leads and a concave portion to which the plurality of leads are exposed is formed at the bottom portion. The concave portion opens in the other surface in the thickness direction of the molded resin body. In this specification, the surface is defined as the opening surface of the concave portion of the molded resin body. In the opening surface of the concave portion, Rz is 1 µm to 10 µm and preferably 1.5 to 7.0 µm.

Moreover, the molded resin body of the present invention also has a feature that the glass transition temperature of the cured resin body is 10° C. or higher, the optical reflectance at 460 nm of the opening surface of the concave portion is 80% or more, and the optical reflectance retention rate of the opening surface of the concave portion after heating the molded resin body at 180° C. for 72 hours is 90% or more. The glass transition temperature is a value measured using a thermomechanical analyzer (TMA) under the conditions of a temperature range of −50 to 250° C., a temperature elevation rate of 5° C./min, and a sample size length of 1 to 5 mm.

Due to the fact that the molded resin body of the present invention has these features, the molded resin body of the present invention has high optical reflectance and is suitable for mass production.

FIG. 1 is a plan view schematically illustrating the configuration of a molded resin body 1 according to one embodiment of the present invention. FIG. 2 is a cross sectional view of the molded resin body 1 illustrated in FIG. 1. The molded resin body 1 has a first lead 10 and a second lead 11 as a plurality of leads and a cured resin body 12, in which a concave portion 13 is provided. In the molded resin body 1, the first lead 10 and the second lead 11 are exposed to at least one part of an outer surface (side surface in the thickness direction) 1a. As illustrated in FIG. 1, the molded resin body 1 of this embodiment has a plane shape of almost a square shape, has a thin plate shape, and has a concave portion 13 having an opening shape of an almost circular shape at the center portion.

The first lead 10 and the second lead 11 are a pair of positive and negative leads and are disposed almost in parallel in such a manner as to be separated from each other to form one frame unit (not illustrated). A lead frame is constituted by disposing the plurality of frame units in parallel in length and width directions and integrating the same. The lead frame can be produced by subjecting a thin plate-shaped metal plate to punching processing or etching processing. The lead frame is formed using a metal material which is an electric conductor. Such a metal material is not particularly limited and metal materials having a volume resistance of less than 0.07 Ω·m and a thermal conductivity of 60 W/(m·k) or more are preferable and iron, phosphor bronze, copper alloy, and the like are mentioned, for example.

On at least one surface of both surfaces in the thickness direction of the first lead 10 and the second lead 11, particularly on the surface exposed to the bottom portion 13a of the concave portion 13, a metal layer, such as a plating layer, may be formed. Thus, the optical reflectance of light emitted from a light-emitting element can be further increased. As the material of the metal layer, gold, silver, copper, aluminum, and the like are mentioned, for example. For example, when the metal layer contains silver, the thickness is not particularly limited, and is preferably 0.5 μm to 20 μm and more preferably 1 μm to 15 μm. When the thickness is less than 0.5 μm, the crystallinity of the metal layer becomes low and is likely to be discolored as a result of sulfuration or oxidization. Since the discolored portion absorbs light and is likely to generate heat, there is a possibility of accelerating the heat deterioration of the molded resin body 1. When the thickness exceeds 20 μm, there is a possibility that the metal layer is easily separated from the first and second leads 10 and 11 when mounting the light-emitting element.

For the formation of the metal layer, any known method for producing a metal coating film or a metal thin film can be employed. As such a method, electroplating, chemical plating, vapor deposition, sputtering, diffusion, and the like are mentioned, for example. Among the above, when considering the denseness, ease of formation, and the like of the metal layer to be obtained, plating methods such as electroplating and chemical plating are preferable. Among metal layers, a plating layer is preferable.

The first lead 10 has a first inner lead portion 10a exposed to the bottom portion 13a of the concave portion 13 and a first outer lead portion 10b which is connected to the first inner lead portion 10a and contacts a cured resin body 12. In FIG. 2, the dashed line illustrated between the first inner lead portion 10a and the first outer lead portion 10b indicates the boundary thereof. The second lead 11 has a second inner lead portion 11a exposed to the bottom portion 13a of the concave portion 13 and a second outer lead portion 11b which is connected to the second inner lead portion 11a and contacts the cured resin body 12. In FIG. 2, the dashed line illustrated between the second inner lead portion 11a and the second outer lead portion 11b indicates the boundary thereof.

Between the first lead 10 and the second lead 11, an insulation portion 12b which is a part of the cured resin body 12 described later is present to insulate the first and second lead 10 and 11.

In this embodiment, a pair of leads of the first lead 10 and the second lead 11 is used but the invention is not limited thereto and an arbitrary number of leads, e.g., three or more leads, may be used.

The cured resin body 12 has a reflective portion 12a which rises outward from the surfaces of the first lead 10 and the second lead 11 and the insulation portion 12b present between the first lead 10 and the second lead 11. The reflective portion 12a has functions of, when producing a light-emitting device by mounting a light-emitting element (not illustrated) on the surfaces of the first and second inner lead portions 10a and 11a, reflecting light emitted from the light-emitting element ahead of the light-emitting device and protecting the light-emitting element. The surface of the top portion of the reflective portion 12a is an opening surface 12c (hereinafter sometimes referred to as an "opening surface 12c") of the concave portion 13 in the molded resin body 1. The insulation portion 12b has functions of supporting the first lead 10 and the second lead 11 and also electrically insulating the leads.

The Rz of the opening surface 12c is 1 μm or more and 10 μm or less. Thus, when the molded resin body 1 is mass-produced, the molded resin bodies 1 having a uniform shape can be efficiently manufactured. When the Rz is less than 1 μm, the case of manufacturing the molded resin body 1 using a transfer molding mold, the mold releasability of the molded resin body 1 from the mold decreases, so that there is a tendency that the deformation and the cohesive failure of the molded resin body 1 occur. When the Rz exceeds 10 μm, there is a tendency that the optical reflectance decreases. Therefore, due to the fact that the Rz is 1 μm or more and 10 μm or less, both an improvement of the mold releasability in the production of the molded resin body 1 (package molded body) and the high optical reflectance of the molded resin body 1 can be achieved.

The shape of the opening surface 12c is an almost square shape in this embodiment but the invention is not limited thereto. For example, shapes, such as a rectangle, a pentagon, a hexagon, an octagon, an ellipse, an oval, and a circle, may be acceptable. The oval is a shape formed by a rectangle and two semicircles projected outward from two sides facing each other of the rectangle with a diameter having a length equal to the length of the two sides.

The glass transition temperature of the cured resin body 12 is 10° C. or higher, preferably 20° C. or higher, more preferably 20° C. or higher and 250° C. or less, and still more preferably 30° C. or higher and 200° C. or less. The glass transition temperature is a value measured using a thermomechanical analyzer (TMA) under the conditions of a temperature range of −50 to 250° C., a temperature elevation rate of 5° C./min, and a sample size length of 1 to 5 mm. Due to the fact that the glass transition temperature of the cured resin body 12 is 10° C. or higher, the cured resin body 12 has high heat resistance, so that even when exposed to a high temperature resulting from the light-emitting element, the heat deterioration accompanied by discoloration is suppressed. As a result, the optical reflectance in the early stage of use can be maintained.

The optical reflectance at 460 nm of the opening surface 12c of the cured resin body 12 is 80% or more and the optical reflectance retention rate in the opening surface 12c after heating the cured resin body 12 at 180° C. for 72 hours is 90% or more. By the use of such a cured resin body 12, the molded resin body 1 with notably high reliability as a molded resin body for surface-mounted light-emitting device is obtained.

It is more preferable that at least one peak top in the solid $^{13}$C-nuclear magnetic resonance spectrum (hereinafter referred to as "solid $^{13}$CNMR spectrum") of the cured resin body 12 is in the range of −1 ppm to 2 ppm and 13 ppm to 18 ppm. Such a cured resin body 12 further increases the reliability of the surface-mounted light-emitting device.

Resin materials for obtaining the cured resin body 12 having the above-described properties is described in detail later. The glass transition temperature, the optical reflectance, the optical reflectance retention rate, and a method for measuring the solid $^{13}$CNMR spectrum are described in detail in the Examples described later.

The concave portion 13 formed with the first lead 10, the second lead 11, and the cured resin body 12 has the bottom portion 13a to which the insulation portion 12b is exposed while being sandwiched between the first lead 10 and the second lead 11 and an inner wall surface 13b which also serves as an inner inclined surface of the reflective portion 12a of the cured resin body 12. When producing the surface-mounted light-emitting device, a light-emitting element is mounted on the bottom portion 13a. The inner wall surface 13b serves as a reflective surface which reflects light emitted from the light-emitting element ahead.

In FIG. 1, the inclination angle to the bottom portion 13a of the inner wall surface 13b of the concave portion 13 is almost constant. Therefore, the concave portion 13 is formed in such a manner that the internal diameter continuously becomes large at almost a constant ratio as with distance from the bottom portion 13a. More specifically, in the concave portion 13, the shape of the internal space is a reverse truncated cone shape and the inner wall surface 13b is inclined in such a manner that the concave portion 13 becomes wider in the direction to the opening. Thus, the reflection efficiency of the light emitted from a light-emitting element improves. Moreover, the releasability of the molded resin body 1 from a mold improves in transfer molding.

The shape of the internal space of the concave portion 13 is a reverse truncated cone shape in this embodiment but the invention is not limited thereto. For example, shapes, such as a cylindrical shape and a square pillar shape, may be acceptable. The inclination angle (angle of the corner formed by the bottom surface and the inner wall surface 13b) of the inner wall surface 13b to the bottom surface of the concave portion 13 is not particularly limited and is preferably 30° to 85° and more preferably 60° to 80°. In this specification, the bottom surface of the concave portion 13 means the surface of the bottom portion 13a of the concave portion 13. In the following description, the bottom surface of the concave portion 13 is sometimes referred to as a level surface of the concave portion 13.

In this embodiment, the inclination angle of the inner wall surface 13b to the bottom surface of the concave portion 13 is almost constant but the invention is not limited thereto. The inner wall surface 13b may be constituted by surfaces of two or more stages different in the inclination angle. In this case, in at least one surface, the inclination angle to the bottom surface of the concave portion 13 is preferably 70° to 80°. In another embodiment, it is preferable that the inclination angle to the bottom surface of the bottom portion 13a of the surface near the bottom portion 13a is 40° to 60° and the inclination angle to the bottom surface of the bottom portion 13a of the surface near the opening surface 12c is 70° to 90°.

By setting the inclination angle of the inner wall surface 13b of the concave portion 13 in a region where the height from the bottom surface of the concave portion 13 is 100 μm or less in two stages, the occurrence of resin chipping, the formation of a resin burr, and the like in a portion where the cured resin body 12 and the leads 10 and 11 contact each other can be suppressed. This embodiment is described in detail later with reference to FIG. 8 and FIG. 9.

As in the molded resin body 1 of this embodiment, when the plane shape is an almost square shape and the concave portion 13 whose opening shape is an almost circular shape is provided, the inclination angle of the inner wall surface 13b to the bottom surface of the concave portion 13 may be changed as appropriate based on a different standard from the standard described above. For example, in FIG. 1, it is preferable that the inclination angle of the inner wall surface 13b to the bottom surface of the concave portion 13 is set to 70° to 95° in the vicinity of the four corners of the molded resin body 1 (peripheral side of the inner wall surface 13b) and the inclination angle of the inner wall surface 13b to the bottom surface of the concave portion 13 is set to 55° to 70° in the other portion. Thus, the area of the bottom portion 13a can be enlarged by 10% or more without enlarging the entire dimension of the molded resin body 1. As a result, the mounting of a light-emitting element is facilitated.

The shape of the bottom portion 13a of the concave portion 13 is a circular shape in this embodiment but the invention is not limited thereto. For example, shapes, such as an ellipse, an oval, a square, a rectangle, a hexagon, and an octagon, may be acceptable. The area of the bottom portion 13a of the concave portion 13 is preferably 7 mm² or more. Due to having such an area, a plurality of light-emitting elements can be easily mounted, for example.

The depth of the concave portion 13 is not particularly limited and preferably in the range of 0.5 to 5 mm and more preferably in the range of 0.5 to 2 mm. On the other hand, the depth of the concave portion 13 can also be set to 450 μm or less and more preferably 250 to 450 μm. Thus, the luminous intensity and the light quantity in a side surface type light-emitting device can be increased by minimizing the depth of the concave portion 13 and increasing the inclination angle to the bottom portion 13a of the inner wall surface 13b.

Although the opening shape of the concave portion 13 in the opening surface 12c is an almost circular shape in this embodiment, the invention is not limited thereto. For example, shapes, such as an ellipse, an oval, an egg shape, a rectangle, a pentagon, and a hexagon, may be acceptable. The three dimensional shape of the molded resin body 1 is an almost plate shape in this embodiment but the invention is not limited thereto. The shape is selected as appropriate from various shapes according to the design and the like of the light-emitting device.

FIG. 3 is a cross sectional view schematically illustrating the configuration of a molded resin body 2 according to another embodiment of the present invention. In FIG. 3, members common to the members of the molded resin body 1 are designated by the same reference numerals as those of the molded resin body 1 and the description thereof is omitted. The molded resin body 2 has a feature of having a cured resin body 14 on the side opposite to the cured resin body 12 through the first and second leads 10 and 11, in which one end portions of the first and second leads 10 and 11 are individually projected from an outer surface 2a in the opposite directions.

The cured resin body 14 has a concave portion 15 depressed to the opposite side to the concave portion 13 at the position corresponding to the concave portion 13. The cured resin body 14 has a plane shape and a three dimensional shape which are almost the same as those of the molded resin body 2, except the fact that the height is lower than that of the cured resin body 2. More specifically, the three dimensional shape of the internal space of the concave portion 15 is a reverse truncated cone shape in this embodiment but the invention is not limited thereto. For example, a cylindrical, a square pillar shape, and the like may be acceptable. The opening shape of the concave portion 15 is an almost circular shape in this embodiment but the invention is not limited thereto. For example, shapes, such as a circle, an oval, a rectangle, a pentagon, and a hexagon, may be acceptable. Resin materials for obtaining the cured resin body 14 may be the same as or different from the resin materials for obtaining the cured resin body 2. More specifically, as the resin materials for the cured resin body 14, the resin materials mentioned later in this specification can be used and also former resin materials for use in the molded resin body for surface-mounted light-emitting device can be used. By providing the cured resin body 14, the direct contact of the first and second leads 10 and 11 with other components and devices is reduced. Therefore, for example, the first and second leads 10 and 11, as a result the light-emitting element to be mounted later, are certainly protected.

FIG. 4 is a cross sectional view schematically illustrating the configuration of a molded resin body 3 according to another embodiment of the present invention. In FIG. 4, members common to the members of the molded resin body 1 are designated by the same reference numerals as those of the molded resin body 1 and the description thereof is omitted. The molded resin body 3 has a feature of having a cured resin body 16 on the opposite side to the cured resin body 12 through the first lead 10 and the second lead 11, in which one end portions of the first and second leads 10 and 11 are individually projected from an outer surface 3a in the opposite directions.

The cured resin body 16 has a plane shape of an almost square shape and a three dimensional shape of a plate shape and contacts the first and second inner lead portions 10a and 11a and the insulation portion 12b and further contacts a part of each of the first and second outer lead portions 10b and 11b. As resin materials for obtaining the cured resin body 16, the same resin materials as the resin materials for obtaining the cured resin body 14 can be used. By providing the cured resin body 16, the rigidity as the entire molded resin body 3 increases and the direct contact of the first and second leads 10 and 11 and the insulating layer 12b with other components and devices (not illustrated) can be almost certainly prevented. For example, the first and second leads 10 and 11, a light-emitting element to be mounted later, and the like are more certainly protected.

FIG. 5 is a perspective view schematically illustrating the configuration of a molded resin body 4 according to another embodiment of the present invention. In FIG. 5, members common to the members of the molded resin body 1 are designated by the same reference numerals as those of the molded resin body 1 and the description thereof is omitted. The molded resin body 4 has a feature of having a plate-like three dimensional shape in which the first and second leads 10 and 11 and the cured resin body 17 are integrally molded and has a feature that the first and second outer lead portions 10b and 11b are exposed to two portions of each of the four corners of the outer surfaces 4a, 4b, 4c, and 4d.

The molded resin body 4 has a feature that the exposed surfaces of the cured resin body 17 at the outer surfaces 4a, 4b, 4c, and 4d and the exposed surfaces of the first and second outer lead portions 10b and 11b are present on almost the same plane. Furthermore, although not illustrated in FIG. 5, the molded resin body 4 may be configured so that a metal layer, such as a plating layer, is provided on the surface in the thickness direction of the first lead 10 and/or the second lead 11 and the metal layer is not provided on the exposed surfaces of the first and second outer lead portions 10b and 11b on the outer surfaces 4a, 4b, 4c, and 4d. The material of the metal layer is the same material as that of the metal layer which may be provided on the molded resin body 1.

In the molded resin body 4, the first lead 10 and the second lead 11 and the cured resin body 17 are integrally molded and the concave portion 13 is provided. The Rz of an opening surface 17c of the concave portion 13 is 1 μm or more and 10 μm or less. An insulating layer 17b is exposed to the bottom surface of the concave portion 13 while being sandwiched between the first inner lead portion 10a and the second inner lead portion 11a. The molded resin body 4 is illustrated in FIG. 1 of JP-A No. 2010-62272, for example.

Also by taking such a configuration, the first lead 10 and the second lead 11 can be certainly protected and the reliability of a surface-mounted light-emitting device employing the molded resin body 4 can be improved.

A molded resin body of another embodiment of the present invention is a molded resin body having a cured resin body integrally molded with a plurality of leads and a concave portion to which the plurality of leads are exposed at the bottom portion and is a package molded body in which the surface in the thickness direction of the lead electrodes (the plurality of leads) has a plating layer and the outermost surface layer is 0.003 to 0.05 μm thick Au, in which the ten-point average roughness (Rz) of the opening surface of the concave portion is 1 μm or more and 10 μm or less, the glass transition temperature of the cured resin body measured using a thermomechanical analyzer (TMA) under the conditions of a temperature range of −50 to 250° C., a temperature elevation rate of 5° C. /min, and a sample size length of 1 to 5 mm is 10° C. or higher, the optical reflectance at 460 nm of the opening surface of the molded resin body is 80% or more, and the optical reflectance retention rate on the opening surface and on the inner wall surface after heating the molded resin body at 180° C. for 72 hours is 90% or more.

As such a molded resin body according to another embodiment, a molded resin body 5 illustrated in FIG. 6 and FIG. 7 is mentioned, for example. FIG. 6 is a cross sectional view schematically illustrating the configuration of the molded resin body 5 according to another embodiment of the present invention. FIG. 7 is a perspective view schematically illustrating the configuration of a surface-mounted light-emitting device 50 in which a light-emitting element 51 is mounted on the molded resin body 5 illustrated in FIG. 6. In FIG. 6 and FIG. 7, members common to the members of the molded resin body 1 are designated by the same reference numerals as those of the molded resin body 1 and the description thereof is omitted. The molded resin body 5 has a feature that the surface (surface on the side in contact with the cured resin body 12) in the thickness direction of the lead electrodes (the first lead 10 and the second lead 11) has a plating layer 18 as a metal layer and the outermost surface layer 18a of the plating layer 18 contains 0.003 to 0.05 μm thick Au.

The molded resin body 5 has the same configuration as that of the molded resin body 1, except having the plating layer 18 on the surfaces of the first and second inner lead portions 10a and 11a on the surface on the side in contact with the cured resin body 17 of each of the first and second leads 10 and 11. The cured resin body 17 has the same structure as that of the cured resin body 17 in the molded resin body 4. The plating layer 18 contains the outermost surface layer 18a and a second metal layer 18b provided between the surface in the thickness direction of each of the first and second inner lead portions 10a and 11a and the outermost surface layer 18a. The plating layer 18 contains a plating layer of two layers different in the materials. The outermost surface layer 18a is a 0.003 to 0.05 μm thick Au plating layer. By providing the outermost surface layer 18a, the sulfuration resistance and the optical reflectance of the first lead 10 and the second lead 11 can be increased.

According to this configuration, the first and second inner lead portions 10a and 11a on which the plating layer 18 is provided are excellent in the optical reflectance. Therefore, particularly when the molded resin body 5 is used for a semiconductor light-emitting device, back light of the light-emitting element is efficiently reflected, and high luminous efficiency as the entire device can be realized.

The plating layer 18 may be provided not only on the first and second inner lead portions 10a and 11a but also on the first and second outer lead portions 10b and 11b. Thus, heat stability, as a result soldering properties, of the first and second outer lead portions 10b and 11b notably improve. The plating layer 18 is provided on one surfaces of the first and second inner lead portions 10a and 11a in this embodiment but the invention is not limited thereto and the plating layer 18 may be provided on both surfaces. Moreover, the plating layer 18 may be provided over the entire surface of both surfaces or either one surface of the first and second leads 10 and 11. Moreover, by forming the outermost surface layer 18a which is a 0.003 to 0.05 µm thick Au plating layer, both an improvement of sulfuration resistance and optical reflectance and a control of the material cost can be achieved.

The lower limit of the thickness of the Au plating layer which is the outermost surface layer 18a is 0.003 µm or more and preferably 0.005 µm or more as an example from the viewpoint of sulfuration resistance. When the thickness becomes large, the sulfuration resistance improves. However, when considering the fact that it is generally said that the price of Au is about 100 times that of Ag, the upper limit of the thickness of the Au plating layer is 0.05 µm or less and preferably 0.03 µm or less from the viewpoint of cost. The outermost surface layer 18a is an Au plating layer in this embodiment but the invention is not limited thereto and an Au alloy plating layer may be acceptable. As the Au alloy, an Ag—Au alloy, an Ag—Nd—Au alloy, and the like are mentioned, for example.

The second metal layer 18b is a plating layer containing metal, such as Au, Ag, Cu, Pd, Ni, and Al. Among the metals, Ag, Cu, Pd, Ni, Al, and the like are preferable and Ag, Pd, Ni, and the like are more preferable from the viewpoint of reducing the cost. Furthermore, a Pd plating layer, an Ag plating layer, a laminated body of an Ag plating layer and a Pd plating layer, and the like are more preferable. Each plating layer constituting the second metal layer 18b demonstrates the following outstanding properties, for example.

The silver plating layer not only realizes outstanding optical reflectance but is also excellent in connectivity and wire bonding properties with a light-emitting element to be mounted. The palladium plating layer is chemically stable and excellent in corrosion resistance under a high temperature environment. The nickel plating layer has a property as a base plating and contributes to wire bonding properties, soldering properties with lead-free solder, corrosion resistance, and adhesion with the cured resin body 12 forming an envelope. As described above, the lead frame for semiconductor device of the present invention (the first and second leads 10 and 11) realizes good optical reflectance due to the characteristic configuration in which the plating layer 18 is provided on the inner portion (first and second inner lead portions 10a and 11a) surface and the outermost surface layer 18a of the plating layer 18 is a gold or gold alloy plating layer.

The thickness of the plating layer 18 is not particularly limited and can be selected as appropriate according to various conditions, such as the materials of the first and second leads 10 and 11 and the second metal layer 18b, the thickness of the first and second leads 10 and 11, the type of resin constituting the cured resin body 12, and the intended use of the light-emitting element to be finally obtained. For example, when the second metal layer 18b contains silver, the thickness of the plating layer 18 is preferably 0.5 µm to 20 µm and more preferably 1 µm to 15 µm. When the thickness is less than 0.5 µm, the crystallinity of the plating layer 18 becomes low, so that discoloration is likely to occur due to sulfuration or oxidization. Since the discolored portion absorbs light and easily generates heat, there is a possibility of accelerating the heat deterioration of the molded resin body 5. When the thickness exceeds 20 µm, there is a possibility that the metal layer 18 is easily separated from the first lead 10 or the second lead 11 when mounting the light-emitting element.

A method for forming the plating layer 18 is not particularly limited and any known plating method can be adopted. For example, the Reel-to-reel method, an immersion plating method using a rack, and the like are the most suitable. When providing the plating layer 18 on the surfaces of the first and second inner lead portions 10a and 11a of the first and second leads 10 and 11 as in this embodiment, the plating treatment may be performed after forming the molded resin body 5. Such plating treatment is referred to as a post-plating process.

In this embodiment, the plating layer 18 is provided as a metal layer on the surfaces of the first and second inner lead portions 10a and 11a of the first and second leads 10 and 11. However, the invention is not limited to the plating layer and various metal layers (metal coating films) other than the plating layer can be formed. For the formation of the metal layer, any known metal layer forming method can be adopted. For example, electroplating, chemical plating, vapor deposition, sputtering, diffusion, and the like are mentioned.

FIG. 7 illustrates an example of the use of the molded resin body 5. The surface-mounted light-emitting device 50 illustrated in FIG. 7 has the molded resin body 5 having the plating layer 18 on the surfaces of the first and second inner lead portions (not illustrated), the light-emitting element 51 mounted on the first inner lead portion, a first gold wire 52a which electrically connects the light-emitting element 51 and the first inner lead portion, and a second gold wire 52b which electrically connects the light-emitting element 51 and the second inner lead portion. In the surface-mounted light-emitting device 50, due to the fact that the molded resin body 5 has a plating layer of two layers different in the material on the surfaces of the first and second leads, particularly the heat deterioration of the first and second leads is suppressed and the optical reflectance can be maintained at a high level over a long period of time, so that the long-term reliability is very high.

A molded resin body according to another embodiment of the present invention is a molded resin body having a cured resin body integrally molded with a plurality of leads and having a concave portion to which the plurality of the leads are exposed at the bottom portion, in which the inclined surface of a first molded resin body in contact with the leads at the bottom surface of the opening portion of the concave portion has an angle from the lead level surface of 45° or less and the inclined surface of a second molded resin body produced from the height of 100 µm or less from the lead level surface is in the range of 45° to 90° to the lead level surface. Herein, the bottom surface of the opening portion of the concave portion refers to the surfaces of the leads exposed to the bottom surface of the concave portion and is also the lead level surface. The inner wall surface of the concave portion is constituted by two inclined surfaces different in the inclination angle to the lead level surface, i.e., the first molded resin body inclined surface and the second molded resin body inclined surface. The inclination angle to the lead level surface is an angle formed by the lead level surface and the first or second molded resin body inclined surface in the cross sectional view in the thickness direction of the molded resin body for surface-mounted light-emitting device.

According to the molded resin body of such an embodiment, when a light-emitting element is mounted on the molded body, it is designed so that a lead contact portion of the resin molded portion inside the concave portion (inner wall surface of the concave portion) serving as a light reflecting portion which reflects light in the transverse direction emitted from the light-emitting element in the front direction (perpendicular direction to the bottom portion of the concave portion) forms a stage in the range of an acute angle to the right angle relative to the inclined surface angle of the resin molded portion. More specifically, in the molded resin body having a cured resin body integrally molded with a plurality of leads and having a concave portion to which the plurality of the leads are exposed at the bottom portion, when the angle from the lead level surface is set to 45° or less in the first inclined surface of the molded resin body in contact with the leads at the bottom surface of the opening portion of the concave portion, the second inclined surface of the molded resin body is adjusted to 45° to 90° to the lead level surface in such a manner as to produce a height of 100 μm or less from the lead level surface.

As a molded resin body of such an embodiment, a molded resin body 6 illustrated in FIG. 8 is mentioned, for example. FIG. 8 is a cross sectional view schematically illustrating the configuration of a molded resin body 6 according to another embodiment of the present invention. FIG. 9 is a cross sectional view schematically illustrating the formation of a resin burr 58 or the occurrence of resin chipping 59 in a former molded resin body 55. In FIG. 8 and FIG. 9, members common to the members of the molded resin body 1 are designated by the same reference numerals as those of the molded resin body 1 and the description thereof is omitted. The molded resin body 6 has a feature that the first and second leads 10 and 11 and a cured resin body 19 are integrally molded and the inner wall surface 13b of the concave portion 13 contains a first inclined surface 61 and a second inclined surface 60 and has a level difference, and the other configuration is the same as that of the molded resin body 1.

As illustrated in FIG. 9, when the former molded resin body 55 in which first and second leads 56a and 56b and a cured resin body 57 are integrally molded is produced, the resin burr 58 is formed on the first and second leads 56a and 56b near the interface due to the resin flow in which resin is to flow into the interface of a mold (not illustrated) and the first and second leads 56a and 56b or when releasing the obtained molded resin body 55 from the mold, cohesive failure of the cured resin body 57 occurs in the contact portion of the cured resin body 57 and the first and second leads 56a and 56b, so that resin chipping 59 occurs in the cured resin body 57. The molded resin body 6 of this embodiment is effective in suppressing the formation of the resin burr 58 and the occurrence of the resin chipping 59. Hereinafter, each configuration of the molded resin body 6 is described.

The second inclined surface 60 is continuous to the bottom surface of the concave portion 13 and rises from the periphery of the bottom surface. An inclination angle α2 to the bottom surface is in the range of 45° to 90°. Herein, the bottom surface of the concave portion 13 refers to the surfaces of the first and second leads 10 and 11 (i.e., the first and second inner lead portions 10a and 11a) exposed to the bottom portion 13a of the concave portion 13. The bottom surface of the concave portion 13 is also referred to as a lead level surface. The inclination angle α2 to the bottom surface of the second inclined surface 60 is an angle formed by the bottom surface of the concave portion 13 and the second inclined surface 60 in FIG. 8. The first inclined surface 61 is continuous to the second inclined surface 60 and rises from the periphery of the second inclined surface 60 towards the opening surface 19c. An inclination angle α1 to the bottom surface exceeds 0° and is 45° or less. The inclination angle α1 to the bottom surface of the first inclined surface 61 is an angle formed by the bottom surface of the concave portion 13 and a virtual line obtained by extending the first inclined surface 61 to the bottom surface in the shape of a straight line in FIG. 8.

The boundary of the second inclined surface 60 and the first inclined surface 61 is located at a position with a height (h in FIG. 8) of higher than 0 μm and 100 μm or less from the bottom surface in the inner wall surface 13b of the concave portion 13. Thus, in this embodiment, at the inner wall surface 13b of the concave portion 13, the boundary of the second inclined surface 60 and the first inclined surface 61 different in the inclination angle is provided in a region of the height (h) from the bottom surface of the concave portion 13 of 100 μm or less to form two stages.

Thus, the following effects (a) to (c) are obtained due to the configuration of providing the first inclined surface 61 and the second inclined surface 60 each having a predetermined inclination angle, providing the boundary of the first inclined surface 61 and the second inclined surface 60 in a predetermined region, and giving a predetermined level difference to the inner wall surface 13b of the concave portion 13.

(a) It was found that, due to the above-described configuration, resin flow in which resin is to flow into the interface of the mold and the first and second leads 10 and 11 was prevented in the molding of the molded resin body 6. As a result, it was also found that the formation of the resin burr which was likely to be formed near the bottom surface of the concave portion 13 was able to be remarkably suppressed. It was also found that the effect of suppressing the formation of the resin burr became high as the inclination angle α2 of the second inclined surface 60 is closer to the right angle. From the viewpoint of suppressing the formation of the resin burr, the inclination angle α2 of the second inclined surface 60 is preferably 60° or more and more preferably 80° or more and 90° or less.

(b) Due to the above-described configuration, the occurrence of resin chipping can be greatly suppressed. More specifically, as illustrated in FIG. 9, a trouble that a part of the cured resin body 57 is taken away to a mold (not illustrated) resulting from the adhesion of the molded resin body 55 to the mold surface in mold opening during molding, so that a part of the cured resin body 57 causes cohesive failure in the portion in contact with the first and second leads 56a and 56b to be chipped to cause resin chipping can be greatly improved. From the viewpoint of increasing the effect of suppressing the resin chipping of the molded resin body 6, the height (h) from the bottom surface of the concave portion 13 of the boundary of the second inclined surface 60 and the first inclined surface 61 is preferably 10 μm to 100 μm and more preferably 30 μm to 80 μm.

(c) Due to the above-described configuration, in the light-emitting device in which a light-emitting element (not illustrated) is mounted on the molded resin body 6, the reflection efficiency in an almost perpendicular direction to the bottom surface of the concave portion 13 of light emitted from the light-emitting element can be increased, and the commercialization of the light-emitting device can be increased. From the viewpoint of further increasing the reflection efficiency of light emitted from the light-emitting element, the inclination angle α1 of the first inclined surface 61 is preferably 20° to 45° and more preferably 30° to 40°.

Furthermore, the molded resin body of the present invention can take various aspects insofar as the Rz of the opening surface of the concave portion is 1 μm or more and 10 μm or less. For example, FIG. 6, FIG. 9, and FIGS. 11 to 13 illustrated in JP-A No. 2010-62272 illustrate a molded resin body in which a cured resin body and a first lead and a second lead are integrally molded and which has a three dimensional shape of a plate-like shape. The molded resin body has a concave portion having an opening shape of a circular shape, in which the first lead and the second lead are exposed while facing each other to the bottom portion of the concave portion through an insulation portion and the shape of the opening surface of the concave portion is a rectangular shape.

Hereinafter, a feature of each molded resin body illustrated in FIG. 6, FIG. 9, and FIGS. 11 to 13 of JP-A No. 2010-62272 is described. In a molded resin body illustrated in FIG. 6 of JP-A No. 2010-62272, a first lead and a second lead are individually partially exposed to lower portions of the four corners of the side surfaces similarly as in the above-described molded resin body 4. The four corners of a cured resin body were chipped inward in the form of a segment of a circle and the first lead and the second lead exposed to the lower portions of the four corners are also chipped inward in the form of a segment of a circle. Since the radius of the segment of the circle of the chipped portion of the cured resin body is larger than the radius of the segment of the circle of the chipped portion of each of the first lead and the second lead, a level difference is formed on the boundary of the cured resin body and the first lead or the second lead in the four corners of the molded resin body.

In a molded resin body illustrated in FIG. 9 of JP-A No. 2010-62272, a cured resin body has a chipped portion extending from one side surface to the other side surface in the transverse direction at lower portions of the two side surfaces facing each other in the longitudinal direction and the cross-sectional shape in the longitudinal direction is a T shape. The first lead and the second lead are individually partially exposed to the two chipped portions of the cured resin body.

The exposed portion of the first lead extends from one side surface to the other side surface in the transverse direction and the cross section in the longitudinal direction has a shape in which the L shape is rotated rightward by 90°. The exposed portion of the second lead extends from one side surface to the other side surface in the transverse direction and the cross section in the longitudinal direction has a shape in which the L shape is rotated rightward by 90° and then further mirror-reversed. In the two side surfaces facing each other in the transverse direction of the molded resin body, the exposed surface of the cured resin body and the exposed surface of each of the first lead and the second lead are on almost the same plane.

In a molded resin body illustrated in FIG. 11 of JP-A No. 2010-62272, the cured resin body has a chipped portion extending from one side surface to the other side surface in the transverse direction at lower portions of the two side surfaces facing each other in the longitudinal direction and the cross-sectional shape in the longitudinal direction is a T shape. The first lead and the second lead are individually partially exposed to the two chipped portions of the cured resin body.

The exposed portions of the first lead and the second lead extend from one side surface to the other side surface in the transverse direction and the cross-sectional shape in the longitudinal direction is a rectangular shape. Furthermore, at the almost center portion in the transverse direction in these exposed portions, a chipped portion having a cross-sectional shape in the longitudinal direction of a rectangular shape and extending in the transverse direction is provided. A plating layer may be formed on each surface facing the chipped portion. Furthermore, a plating layer may be formed also on at least one part of the first lead and the second lead exposed to the bottom portion of the molded resin body.

In a molded resin body illustrated in FIG. 12 of JP-A No. 2010-62272, a first lead and a second lead are exposed to lower portions of the four corners of the side surfaces in the thickness direction and lower portions of the two side surfaces facing each other in the longitudinal direction. The first lead is exposed to the lower portions of the two corners which are adjacent to each other in the transverse direction of the four corners and a lower portion of one of the side surfaces facing each other in the longitudinal direction. Between the first lead exposed to the two corners and the first lead exposed to the side surface, the cured resin body is present. Furthermore, the first lead exposed to the side surface extends in the transverse direction and has a chipped portion extending in the transverse direction (rectangular parallelepiped-shaped space) which is the same as that of the molded resin body illustrated in FIG. 11 of JP-A No. 2010-62272. On each surface facing the chipped portion, a plating layer may be formed.

On the other hand, the second lead has the same configuration as that of the exposed portion of the first lead, except the fact that the second lead is exposed to lower portions of the two corners which are adjacent to each other in the transverse direction other than the two corners to which the first lead is exposed and a lower portion of the other side surfaces facing each other in the longitudinal direction.

Furthermore, also in this embodiment, a plating layer may be formed also on at least one part of the first lead and the second lead exposed to the bottom portion of the molded resin body.

In a molded resin body illustrated in FIG. 12 of JP-A No. 2010-62272, a cured resin body has a chipped portion which extends from one side surface to the other side surface in the transverse direction on lower portions of the two side surfaces facing each other in the longitudinal direction and the cross-sectional shape in the longitudinal direction is a T shape. The shape of the space of the chipped portion is an almost rectangular parallelepiped shape. The first lead and the second lead are individually partially exposed to the two chipped portions of the cured resin body.

The first lead is exposed to a lower portion of one side surface in the longitudinal direction, extends from one side surface to the other side surface in the transverse direction, has a cross-sectional shape in the longitudinal direction at almost the center part in the transverse direction of a rectangular shape, and has chipped portions in the two corners which are adjacent to each other in the transverse direction. The shape of the space of the chipped portion is a rectangular parallelepiped shape or a cube shape. The second lead has the same configuration as that of the first lead, except the fact that the second lead is exposed to the lower portion of the other side surface in the longitudinal direction.

In each embodiment described above, resin materials for obtaining the cured resin body for reflecting light emitted from a light-emitting element are not particularly limited. It is preferable to use thermosetting resin from the viewpoint of performing transfer molding. As the thermosetting resin, those usable in the field of a surface-mounted light-emitting device can be used without particular limitation and, for example, epoxy resin, modified epoxy resin, silicone resin, modified silicone resin, acrylate resin, polyurethane, and the like are mentioned. These thermosetting resins can be used singly or in combination of two or more kinds thereof.

Among these thermosetting resins, epoxy resin, modified epoxy resin, silicone resin, and modified silicone resin are preferable. For example, an epoxy resin composition obtained by adding 0.1 to 2 parts by weight of curing accelerator, 0.5 to 3 parts by weight of assistant catalyst, 5 to 30 parts by weight of white pigment, and 30 to 70 parts by weight of inorganic filler to 100 parts by weight of a mixture of epoxy resin and acid anhydride with an equivalent amount can be used. Furthermore, the epoxy resin composition formed into B-stage obtained by heating the composition to partially cure the composition can also be used.

In the above-described epoxy resin composition, the epoxy resin includes, for example, epoxy resin obtained from triglycidyl isocyanurate, hydrogenated bisphenol A diglycidyl ether, and the like. The acid anhydride includes, for example, hexahydro phthalic anhydride, hexahydro 3-methylphthalic anhydride, hexahydro 4-methylphthalic anhydride, and the like. The curing accelerator includes DBU (1,8-diazabicyclo[5,4,0]undecene]-7) and the like. The assistant catalyst includes, for example, ethylene glycol and the like. The white pigment includes, for example, titanium oxide and the like. The inorganic filler includes, for example, silica particles, glass fiber, and the like.

From the viewpoint of suppressing the occurrence of warpage of the cured resin body and the heat deterioration accompanied by discoloration due to the generation of heat and the like of the light-emitting element, a thermosetting resin composition is preferable which contains (A) an organic compound containing at least two carbon-carbon double bonds having reactivity with an SiH group in one molecule, (B) a compound containing at least two SiH groups in one molecule, and (C) a hydrosilylation catalyst and a thermosetting resin composition (X) is more preferable which contains (D) a silicone compound containing at least one carbon-carbon double bond having reactivity with an SiH group in one molecule and (E) an inorganic filler with the component (A), the component (B), and the component (C) described above.

The thermosetting resin composition (X) has a relatively low coefficient of linear expansion, and therefore a difference from the coefficient of linear expansion of a metal material for use in the leads becomes small. The thermosetting resin composition (X) has high heat resistance and is difficult to suffer from heat deterioration accompanied by discoloration. Therefore, even when exposed to a high temperature, the optical reflectance is maintained at high level of the early stage of use.

Hereinafter, each of the components of (A) to (E) is described in detail.

The component (A) is not particularly limited insofar as the component is an organic compound containing at least two carbon-carbon double bonds having reactivity with an SiH group in one molecule.

As the skeleton of the component (A), not those containing a siloxane unit (Si—O—Si), such as a polysiloxane-organic block copolymer or a polysiloxane-organic graft copolymer, but compounds not containing elements other than C, H, N, O, S, and halogen as a constituent element are more preferable as the organic compound. In the case of those containing a siloxane unit, there is a problem in that the adhesion of a package of a semiconductor and a lead frame and sealing resin is likely to become low.

The component (A) can be classified into an organic polymer compound and an organic monomer compound.

As the component (A) which is an organic polymer compound, for example, those having a polyether skeleton, a polyester skeleton, a polyarylate skeleton, a polycarbonate skeleton, a saturated hydrocarbon skeleton, an unsaturated hydrocarbon skeleton, a polyacrylic ester skeleton, a polyamide skeleton, a phenol-formaldehyde skeleton (phenol resin skeleton), and a polyimide skeleton can be mentioned.

Among the above, the polyether polymer includes, for example, polyoxyethylene, polyoxypropylene, polyoxytetramethylene, a polyoxyethylene-polyoxypropylene copolymer, and the like. As a further specific example, a polymer represented by the following [Chemical Formula 1] is mentioned.

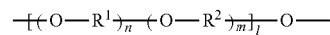

[C.1]

(In the formula above, $R^1$ and $R^2$ represent a two valent organic group having 1 to 6 carbon atoms not containing elements other than C, H, N, O, S, and halogen as a constituent element and n, m, and l represent the number of 1 to 300.)

The other organic polymer compounds include, for example, polyester polymers obtained by condensation of dibasic acids such as adipic acid, phthalic acid, isophthalic acid, terephthalic acid, and hexahydro phthalic acid, and glycols such as ethylene glycol, diethylene glycol, propylene glycol, tetramethylene glycol, and neopentyl glycol, or ring opening polymerization of lactones; polyolefin (saturated hydrocarbon) polymers obtained by hydrogenation of an ethylene-propylene copolymer, copolymers of polyisobutylene and isobutylene with isoprene and the like, copolymers of polychloroprene, polyisoprene, and isoprene with butadiene, acrylonitrile, styrene, and the like, copolymers of polybutadiene and butadiene with styrene, acrylonitrile, and the like, copolymers of polyisoprene, polybutadiene, isoprene, or butadiene with acrylonitrile, styrene, and the like; acrylic acid ester copolymers of acrylic acid esters such as polyacrylic acid ester, ethyl acrylate, and butyl acrylate obtained by radical polymerization of monomers such as ethyl acrylate and butyl acrylate with vinyl acetate, acrylonitrile, methyl methacrylate, styrene, and the like; graft polymers obtained by polymerizing vinyl monomers in the above-described organic polymers; polysulfide polymers; polyamide polymers, such as nylon 6 obtained by ring opening polymerization of ε-amino caprolactam, nylon 66 obtained by polycondensation of hexamethylenediamine and adipic acid, nylon 610 obtained by polycondensation of hexamethylenediamine and sebacic acid, nylon 11 obtained by polycondensation of ε-amino undecanoic acid, nylon 12 obtained by ring opening polymerization of ε-aminolaurolactam, and nylon copolymers containing two or more components among the above-described nylons; polycarbonate polymers manufactured by polycondensation of bisphenol A and carbonyl chloride, for example; diallyl phthalate polymers; phenol-formaldehyde resin (phenol resin), such as novolac type phenol resin, resol type phenol resin, ammonia resol type phenol resin, and benzylic ether type phenol resin, and the like.

An alkenyl group having a carbon-carbon double bond is introduced into the polymer skeleton of the organic polymer compound, whereby the component (A) can be formed. In this case, the alkenyl group having a carbon-carbon double bond may be present anywhere in a molecule but it is preferable that the alkenyl group is present in the side chain or the end of the polymer skeleton in terms of reactivity.

As a method for introducing the alkenyl group into the polymer skeleton, variously proposed methods can be used. The methods can be roughly classified into a method for introducing an alkenyl group after polymerization and a method for introducing an alkenyl group during polymerization.

As the method for introducing an alkenyl group after polymerization, the alkenyl group can be introduced into the end, the main chain, or the side chain by, for example, reacting, with an organic polymer having a functional group such as a hydroxyl group, an alkoxide group, a carboxyl group, an epoxy group, in the end, the main chain, or the side chain, an organic compound having both an active group and an alkenyl group which show reactivity to the functional group.

Mentioned as an example of the organic compound having both the active group and the alkenyl group which show reactivity to the functional group are unsaturated fatty acid having 3 to 20 carbon atoms such as acrylic acid, methacrylic acid, vinyl acetate, chloride acrylate, and bromide acrylate, C3 to C20 unsaturated aliphatic alcoholic substituted carbonic acid halide such as acid halide, acid anhydride and the like and allylchloroformate (CH$_2$=CHCH$_2$OCOCl), and allylbromoformate (CH$_2$=CHCH$_2$OCOBr), allyl chloride, allyl bromide, vinyl(chloromethyl)benzene, allyl(chloromethyl)benzene, allyl(bromomethyl)benzene, allyl(chloromethyl)ether, allyl(chloromethoxy)benzene, 1-butenyl(chloromethyl)ether, 1-hexenyl(chloromethoxy)benzene, allyloxy(chloromethyl)benzene, allyl isocyanate, and the like.

Moreover, a method for introducing an alkenyl group using an ester interchange method is mentioned. This method is a method for performing ester interchange of an alcohol residue of an ester portion of polyester resin or acrylic resin with an alkenyl group containing alcohol or an alkenyl group containing phenol derivative using an ester interchange catalyst. The alkenyl group containing alcohol and the alkenyl group containing phenol derivative for use in the ester interchange with an alcohol residue may be alcohol or a phenol derivative having at least one alkenyl group and having at least one hydroxyl group and is more preferably one having one hydroxyl group. The catalyst may not be used and a titanium catalyst and a tin catalyst are preferable.

The alkenyl group containing alcohol includes, for example, vinyl alcohol, allyl alcohol, 3-butene-1-ol, 4-pentene-1-ol, 5-hexene-1-ol, 6-heptene-1-ol, 7-octene-1-ol, 8-nonene-1-ol, 9-decene-1-ol, 2-(allyloxy)ethanol, neopentylglycol monoallyl ether, glycerindiallylether, trimethylolpropane triallyl ether, trimethylolethane triallyl ether, pentaerythritol tetraallyl ether, 1,2,6-hexanetriol triallyl ether, sorbitan triallyl ether, and the like. As the alkenyl group containing phenol derivative, compounds represented by the following [Chemical Formula 2] are mentioned.

[C.2]

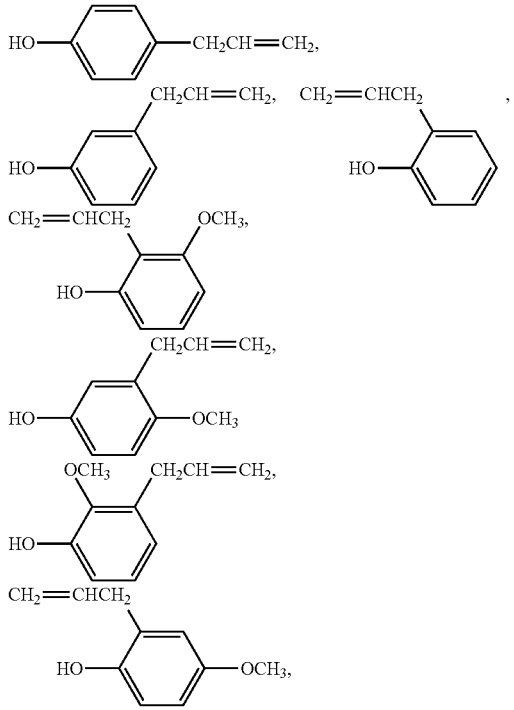

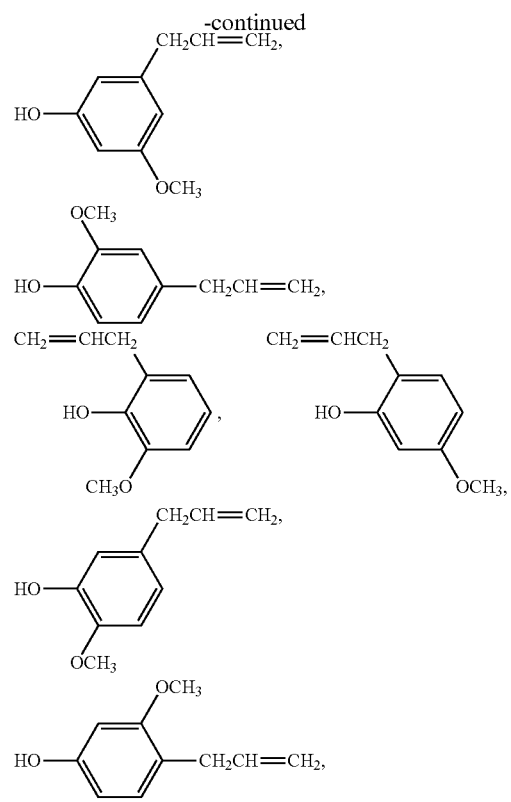

Among the above, allyl alcohol, vinyl alcohol, 3-butene-1-ol, 2-(allyloxy)ethanol, and compounds represented by the following [Chemical Formula 3] are preferable in terms of ease of availability.

[C.3]

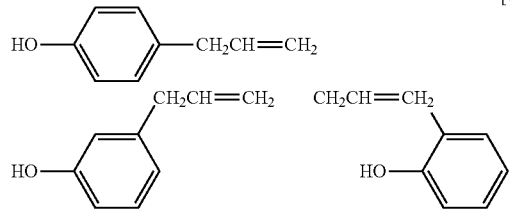

Furthermore, a method for introducing an alkenyl group is also mentioned which includes, while performing ester interchange of an esterified substance, such as ester acetate of the alcohol or the phenol derivative, and an ester portion of polyester resin or acrylic resin using an ester interchange catalyst, and then distilling off a low molecular weight esterified substance, such as ester acetate of an alcohol residue of the ester portion of the polyester resin or the acrylic resin to be generated, to the outside of the system by devolatilization under reduced pressure or the like.

Moreover, an alkenyl group can also be introduced into the end by a method including polymerizing methyl(meta)acrylate and the like by living polymerization, and then bonding a compound having an alkenyl group to the living end to thereby stop the polymerization reaction.

As a method for introducing an alkenyl group during polymerization, for example, in the case of manufacturing the organic polymer skeleton of the component (A) for use in the present invention by a radical polymerization method, by the use of a radical chain transfer agent having an alkenyl group having low radical reactivity, the alkenyl group can be introduced into the side chain and the end of the organic polymer skeleton. As such a radical chain transfer agent, vinyl monomers having an alkenyl group having low radical reactivity in the molecules, such as allyl methacrylate and allyl acrylate, and allyl mercaptan and the like are mentioned, for example.

The molecular weight of the component (A) is not particularly limited and arbitrary substances having a molecular weight of 100 to 100,000 and preferably 300 to 100,000 can be suitably used and, in the case of an alkenyl group containing organic polymer, those having a molecular weight of 500 to 20,000 are particularly preferable. When the molecular weight is less than 300, it is difficult to demonstrate the feature obtained utilizing an organic polymer, such as giving flexibility. When the molecular weight exceeds 100,000, it is difficult to demonstrate the crosslinking effect due to a reaction of an alkenyl group and an SiH group.

Mentioned as the component (A) which is an organic monomer compound are, for example, aromatic hydrocarbon compounds such as a phenol compound, a bisphenol compound, benzene, and naphthalene; aliphatic hydrocarbon compounds such as a straight chain compound and an alicyclic compound; and heterocyclic compounds, mixtures thereof, and the like.

In the component (A), the bonding position of the carbon-carbon double bonds having reactivity with an SiH group is not particularly limited and may be present anywhere in the molecule. The carbon-carbon double bond having reactivity with an SiH group is not particularly limited and a group represented by General Formula (I): $CH_2=C(R^1)-$ (In the formula above, $R^1$ represents a hydrogen atom or a methyl group.) is suitable in terms of reactivity. A group represented by Formula: $CH_2=CH-$ is particularly preferable in terms of ease of availability of raw materials.

As the carbon-carbon double bond having reactivity with an SiH group of the component (A), an alicyclic group represented by General Formula (II): $-C(R^2)=C(R^2)-$ (In the formula above, $R^2$ represents a hydrogen atom or a methyl group.) is suitable in terms of that the heat resistance of a cured resin body is high. Moreover, an alicyclic group represented by Formula: $-CH=CH-$ is particularly preferable in terms of ease of availability of raw materials.

The carbon-carbon double bond having reactivity with an SiH group may be directly bonded to the skeleton portion of the component (A) or may form a covalent bond through a substituent of two or more valences. The substituent of two or more valences is not particularly limited insofar as it is a substituent having 0 to 10 carbon atoms and those not containing elements other than C, H, N, O, S, and halogen as the constituent element are preferable. As an example of these substituents, compounds represented by the following [Chemical Formula 4] and [Chemical Formula 5] are mentioned. Moreover, two or more of the substituents of two or more valences may be bonded through a covalent bond to form one substituent of two or more valences.

[C. 4]

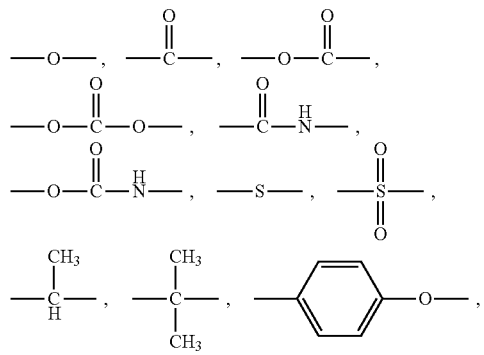

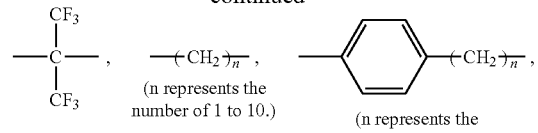

[C. 5]

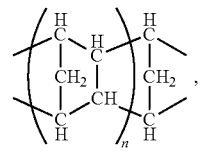

(n represents the number of 0 to 4.)

Mentioned as an example of the group which forms a covalent bond with the skeleton portion described above are a vinyl group, an allyl group, a methallyl group, an acrylic group, a methacryl group, a 2-hydroxy-3-(allyloxy)propyl group, a 2-allylphenyl group, a 3-allylphenyl group, a 4-allylphenyl group, a 2-(allyloxy)phenyl group, a 3-(allyloxy)phenyl group, a 4-(allyloxy)phenyl group, a 2-(allyloxy)ethyl group, a 2,2-bis(allyloxymethyl)butyl group, a 3-allyloxy-2,2-bis(allyloxymethyl)propyl group, and groups represented by the following [Chemical Formula 6].

[C.6]

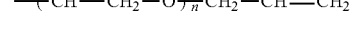

(n represents the number satisfying $5 \geq n \geq 2$.),

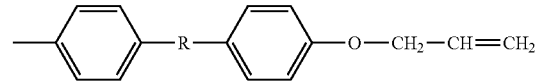

(R represents a divalent group selected from

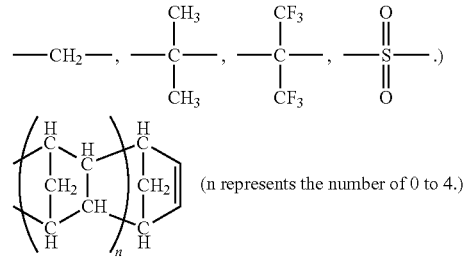

Mentioned as a specific example of the component (A) which is an organic polymer compound are 1,2-polybutadiene (one with a 1,2 ratio of 10 to 100%, preferably one with a 1,2 ratio of 50 to 100%), allyl ether of novolac phenol, arylated polyphenyleneoxide, polymers represented in the following [Chemical Formula 7] to [Chemical Formula 11], and the like.

[C.7]

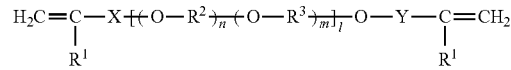

(In the formula above, $R^1$ represents H or $CH_3$, $R^2$ and $R^3$ represent a divalent organic group having 1 to 6 carbon atoms not containing C, H, N, O, S, and halogen as the constituent element, X and Y represent a divalent substituent having 0 to 10 carbon atoms, and n, m, and l represent the number of 1 to 300.)

[C. 8]

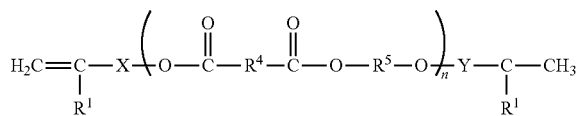

(In the formula above, $R^1$ represents H or $CH_3$, $R^4$ and $R^5$ represent a divalent organic group having 1 to 6 carbon atoms, X and Y represent a divalent substituent having 0 to 10 carbon atoms, and n, m, and l represent the number of 1 to 300.)

[C. 9]

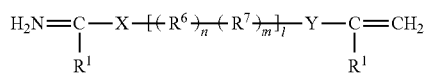

(In the formula above, $R^1$ represents H or $CH_3$, $R^6$ and $R^7$ represent a divalent organic group having 1 to 20 carbon atoms, X and Y represent a divalent substituent having 0 to 10 carbon atoms, and n, m, and l represent the number of 1 to 300.)

[C. 10]

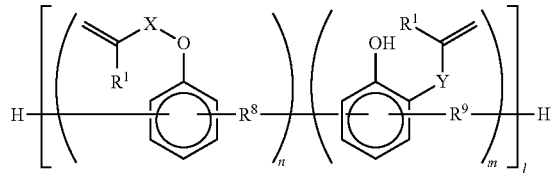

(In the formula above, $R^1$ represents H or $CH_3$, $R^8$ and $R^9$ represent a divalent organic group having 1 to 6 carbon atoms, X and Y represent a divalent substituent having 0 to 10 carbon atoms, and n, m, and l represent the number of 1 to 300.)

[C. 11]

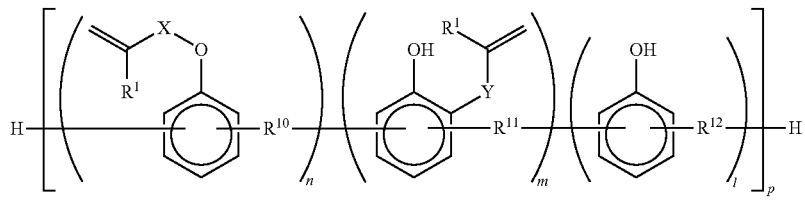

(In the formula above, $R^1$ represents H or $CH_3$, $R^{10}$, $R^{11}$, and $R^{12}$ represent a divalent organic group having 1 to 6 carbon atoms, X and Y represent a divalent substituent having 0 to 10 carbon atoms, and n, m, l, and p represent the number of 1 to 300.)

As a specific example of the component (A) which is an organic monomer compound are diallyl phthalate, trially trimellitate, diethylene glycol bisallyl carbonate, trimethylol propane diallyl ether, pentaerythritol triallyl ether, 1,1,2,2-tetra allyloxy ethane, diallylidene pentaerythritol, triallyl cyanurate, triallyl isocyanurate, 1,2,4-trivinylcyclohexane, divinylbenzenes (one having purity of 50 to 100%, preferably one having purity of 80 to 100%), divinylphenyl, 1,3-diisopropenyl benzene, 1,4-diisopropenyl benzene, and oligomers thereof, compounds in which a glycidyl group of a former known epoxy resin is partially or entirely substituted by an allyl group as represented in the following [Chemical Formula 12] and [Chemical Formula 13], and the like.

[C. 12]

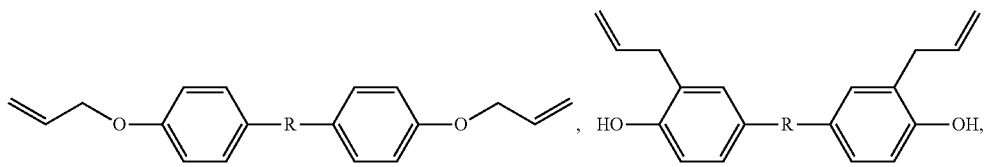

-continued
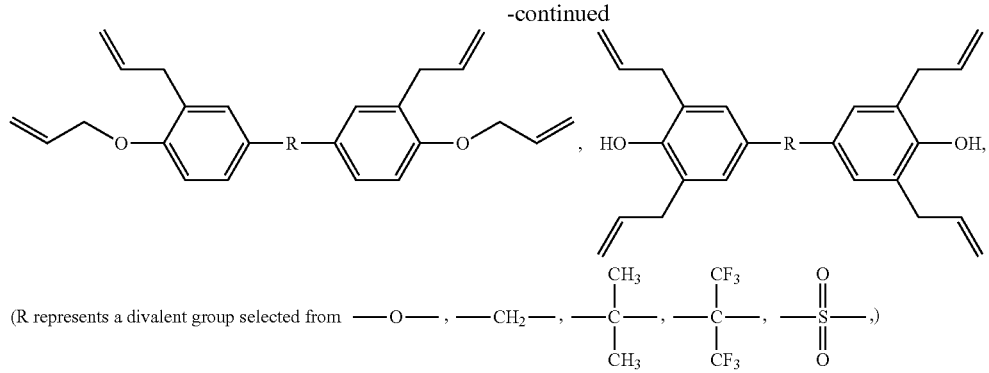
(R represents a divalent group selected from —O—, —CH$_2$—, —C(CH$_3$)$_2$—, —C(CF$_3$)$_2$—, —S(O)$_2$—,)
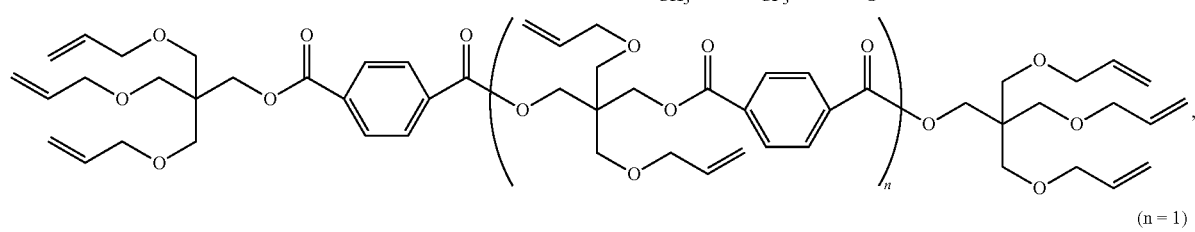
(n = 1)
[C. 13]
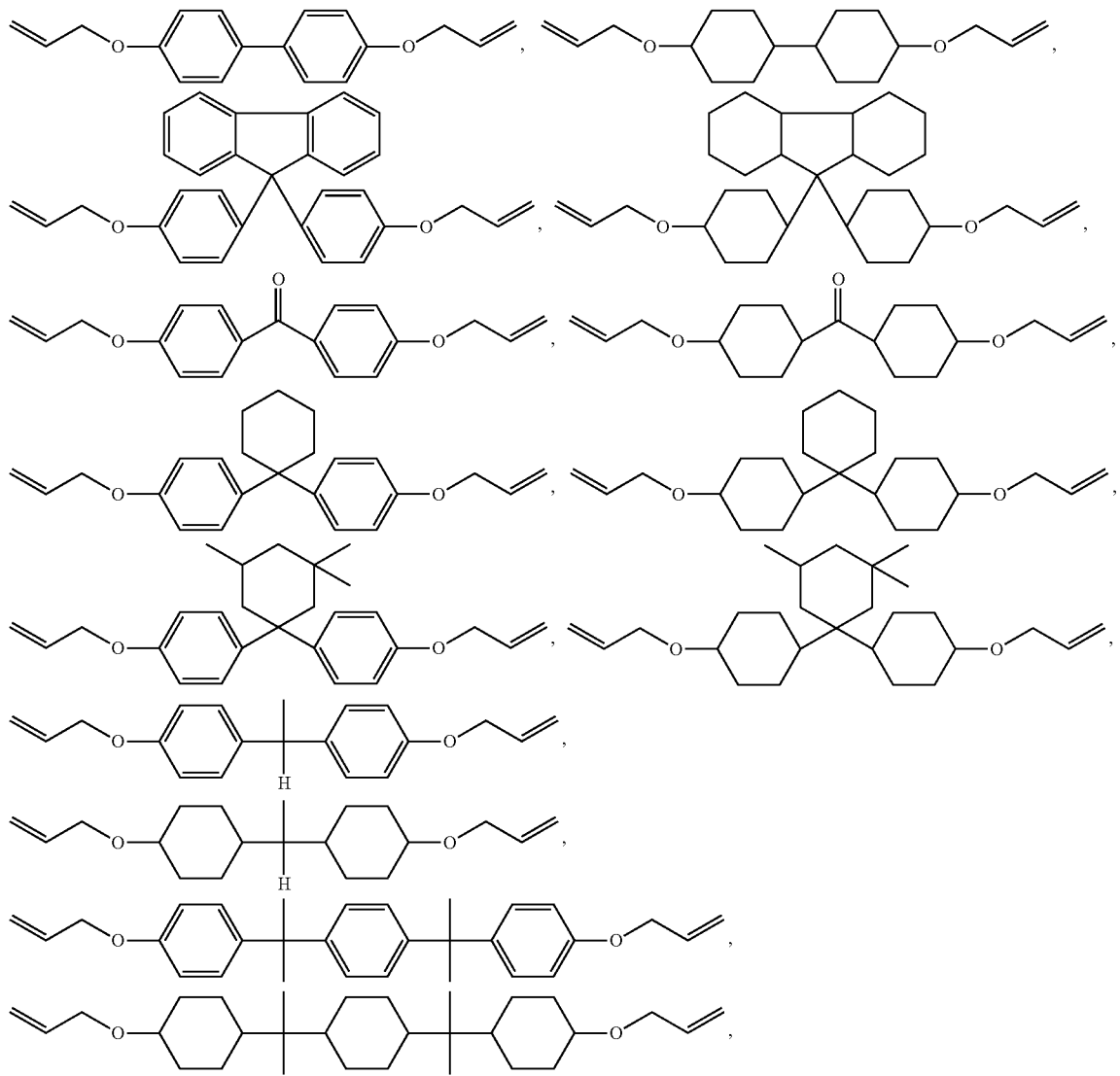

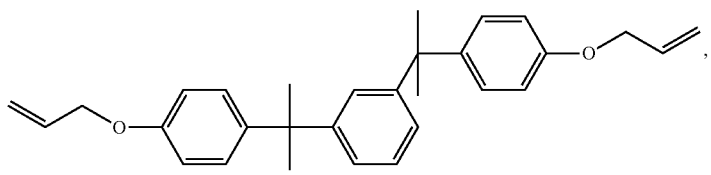

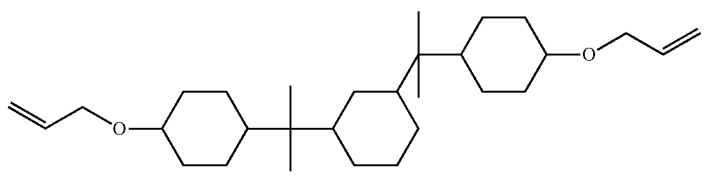

As the component (A), low molecular weight compounds which are difficult to represent while dividing the same into a skeleton portion and an alkenyl group as described above can also be used. Mentioned as a specific example of the low molecular weight compounds are aliphatic chain polyene compounds such as butadiene, isoprene, octadiene, and decadiene, aliphatic cyclic polyene compounds such as cyclopentadiene, cyclohexadiene, cyclooctadiene, dicyclopentadiene, tricyclopentadiene, and norbornadiene, substituted aliphatic cyclic olefin compounds such as vinyl cyclopentene and vinyl cyclohexene, and the like.

As the component (A), from the viewpoint that the heat resistance can be further increased, one containing a carbon-carbon double bond having reactivity with an SiH group in a proportion of 0.001 mol or more per g of the component (A) is preferable, one containing the carbon-carbon double bond in a proportion of 0.005 mol or more per g of the component (A) is more preferable, and one containing the carbon-carbon double bond in a proportion of 0.008 mol or more per g of the component (A) is still more preferable.

In the component (A), the number of the carbon-carbon double bonds having reactivity with an SiH group may be 2 on average per molecule. In order to further increase the dynamic strength, the number of the carbon-carbon double bonds is preferably more than 2 and still more preferably 3 or more. When the number of the carbon-carbon double bonds having reactivity with an SiH group of the component (A) is 1 or less per molecule, only a graft structure is generated even when the component (A) and the component (B) react with each other, and a crosslinking structure is not generated.

The component (A) preferably contains one or more vinyl groups in one molecule and more preferably two or more vinyl groups in one molecule from the viewpoint that the reactivity is good. Moreover, from the viewpoint that the storage stability easily becomes good, the component (A) preferably contains six or less vinyl groups in one molecule and more preferably contains four or less vinyl groups in one molecule.

The molecular weight of the component (A) is preferably less than 900, more preferably less than 700, and still more preferably less than 500 from the viewpoint that the dynamic heat resistance is high, the viewpoint that the raw material liquid has less stringiness and the molding properties and the handling are good, the viewpoint that uniform mixing with powder, such as the component (E) and the component (F), is easily achieved, and the viewpoint that the molding properties when formed into a thermosetting resin composition tablet are good.

The viscosity of the component (A) is preferably less than 1000 poise, more preferably less than 300 poise, and still more preferably less than 30 poise at 23° C. in order to achieve uniform mixing with other components and good workability. The viscosity can be measured with an E type viscometer.

As the component (A), from the viewpoint that the lightfastness is higher, one in which the content of a compound having a phenolic hydroxyl group and/or a phenolic hydroxyl group derivative is small is preferable and one not containing a compound having a phenolic hydroxyl group and/or a phenolic hydroxyl group derivative is preferable. The phenolic hydroxyl group in the present invention is a hydroxyl group directly bonded to the aromatic hydrocarbon core, such as a benzene ring, a naphthalene ring, and an anthracene ring. The phenolic hydroxyl group derivative represents a group in which the hydrogen atom of the above-described phenolic hydroxyl group is replaced by an alkyl group such as a methyl group or an ethyl group, an alkenyl group such as a vinyl group or an allyl group, an acyl group such as an acetoxy group, and the like.

Moreover, particularly from the viewpoint that the lightfastness is good, one having a component weight ratio of the aromatic ring in the component (A) of 50% by weight or less is preferable, one having a component weight ratio of the aromatic ring in the component (A) of 40% by weight or less is more preferable, and one having a component weight ratio of the aromatic ring in the component (A) of 30% by weight or less is still more preferable. One not containing the aromatic hydrocarbon ring is the most preferable.

From the viewpoint that the coloring of the cured resin body to be obtained hardly occurs and the lightfastness thereof is high, the component (A) is preferably vinylcyclohexene, dicyclopentadiene, vinylnorbornene, triallylisocyanurate, diallyl ether of 2,2-bis(4-hydroxycyclohexyl)propane, and 1,2,4-trivinylcyclohexane and particularly preferably triallylisocyanurate, diallyl ether of 2,2-bis(4-hydroxycyclohexyl)propane, and 1,2,4-trivinylcyclohexane.

The component (A) is preferably a compound represented by the following General Formula (III) from the viewpoint that the heat resistance and the lightfastness are particularly high.

[C. 14]

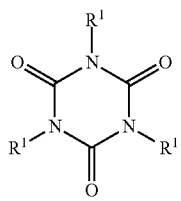

(III)

(In the formula above, the three R¹s are the same or different and represent a monovalent organic group having 1 to 50 carbon atoms.)

R¹ of General Formula (III) above is preferably a monovalent organic group having 1 to 20 carbon atoms, more preferably a monovalent organic group having 1 to 10 carbon atoms, and still more preferably a monovalent organic group having 1 to 4 carbon atoms from the viewpoint that the heat resistance of the cured resin body to be obtained can become higher. Mentioned as an example of the preferable R¹s are a methyl group, an ethyl group, a propyl group, a butyl group, a phenyl group, a benzyl group, a phenethyl group, a vinyl group, an allyl group, a glycidyl group, monovalent groups represented in the following [Chemical Formula 15], and the like.

[C. 15]

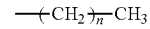

(In the formula, n represents the number of 4 to 19.),

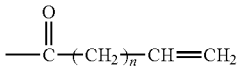

(In the formula, n represents the number of 2 to 18.),

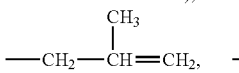

(In the formula, n represents the number of 0 to 17.),

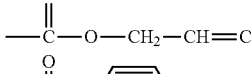

(In the formula, n represents the number of 0 to 19.),

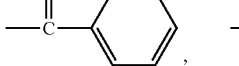

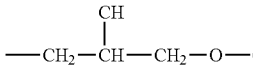

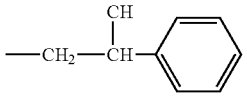

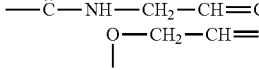

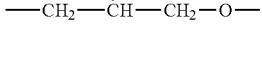

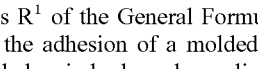

As R¹ of the General Formula (III), from the viewpoint that the adhesion of a molded resin body and a lead or a molded resin body and a sealing agent can become good or the dynamic strength of the molded resin body to be obtained can become high, at least one of the three R¹s is preferably a monovalent organic group containing one or more epoxy groups and having 1 to 50 carbon atoms and more preferably a monovalent organic group containing one or more epoxy groups represented by [Chemical Formula 16] and having 1 to 50 carbon atoms

[C. 16]

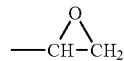

As an example of the preferable R¹s, a glycidyl group and groups represented in the [Chemical Formula 17] are mentioned.

[C. 17]

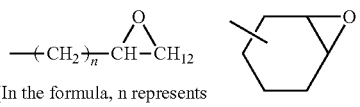

(In the formula, n represents the number of 2 to 18.)

From the viewpoint that the heat resistance of the cured resin body to be obtained can become good, R¹ of the General Formula (III) is preferably a monovalent organic group having 1 to 50 carbon atoms which contains two or less oxygen atoms and contains only C, H, and O as the constituent element and more preferably a monovalent hydrocarbon group having 1 to 50 carbon atoms. As an example of the preferable R¹s is a methyl group, an ethyl group, a propyl group, a butyl group, a phenyl group, a benzyl group, a phenethyl group, a vinyl group, an allyl group, a glycidyl group, and groups represented in the following [Chemical Formula 18] are mentioned.

[C. 18]

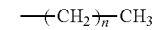

(In the formula, n represents the number of 4 to 49.),

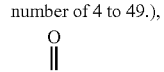

(In the formula, n represents the number of 2 to 48.),

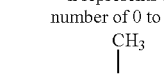

(In the formula, n represents the number of 0 to 47.),

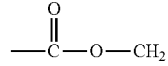

(In the formula, n represents the number of 0 to 49.),

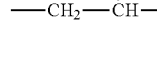

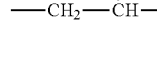

-continued $$-\text{C}(=O)-\text{NH}-\text{CH}_2-\text{CH}=\text{CH}_2,$$

$$-\text{CH}_2-\text{CH}(\text{O}-\text{CH}_2-\text{CH}=\text{CH}_2)-\text{CH}_2-\text{O}-\text{CH}_2-\text{CH}=\text{CH}_2,$$

As $R^1$s of the General Formula (III), at least one of the three $R^1$s is preferably a monovalent organic group having 1 to 50 carbon atoms which contains one or more groups represented by Formula: $-\text{C}(=\text{CH}_2)-$ from the viewpoint that the reactivity becomes good. It is more preferable that at least one of the three R's is a monovalent organic group having 1 to 50 carbon atoms which contains one or more groups represented by General Formula (IV): $\text{CH}_2=\text{C}(R^2)-$ [In the formula, $R^2$ represents a hydrogen atom or a methyl group.]. It is still more preferable that at least two $R^1$s of the three Ills are an organic compounds represented by General Formula (V)

$$\text{CH}_2=\text{C}(R^4)-R^3- \quad (V)$$

[In the formula above, $R^3$ represents a direct bond or a divalent organic group having 1 to 48 carbon atoms and $R^4$ represents a hydrogen atom or a methyl group.]

$R^3$ of the General Formula (V) represents a direct bond or a divalent organic group having 1 to 48 carbon atoms and, from the viewpoint of further increasing the heat resistance of the molded resin body to be obtained, is preferably a direct bond or a divalent organic group having 1 to 20 carbon atoms, more preferably a direct bond or a divalent organic group having 1 to 10 carbon atoms, and still more preferably a direct bond or a divalent organic group having 1 to 4 carbon atoms. Mentioned as an example of the preferable $R^3$s are groups represented in the following [Chemical Formula 19].

[C. 19]

$-(\text{CH}_2)_n-$
(In the formula, n represents the number of 1 to 17.), $-\text{C}(=O)-(\text{CH}_2)_n-$
(In the formula, n represents the number of 0 to 16.), $-\text{C}(=O)-\text{O}-(\text{CH}_2)_n-$
(In the formula, n represents the number of 0 to 16.), $-\text{C}(=O)-\text{NH}-(\text{CH}_2)_n-$
(In the formula, n represents the number of 0 to 16.), $-\text{C}(=O)-\text{C}_6\text{H}_4-$ , $-\text{CH}_2-\text{C}_6\text{H}_4-$ , $-\text{CH}_2-\text{CH}(\text{O}-\text{CH}_2-\text{CH}=\text{CH}_2)-\text{CH}_2-\text{O}-\text{CH}_2-,$ $R^3$ of the General Formula (V), from the viewpoint of further increasing the heat resistance of the molded resin body to be obtained, is preferably a direct bond or a divalent organic group having 1 to 48 carbon atoms which contains two or less oxygen atoms and contains only C, H, and O as the constituent element and more preferably a direct bond or a divalent hydrocarbon group having 1 to 48 carbon atoms.

Mentioned as an example of the preferable $R^3$s are groups represented in the following [Chemical Formula 20] and the like.

[C. 20]

$-(\text{CH}_2)_n-$
(In the formula, n represents the number of 1 to 47.), $-\text{C}(=O)-(\text{CH}_2)_n-$
(In the formula, n represents the number of 0 to 46.), $-\text{C}(=O)-\text{O}-(\text{CH}_2)_n-$
(In the formula, n represents the number of 0 to 46.), $-\text{C}(=O)-\text{C}_6\text{H}_4-$ , $-\text{CH}_2-\text{C}_6\text{H}_4-$ , $-\text{CH}_2-\text{CH}(\text{O}-\text{CH}_2-)-\text{CH}_2-\text{O}-\text{CH}_2-$ , $-\text{CH}_2-\text{CH}(\text{O}-\text{CH}_2-\text{CH}=\text{CH}_2)-\text{CH}_2-\text{O}-\text{CH}_2-$ , $R^4$ of the General Formula (V) is a hydrogen atom or a methyl group and, from the viewpoint that the reactivity is good, preferably a hydrogen atom.

Also in a preferable example of the organic compound represented by the General Formula (III) above, it is required to contain at least two carbon-carbon double bonds having reactivity with an SiH group in one molecule. From the viewpoint of further increasing the heat resistance, an organic compound containing three or more carbon-carbon double bonds having reactivity with an SiH group in one molecule is more preferable.

As a preferable specific example of the organic compound represented by the General Formula (III), triallylisocyanurate and compounds represented in the following [Chemical Formula 21] are mentioned.

[C. 21]

(triallylisocyanurate-type structures with methallyl and acryloyl substituents on the triazine-trione ring)

-continued

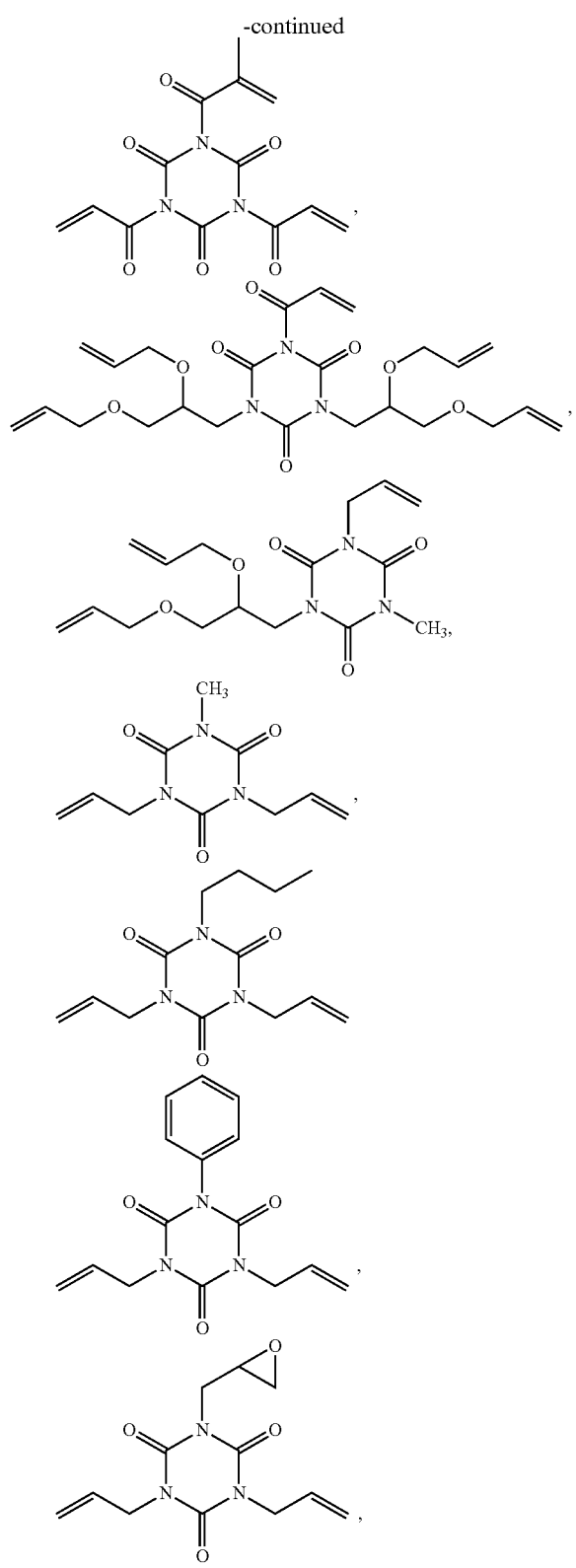

Mentioned as a preferable specific example of the component (A) of another aspect is a reactant of one or more kinds of compounds selected from the organic compounds containing at least two carbon-carbon double bonds having reactivity with an SiH group in one molecule described above as an example of the component (A) and a compound (β) having an SiH group (hereinafter referred to as a "(β) component"). Such a reactant has an advantage in that the compatibility with the component (B) is good and a problem of out gas from the molded resin body to be obtained is hard to arise due to the fact that the volatility is low.

The (β) component is a compound having an SiH group and chain and/or cyclic polyorganosiloxane having an SiH group is also mentioned as an example. Specifically, compounds represented in [Chemical Formula 22] and [Chemical Formula 23] are mentioned, for example.

[C. 22]

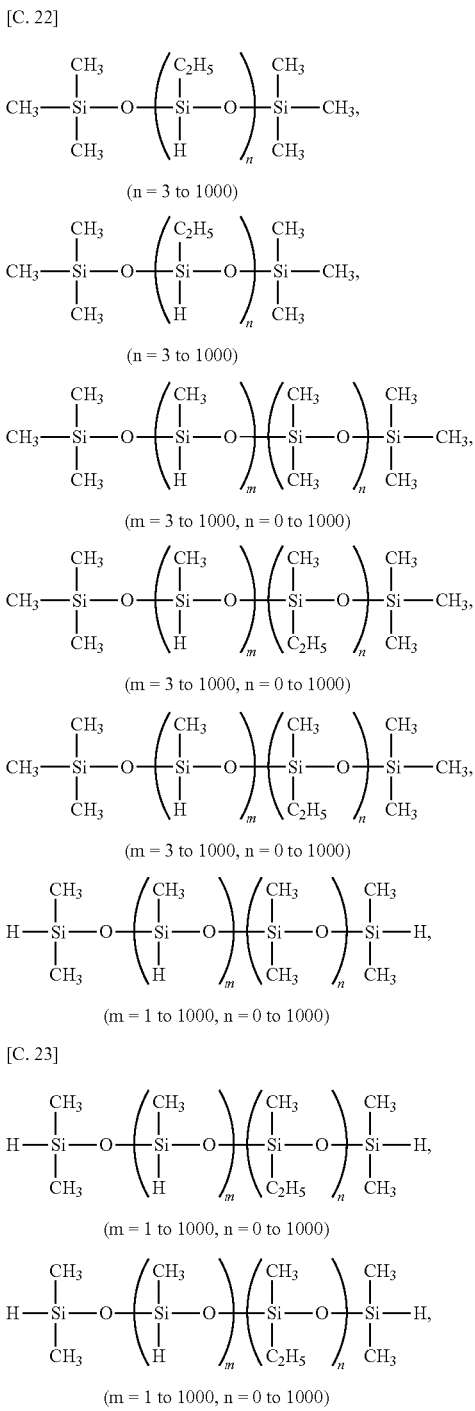

[C. 23]

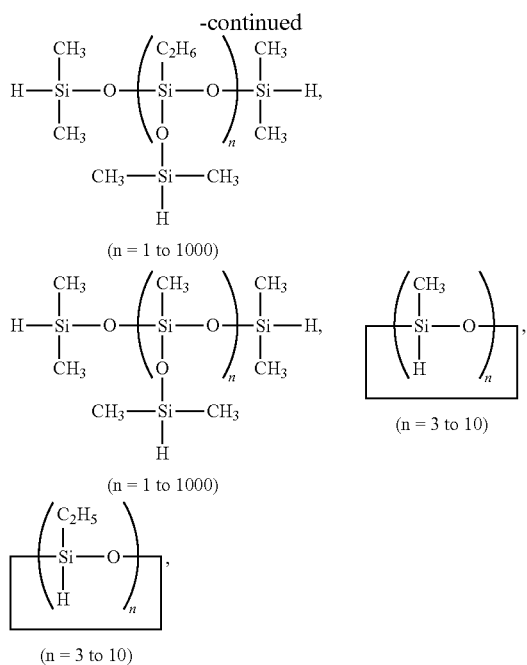

(n = 1 to 1000)

(n = 3 to 10)

(n = 1 to 1000)

(n = 3 to 10)

Herein, cyclic polyorganosiloxane which is represented by the following General Formula (VI) and having at least three SiH groups in one molecule is preferable from the viewpoint that the compatibility with an organic compound containing at least two carbon-carbon double bonds having reactivity with an SiH group in one molecule is likely to become good.

[C. 24]

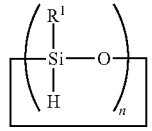

(VI)

(In the formula above, $R^1$ represents an organic group having 1 to 6 carbon atoms and n represents the number of 3 to 10.)

The substituent $R^1$ in the compound represented by General Formula (VI) is preferably a group which does not contain constituent elements other than C, H, and O and more preferably a hydrocarbon group, and still more preferably a methyl group. Moreover, the compound represented by General Formula (VI) is preferably 1,3,5,7-tetramethyl-cyclotetrasiloxane in terms of ease of availability and the like.

As another example of the (β) component, a compound having an SiH group, such as bisdimethylsilylbenzene, can be mentioned.

Various (β) components mentioned above can be used singly or in combination of two or more kinds thereof.

In the present invention, as described above, a compound obtained by performing a hydrosilylation reaction of the organic compound containing at least two carbon-carbon double bonds having reactivity with an SiH group in one molecule and the (β) component can be used as the component (A). When the organic compound containing at least two carbon-carbon double bonds having reactivity with an SiH group in one molecule and the (β) component are subjected to hydrosilylation reaction, a mixture containing a compound which can serve as the component (A) of the present invention and a plurality of other compounds is sometimes obtained. The thermosetting resin composition of the present invention can also be produced using such a mixture as it is without separating the compound which can serve as the component (A) from the mixture.

Herein, the hydrosilylation reaction is described in detail.

The mixing ratio of the organic compound containing at least two carbon-carbon double bonds having reactivity with an SiH group in one molecule and the (β) component is not particularly limited in the hydrosilylation reaction. In the respect that the gelling during the reaction can be suppressed, the ratio of the total number (X) of the carbon-carbon double bonds having reactivity with an SiH group in the former one and the total number (Y) of the SiH groups in the latter one is preferably X/Y≥2 and more preferably X/Y≥3. From the viewpoint that the compatibility of the component (A) with the component (B) easily becomes good, the ratio is preferably 10≥X/Y and more preferably 5≥X/Y.

In the hydrosilylation reaction, an appropriate catalyst may be used. Mentioned as the catalyst are, for example, platinum simple substance, those in which solid platinum is supported on carriers such as alumina, silica, and carbon black, chloroplatinic acid, complexes of chloroplatinic acid and alcohol, aldehyde, ketone, and the like, platinum-olefin complexes (for example, $Pt(CH_2=CH_2)_2(PPh_3)_2$, $Pt(CH_2=CH_2)_2Cl_2$), platinum-vinylsiloxane complexes (for example, $Pt(ViMe_2SiOSiMe_2Vi)_n$), $Pt[(MeViSiO)_4]m$), platinum-phosphine complexes (for example, $Pt(PPh_3)_4$, $Pt(PBu_3)_4$), platinum-phosphite complexes (for example, $Pt[P(OPh)_3]_4$, $Pt[P(OBu)_3]_4$) (In the formulae above, Me represents a methyl group, Bu represents a butyl group, Vi represents a vinyl group, Ph represents a phenyl group, and n and m represents an integer), dicarbonyl dichloro platinum, Karstedt catalyst, a platinum-hydrocarbon complex described in U.S. Pat. No. 3,159,601 and No. 3159662, specifications of Ashby, a platinum alcoholate catalyst described in U.S. Pat. No. 3,220,972, specification of Lamoreaux, a platinum chloride-olefin complex described in U.S. Pat. No. 3,516,946, specification of Modic, and the like.

Moreover, as an example of catalysts other than the platinum compounds, $RhCl(PPh)_3$, $RhCl_3$, $RhAl_2O_3$, $RuCl_3$, $IrCl_3$, $FeCl_3$, $AlCl_3$, $PdCl_2 \cdot 2H_2O$, $NiCl_2$, $TiCl_4$, and the like are mentioned.

Among the catalysts, chloroplatinic acid, a platinum-olefin complex, a platinum-vinylsiloxane complex, and the like are preferable from the viewpoint of catalyst activity. These catalysts can be used singly or in combination of two or more kinds thereof.

The addition amount of the catalyst is not particularly limited. In order to obtain a thermosetting resin composition which has sufficient curability and whose cost is relatively kept low, the addition amount is preferably $10^{-8}$ to $10^{-1}$ mol and more preferably $10^{-8}$ to $10^{-2}$ mol per mol of the SiH group of the (β) component.

Moreover, an assistant catalyst can be used with the above-described catalyst. Mentioned as a specific example of the assistant catalyst are phosphorus compounds such as triphenylphosphine, 1,2-diester compounds such as dimethyl maleate, acetylene alcohol compounds such as 2-hydroxy-2-methyl-1-butyne, sulfur compounds such as sulfur simple substance, amine compounds such as triethyl amine, and the like. The addition amount of the assistant catalyst is not particularly limited and is preferably $10^{-2}$ to $10^2$ mol and more preferably $10^{-1}$ mol to 10 mol per mol of the hydrosilylation catalyst.

In the hydrosilylation reaction, as a method for mixing the organic compound containing at least two carbon-carbon double bonds having reactivity with an SiH group in one molecule, the (β) component, and the catalyst, various methods can be employed. A method is preferable which includes mixing the catalyst with the organic compound containing at least two carbon-carbon double bonds having reactivity with an SiH group in one molecule, and then mixing the (β) component with the obtained mixture. A method including mixing the organic compound containing at least two carbon-carbon double bonds having reactivity with an SiH group in one molecule and the (β) component, and then mixing the catalyst with the obtained mixture has possibility of making it difficult to control the reaction. According to a method including mixing the (β) component and the catalyst, and then mixing the organic compound containing at least two carbon-carbon double bonds having reactivity with an SiH group in one molecule with the obtained mixture, the (β) component has reactivity with the mixed moisture in the presence of the catalyst, and therefore there is a possibility that the compound to be finally obtained may deteriorate.

The reaction temperature can be variously set and is preferably 30° C. to 200° C. and more preferably 50° C. to 150° C. When the reaction temperature is low, the reaction time for sufficiently reacting is prolonged. When the reaction temperature is high, it is not practically used. The reaction may be performed at a fixed temperature but may be changed in a multistage manner or continuously as required.

The reaction time and the pressure in the reaction can also be variously set as required.

A solvent may be used for the hydrosilylation reaction. The usable solvent is not particularly limited insofar as the hydrosilylation reaction is not hindered. As a specific example, hydrocarbon solvents such as benzene, toluene, hexane, and heptane, ether solvents such as tetrahydrofuran, 1,4-dioxane, 1,3-dioxolane, and diethylether, ketone solvents such as acetone and methyl ethyl ketone, and halogen solvents such as chloroform, methylene chloride, 1,2-dichloro ethane can be suitably used. The solvent can also be used as a mixed solvent of two or more kinds of solvents. Among the solvents, toluene, tetrahydrofuran, 1,3-dioxolane, and chloroform are preferable. The amount of the solvent to be used can also be set as appropriate.

In addition thereto, for the purpose of controlling the reactivity and the like, various additives may be used.

After allowing the organic compound containing at least two carbon-carbon double bonds having reactivity with an SiH group in one molecule and the (β) component to react with each other, a solvent and/or the unreacted organic compound containing at least two carbon-carbon double bonds having reactivity with an SiH group in one molecule and/or the unreacted (β) component can also be removed. These substances are volatile matter. By removing the same, the component (A) to be obtained does not contain volatile matter. As a result, it is difficult to cause a problem of voids and cracks due to the volatilization of the volatile matter in the curing of the component (A) and the component (B). As a removal method, devolatilization under reduced pressure, treatment with activated carbon, aluminum silicate, silica gel, or the like are mentioned, for example. When performing devolatilization under reduced pressure, the treatment is preferably performed at a low temperature. The upper limit of the temperature in this case is preferably 100° C. and more preferably 60° C. When treated at a high temperature, deterioration, such as viscosity increase, is likely to be involved.

Mentioned as an example of the component (A) which is a hydrosilylation reactant of the organic compound containing at least two carbon-carbon double bonds having reactivity with an SiH group in one molecule and the (β) component described above are a reactant of bisphenol A diallyl ether and 1,3,5,7-tetramethylcyclotetrasiloxane, a reactant of vinylcyclohexene and 1,3,5,7-tetramethylcyclotetrasiloxane, a reactant of divinylbenzene and 1,3,5,7-tetramethylcyclotetrasiloxane, a reactant of dicyclopentadiene and 1,3,5,7-tetramethylcyclotetrasiloxane, a reactant of triallylisocyanurate and 1,3,5,7-tetramethylcyclotetrasiloxane, a reactant of diallyl monoglycidyl isocyanurate and 1,3,5,7-tetramethylcyclotetrasiloxane, a reactant of vinyl norbornene and bisdimethylsilylbenzene, and the like.

The component (A) may have another reactive group. Mentioned as the reactive group in this case are an epoxy group, an amino group, a radical polymerizable unsaturated group, a carboxyl group, an isocyanate group, a hydroxyl group, an alkoxysilyl group, and the like. When having these functional groups, the adhesion of the thermosetting resin composition to be obtained is likely to become high and the strength of the cured resin body to be obtained is likely to become high. From the viewpoint that the adhesion can become higher, an epoxy group is preferable among these functional groups. Moreover, from the viewpoint that the heat resistance of the cured resin body to be obtained is likely to become high, it is preferable to have one or more reactive groups in one molecule on average.

The component (A) can be used singly or in combination of two or more kinds thereof.

Next, the component (B) is described in detail. The component (B) is a compound containing at least two SiH groups in one molecule.

The component (B) is not particularly limited insofar as it is a compound containing at least two SiH groups in one molecule. For example, compounds described in International Publication WO96/15194 and having at least two SiH groups in one molecule and the like can be used.

Among the above, in terms of availability, chain and/or cyclic organopolysiloxane having at least two SiH groups in one molecule are/is preferable. From the viewpoint that the compatibility with the component (A) is good, cyclic organopolysiloxane having at least two SiH groups in one molecule represented by the following General Formula (VI) is more preferable.

[C. 25]

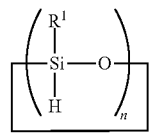

(VI)

(In the formula above, $R^1$ represents an organic group having 1 to 6 carbon atoms and n represents the number of 3 to 10.) The substituent $R^1$ in the compound represented by General Formula (VI) is preferably one containing C, H, and O, more preferably a hydrocarbon group, and still more preferably a methyl group. The compound represented by General Formula (VI) is preferably 1,3,5,7-tetramethylcyclotetrasiloxane from the viewpoint of ease of availability.

The molecular weight of the component (B) is not particularly limited and one having a low molecular weight is preferably used from the viewpoint of more easily demonstrating fluidity and being easily uniformly mixed with powder such as the component (E) and the component (F). In this case, the molecular weight is preferably 50 to 100,000, more preferably 50 to 1,000, and still more preferably 50 to 700.

In order to facilitate uniformly mixing with other components, particularly powder such as the component (E) and the component (F), and, in more detail, because the component (B) is not required to be heated to the melting point or higher to be formed into liquid for uniform mixing, the component (B) is preferably liquid at 23° C. and the viscosity thereof is preferably 50 Pa·s or less, more preferably 20 Pa·s or less, and still more preferably 5 Pa·s or less at 23° C. The viscosity can be measured with an E type viscometer.

The component (B) can be used singly or in combination of two or more kinds thereof.

As a preferable specific example of the component (B), a compound is mentioned which can be obtained by performing hydrosilylation reaction of an organic compound (α) (hereinafter referred to as an "α component") containing one or more carbon-carbon double bonds having reactivity with an SiH group in one molecule and the (β) compound having at least two SiH groups in one molecule. Such a compound has good compatibility with the component (A) and low volatility, and therefore has an advantage in that a problem of out gas from the thermosetting resin composition to be obtained is hard to arise.

Herein, as the (α) component, the same substances (hereinafter referred to as a "(α1) component") as those of the organic compound containing at least two carbon-carbon double bonds having reactivity with an SiH group in one molecule, which is the above-described component (A), can also be used. When the (α1) component is used, the crosslinking density of the cured resin body to be obtained becomes high, so that a cured resin body with high dynamic strength is likely to be obtained.

In addition thereto, an organic compound (α2) (hereinafter referred to as an "α2 component") containing one carbon-carbon double bond having reactivity with an SiH group in one molecule can also be used. When the (α2) component is used, the cured resin body to be obtained is likely to have low elasticity.

The (α2) component is not particularly limited insofar as it is an organic compound containing one carbon-carbon double bond having reactivity with an SiH group in one molecule. In the respect that the compatibility of the component (B) with the component (A) becomes good, the (α2) component is preferably not a compound containing a siloxane unit (Si—O—Si) such as a polysiloxane-organic block copolymer and a polysiloxane-organic graft copolymer but a compound containing only C, H, N, O, S, and halogen as the constituent element. In the (α2) component, the bonding position of the carbon-carbon double bond having reactivity with an SiH group is not particularly limited and may be located anywhere in the molecule.

Compounds which are the (α2) components can be classified into a polymer compound and a monomer compound. Mentioned as the polymer compound are, for example, a polysiloxane compound, a polyether compound, a polyester compound, a polyarylate compound, a polycarbonate compound, a saturated hydrocarbon compound, an unsaturated hydrocarbon compound, a polyacrylic ester compound, a polyamide compound, a phenol-formaldehyde compound (phenol resin compound), and a polyimide compound, and the like.

Mentioned as the monomer compound are, for example, aromatic hydrocarbon compounds such as a phenol compound, a bisphenol compound, benzene, and naphthalene; aliphatic hydrocarbon compounds such as straight chain compounds and alicyclic compounds; heterocyclic compounds; silicone compounds; mixtures thereof; and the like.

The carbon-carbon double bond having reactivity with an SiH group in the (α2) component is not particularly limited and, for example, is preferably a group represented by General Formula (I): $CH_2=C(R^1)-$ [In the formula, $R^1$ represents a hydrogen atom or a methyl group.] in terms of reactivity. Moreover, in terms of ease of availability of the raw materials, a group represented by Formula: $CH_2=CH-$ is particularly preferable.

As the carbon-carbon double bond having reactivity with an SiH group in the (α2) component, an alicyclic group represented by General Formula (II): $-C(R^2)=C(R^2)-$ [In the formula, $R^2$ represents a hydrogen atom or a methyl group.] is suitable in the respect that the heat resistance of the cured resin body is high. Moreover, in terms of ease of availability of the raw materials, an alicyclic group represented by Formula: $-CH=CH-$ is particularly preferable.

The carbon-carbon double bond having reactivity with an SiH group may be directly bonded to a skeleton portion of the (α2) component or may form a covalent bond through a substituent of two or more valences. The substituent of two or more valences is not particularly limited insofar as it is a substituent having 0 to 10 carbon atoms. In the respect that the compatibility of the component (B) with the component (A) is likely to become good, one containing only C, H, N, O, S, and halogen as the constituent element is preferable. As an example of the substituents, groups of two or more valences represented by the following [Chemical Formula 26] and the [Chemical Formula 27] are mentioned. Two or more of the substituents of two or more valences may be bonded through a covalent bond to constitute one substituent of two or more valences.

[C. 26]

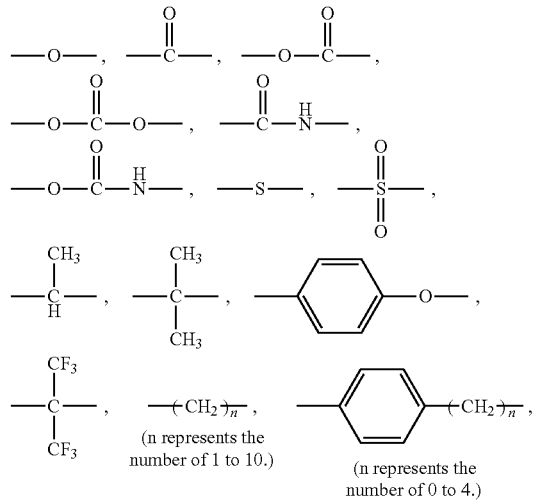

-continued

[C. 27]

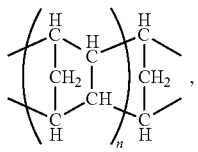

(n represents the number of 0 to 4.)

Mentioned as an example of the group which forms a covalent bond with the skeleton portions described above are a vinyl group, an allyl group, a methallyl group, an acrylic group, a methacryl group, a 2-hydroxy-3-(allyloxy)propyl group, a 2-allylphenyl group, a 3-allylphenyl group, a 4-allylphenyl group, a 2-(allyloxy)phenyl group, a 3-(allyloxy)phenyl group, a 4-(allyloxy)phenyl group, a 2-(allyloxy)ethyl group, a 2,2-bis(allyloxymethyl)butyl group, a 3-allyloxy-2,2-bis(allyloxymethyl)propyl group, and groups represented by the following [Chemical Formula 28].

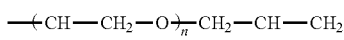

(n represents the number satisfying 5 ≥ n ≥ 2.),

(R represents a divalent group selected from —O—,

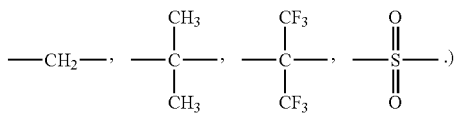

.)

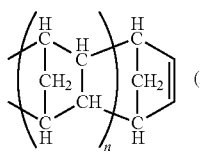

(n represents the number of 0 to 4.)

Mentioned as a specific example of the (α2) component are chain aliphatic hydrocarbon compounds such as propen, 1-butene, 1-pentene, 1-hexene, 1-heptene, 1-octene, 1-nonene, 1-decene, 1-dodecene, 1-undecene, LINEALENE manufactured by Idemitsu Kosan Co., Ltd., 4,4-dimethyl-1-pentene, 2-methyl-1-hexene, 2,3,3-trimethyl-1-butene, and 2,4,4-trimethyl-1-pentene, cycloaliphatic hydrocarbon compounds such as cyclohexene, methylcyclohexene, methylene cyclohexane, norbornylene, ethylidenecyclohexane, vinylcyclohexane, camphene, caren, α-pinene, and β-pinene, aromatic hydrocarbon compounds such as styrene, α-methylstyrene, indene, phenyl acetylene, 4-ethynyltoluene, allylbenzene, and 4-phenyl-1-butene, allyl ethers such as alkyl allyl ether and allyl phenyl ether, aliphatic compounds such as glycerin monoallyl ether, ethylene glycol monoallylether, and 4-vinyl-1,3-dioxolane-2-one, aromatic compounds such as 1,2-dimethoxy-4-allylbenzene and o-allyl phenol, substituted isocyanurates such as monoallyl dibenzyl isocyanurate and monoallyl diglycidyl isocyanurate, silicon compounds such as vinyl trimethyl silane, vinyl trimethoxy silane, and vinyl triphenyl silane, and the like.

Furthermore, mentioned as a specific example of the (α2) component are polymers or oligomers having a vinyl group at one end, such as polyether resin such as one end allylated polyethylene oxide and one end allylated polypropylene oxide, hydrocarbon resin such as one end allylated polyisobutylene, acrylic resin such as one end allylated polybutyl acrylate and one end allylated polymethyl methacrylate, and the like.

The structure of the (α2) component may be a linear structure or a branched structure and various kinds of (α2) components may be used without particular limitation in the molecular weight. The molecular weight distribution is not particularly limited and the molecular weight distribution is preferably 3 or less, more preferably 2 or less, and still more preferably 1.5 or less in the respect that the viscosity of a thermosetting resin composition becomes low and the molding properties thereof are likely to become good. In this specification, the molecular weight distribution (Ratio of Weight average molecular weight and Number average molecular weight) was calculated by a standard polystyrene conversion method using gel permeation chromatography (GPC). As a GPC column, one filled with polystyrene crosslinked gel (shodex GPC K-804, K-802.5, manufactured by Showa Denko K.K.) was used. As a GPC solvent, chloroform was used.

When the (α2) component has a Tg, various (α2) components can be used without particular limitation also in the Tg. The Tg is preferably 100° C. or less, more preferably 50° C. or less, and still more preferably 0° C. or less in the respect that the cured resin body to be obtained is likely to become tough. As an example of a preferable resin, polybutyl acrylate resin and the like are mentioned. Conversely, in the respect that the heat resistance of the cured resin body to be obtained becomes high, the Tg is preferably 100° C. or higher, more preferably 120° C. or higher, still more preferably 150° C. or higher, and most preferably 170° C. or higher. The Tg can be calculated as a temperature at which the tan δ indicates the maximum in the dynamic viscoelasticity measurement.

The (α2) component is preferably a hydrocarbon compound from the viewpoint that the heat resistance of the cured resin body to be obtained becomes high. In this case, a preferable number of carbon atoms is 7 to 10.

The component (α2) may have another reactive group. As the reactive group in this case, an epoxy group, an amino group, a radical polymerizable unsaturated group, a carboxyl group, an isocyanate group, a hydroxyl group, an alkoxysilyl group, and the like are mentioned. When having these functional groups, the adhesion of the thermosetting resin composition to be obtained is likely to become high and the strength of the cured resin body to be obtained is likely to become high. From the respect that the adhesion can become higher, an epoxy group is preferable among these functional groups. Moreover, in the respect that the heat resistance of the cured resin body to be obtained is likely to become high, it is preferable to have one or more reactive groups in one molecule on average. Specifically, monoallyl diglycidyl isocyanurate, allylglycidyl ether, allyloxy ethyl methacrylate, allyloxy ethyl acrylate, vinyl trimethoxy silane, and the like are mentioned.

The (α1) components mentioned above can be used singly or in combination of two or more kinds thereof. The (α2) components can also be used singly or in combination of two or more kinds thereof.

Next, the (β) component for use in the component (B) is described in detail. The (β) component is a compound having at least two SiH groups in one molecule and chain and/or cyclic polyorganosiloxanes are also an example thereof. Specifically, compounds represented in the following [Chemical Formula 29] and [Chemical Formula 30] are mentioned.

[C. 29]

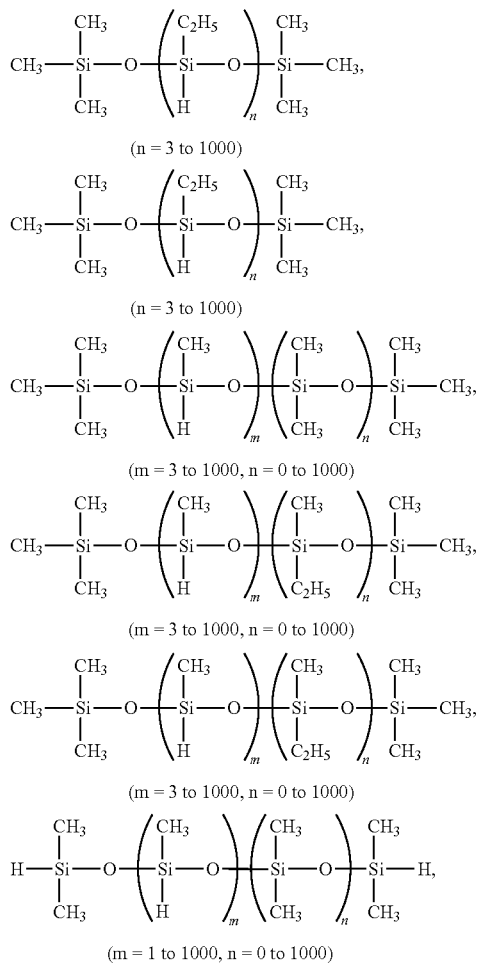

[C. 30]

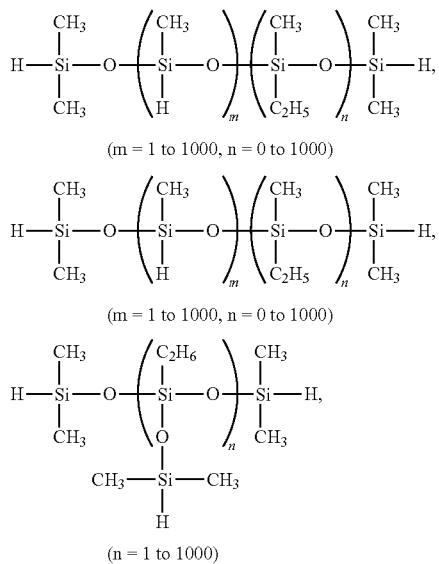

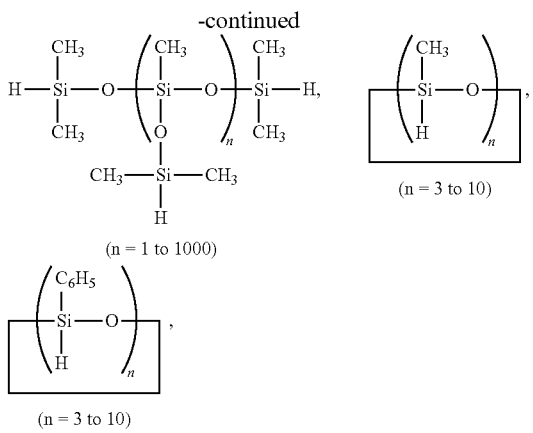

Herein, cyclic polyorganosiloxane having at least three SiH groups in one molecule represented by the following General Formula (VI) is preferable from the viewpoint that the compatibility with the (a) component is likely to become good. The substituent $R^1$ in the compound represented by the following General Formula (VI) is preferably a group containing C, H, and O, more preferably a hydrocarbon group, and still more preferably a methyl group. Moreover, in terms of ease of availability and the like, the substituent $R^1$ is preferably 1,3,5,7-tetramethylcyclotetrasiloxane.

[C. 31]

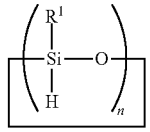

(VI)

(In the formula above, $R^1$ represents an organic group having carbon atoms of 1 to 6 and n represents the number of 3 to 10.)

As another example of the (β) component, compounds having an SiH group, such as bisdimethylsilylbenzene, are mentioned.

The (β) components mentioned above can be used singly or in combination of two or more kinds thereof.

As described above, in the present invention, compounds obtained by hydrosilylation reaction of the (α) components and the (β) components can be used as the component (B)s. When subjecting the (α) component and the (β) component to hydrosilylation reaction, a mixture containing one or more kinds of other compounds is sometimes obtained with the compound usable as the component (B) of the present invention. The thermosetting resin composition of the present invention can also be produced using such a mixture as it is as the component (B) without separating the compound usable as the component (B) from the mixture.

The hydrosilylation reaction of the (α) component and the (β) component is specifically as follows. The mixing ratio of the (α) component and the (β) component is not particularly limited. When considering the strength of the cured resin body to be obtained by the hydrosilylation of the component (B) and the component (A), it is preferable that the number of the SiH groups of the component (B) is larger. Therefore, the ratio (Y/X) of the total number (X) of the carbon-carbon double bonds having reactivity with the SiH group in the mixed (α) component and the total number (Y) of the SiH groups in the mixed (β) component is generally preferably Y/X≥2 and more preferably Y/X≥3. From the viewpoint that the compatibility of the component (B) with the component (A) is likely to become good, the mixing ratio is preferably 10≥Y/X and more preferably 5≥Y/X.

The type of a catalyst, the addition amount of the catalyst, the use of an assistant catalyst, the use amount and a mixing method of each component, the reaction time, the reaction temperature, the pressure in the reaction, the removal (devolatilization) of volatile matter and the effect obtained by the removal of volatile matter, and the like in the hydrosilylation reaction of the (α) component and the (β) component for obtaining the component (B) are the same as those of the hydrosilylation reaction for obtaining the component (A).

Mentioned as a specific example of the component (B) which is a hydrosilylation reactant of the (α) component and the (β) component are a reactant of bisphenol A diallyl ether and 1,3,5,7-tetramethylcyclotetrasiloxane, a reactant of vinylcyclohexene and 1,3,5,7-tetramethylcyclotetrasiloxane, a reactant of divinylbenzene and 1,3,5,7-tetramethylcyclotetrasiloxane, a reactant of dicyclopentadiene and 1,3,5,7-tetramethylcyclotetrasiloxane, a reactant of triallylisocyanurate and 1,3,5,7-tetramethylcyclotetrasiloxane, a reactant of diallylmonoglycidyl isocyanurate and 1,3,5,7-tetramethylcyclotetrasiloxane, a reactant of allyl glycidyl ether and 1,3,5,7-tetramethylcyclotetrasiloxane, a reactant of α-methylstyrene and 1,3,5,7-tetramethylcyclotetrasiloxane, a reactant of monoallyl diglycidyl isocyanurate and 1,3,5,7-tetramethylcyclotetrasiloxane, a reactant of vinyl norbornene and bisdimethylsilylbenzene, and the like.

When mixing the component (A) and the component (B), the combination of the component (A) and the component (B) includes various combinations of at least one kind selected from the component (A)s mentioned above and at least one kind selected from the component (B)s mentioned above.

The mixing ratio of the component (A) and the component (B) is not particularly limited insofar as required strength is not lost. The ratio (Y/X) of the number (Y) of the SiH groups in the component (B) to the number (X) of the carbon-carbon double bonds in the component (A) is preferably 0.3≤Y/X≤3, more preferably 0.5≤Y/X≤2, and still more preferably 0.7≤Y/X≤1.5. When deviating from the preferable range, sufficient strength is not obtained or heat deterioration is likely to occur in some cases.

The component (C) of the present invention is a hydrosilylation catalyst. The hydrosilylation catalyst is not particularly limited insofar as it has catalyst activity of the hydrosilylation reaction. For example, any hydrosilylation catalyst for use in the hydrosilylation reaction for obtaining the component (A) and the hydrosilylation reaction for obtaining the component (B) can be used, and a preferable hydrosilylation catalyst is also the same. The hydrosilylation catalysts can be used singly or in combination of two or more kinds thereof.

The addition amount of the hydrosilylation catalyst is not particularly limited. In order to obtain sufficient curability and to keep the cost of the thermosetting resin composition relatively low, the addition amount is preferably $10^{-8}$ mol to $10^{-1}$ mol and more preferably $10^{-6}$ mol to $10^{-2}$ mol per mol of the SiH group of the component (B). Moreover, an assistant catalyst can be used with the hydrosilylation catalyst. The type and the addition amount of the assistant catalyst are also the same as those of the hydrosilylation reaction for obtaining the component (A) and the hydrosilylation reaction for obtaining the component (B).

The component (D) of the present invention is a silicone compound containing at least one carbon-carbon double bond having reactivity with an SiH group in one molecule. By the use of the component (D), when mixed with an inorganic filler as the component (E), the thermosetting resin composition (X) which gives a cured resin body having a smaller coefficient of linear expansion can be obtained.

The silicone compound as the component (D) is a compound in which the skeleton is substantially formed by a Si—O—Si bond and various substances, such as those having a straight chain shape, a cyclic shape, a branched shape, and a partial network, are used. Various substituents may be bonded to such a skeleton.

Mentioned as the substituents bonded to a skeleton are groups, such as alkyl groups such as a methyl group, an ethyl group, a propyl group, and an octyl group, aryl groups such as a phenyl group, a 2-phenylethyl group, and a 2-phenylpropyl group, alkoxy groups such as a methoxy group, an ethoxy group, and an isopropoxy group, and a hydroxyl group. Among the above, in the respect that the heat resistance is likely to become high, a methyl group, a phenyl group, a hydroxyl group, and a methoxy group are preferable, and a methyl group and a phenyl group are more preferable. Moreover, as a substituent having a carbon-carbon double bond having reactivity with an SiH group, a vinyl group, an allyl group, an acryloxy group, a methacryloxy group, an acryloxypropyl group, a methacryloxypropyl group, and the like are mentioned. Among the above, a vinyl group is preferable in the respect that the reactivity is good.

The component (D) may be a compound represented by the following formula.

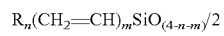

$R_n(CH_2=CH)_mSiO_{(4-n-m)/2}$ (In the formula above, R is a group selected from a hydroxyl group, a methyl group, or a phenyl group and n and m satisfy 0≤n<4, 0<m≤4, and 0<n+m≤4.)

As a specific example of the component (D), polydimethylsiloxane, polydiphenylsiloxane, polymethylphenylsiloxane which have a vinyl group as an end group or a side chain group, two kinds or three kinds of random or block copolymers selected from these siloxanes, 1,3-divinyltetramethyldisiloxane, 1,3,5,7-tetravinylcyclotetrasiloxane, and the like are mentioned. The component (D)s can be used singly or in combination of two or more kinds thereof.

Among the above, in the respect that the effects of the present invention are easily obtained, straight chain polysiloxane having a vinyl group at the end is preferable, straight chain polysiloxane having a vinyl group at both the ends is more preferable, straight chain polymethylphenylsiloxane having a vinyl group at both the ends is still more preferable, and siloxane which is straight chain polymethylphenylsiloxane having a vinyl group at both the ends and in which the amount of the phenyl group based on all the substituents is 20 mol % or more is particularly preferable.

The molecular weight of the component (D) is preferably 1,000 or more and 1,000,000 or less, more preferably 5,000 or more and 100,000 or less, and still more preferably 10,000 or more and 100,000 or less in terms of weight average molecular weight (Mw). When the molecular weight is small, the cured resin body to be obtained is likely to have low stress. When the molecular weight is large, the compatibility with the component (A) becomes difficult to obtain.

The use amount of the component (D) is preferably 30% by weight or more, more preferably 50% by weight or more, and still more preferably 80% by weight or more based on the total amount of the component (A) and the component (B).

The mixing ratio of the component (A), the component (B), and the component (D) is not particularly limited insofar as required strength is not lost. The ratio of the number (Y) of the SiH groups in the component (B) to the number (X) of the carbon-carbon double bonds having reactivity with an SiH group in the component (A) and the component (D) is preferably $0.3 \leq Y/X \leq 3$, more preferably $0.5 \leq Y/X \leq 2$, and still more preferably $0.7 \leq Y/X \leq 1.5$. When deviating from the preferable range, sufficient strength is not obtained or heat deterioration is likely to occur in some cases.

The component (E) of the present invention is an inorganic filler. The component (E) has effects of increasing the strength and the hardness of the cured resin body to be obtained or reducing the coefficient of linear expansion.

As the inorganic filler as the component (E), various kinds of inorganic fillers generally used and/or proposed as a filler of former epoxy sealing materials and the like are used. For example, silica-based inorganic fillers such as quartz, fumed silica, precipitated silica, anhydrous silicic acid, fused silica, crystalline silica, and ultrafine powder amorphous silica, alumina, zircon, silicon nitride, aluminum nitride, silicon carbide, glass fiber, alumina fiber, carbon fiber, mica, black lead, carbon black, graphite, diatomite, kaolin, clay, talc, aluminum hydroxide, calcium carbonate, potassium titanate, calcium silicate, inorganic balloon, silver dust, and the like are mentioned. The inorganic filler preferably has low radiation properties from the viewpoint that a semiconductor device is difficult to be damaged.

The inorganic filler may be surface-treated as appropriate. As the surface treatment, treatment with a coupling agent, alkylation treatment, trimethylsilylation treatment, siliconization, and the like are mentioned.

As an example of the coupling agent in this case, a silane coupling agent is mentioned. The silane coupling agent is not particularly limited insofar as it is a compound having at least one functional group having reactivity with an organic group and at least one hydrolyzable silicon group in the molecules. As the group having reactivity with an organic group, at least one functional group selected from an epoxy group, a methacryl group, an acryl group, an isocyanate group, an isocyanurate group, a vinyl group, and a carbamate group is preferable in terms of the handling properties and an epoxy group, a methacryl group, and an acryl group are particularly preferable in terms of the curability and the adhesion. As the hydrolyzable silicon group, an alkoxysilyl group is preferable in terms of the handling properties and a methoxysilyl group and an ethoxysilyl group are particularly preferable in terms of the reactivity.

Mentioned as a preferable silane coupling agent are alkoxysilanes having an epoxy functional group such as 3-glycidoxypropyltrimethoxysilane, 3-glycidoxypropyltriethoxysilane, 2-(3,4-epoxycyclohexyl)ethyltrimethoxy silane, and 2-(3,4-epoxycyclohexyl)ethyltriethoxysilane; alkoxysilanes having a methacryl group or an acryl group such as 3-methacryloxypropyltrimethoxysilane, 3-methacryloxypropyltriethoxysilane, 3-acryloxypropyltrimethoxysilane, 3-acryloxypropyltriethoxysilane, methacryloxymethyltrimethoxysilane, methacryloxymethyltriethoxysilane, acryloxymethyltrimethoxysilane, and acryloxymethyltriethoxysilane, and the like.

In addition thereto, a method for adding an inorganic compound is mentioned. For example, a method is mentioned which includes adding an inorganic compound to the thermosetting resin composition to be used in the present invention, and then causing the same to react in the thermosetting resin composition or a partial reactant of the thermosetting resin composition to generate an inorganic filler in the thermosetting resin composition. Mentioned as such an inorganic compound are hydrolyzable silane monomers or oligomers such as alkoxysilane, asiloxysilane, and silane halide, and alkoxides, asiloxides, and halides of metals such as titanium and aluminum, and the like.

Among the inorganic fillers mentioned above, a silica based inorganic filler is preferable from the viewpoint that the curing reaction is hard to be hindered, an effect of reducing the coefficient of linear expansion is high, and the adhesion with a lead or a lead frame is likely to become high. Furthermore, fused silica is preferable from the viewpoint that the balance of the physical properties such as molding properties and electrical properties and a crystalline silica is preferable from the viewpoint that the thermal conductivity of a cured resin body is likely to become high and a design of a molded resin body with high heat dissipation properties can be achieved. From the viewpoint that the heat dissipation properties are more likely to become high, alumina is preferable. Moreover, titanium oxide is preferable from the viewpoint that the optical reflectance of the resin for use in a molded resin body is high and the light extraction efficiency in the light-emitting device to be obtained is likely to become high. In addition thereto, glass fiber, potassium titanate, and calcium silicate are preferable from the viewpoint that the reinforcement effect is high and the strength of a molded resin body is likely to become high.

As the average particle diameter and the particle size distribution of the inorganic filler, those having various values are used without particular limitation, such as those which are used and/or proposed as a filler for former sealing materials, such as an epoxy type. The usually used average particle diameter is 0.1 μm to 120 μm and preferably 0.5 μm to 60 μm and more preferably 0.5 μm to 15 μm from the viewpoint that the fluidity is likely to become good.

The specific surface area of the inorganic filler can also be variously set, such as those which are used and/or proposed as a filler for former sealing materials, such as an epoxy type.

As the shape of the inorganic filler, various kinds of shapes, such as a crashed shape, a flake shape, a spherical shape, and a bar shape, are used. Also with respect to the aspect ratio, various aspect ratios are used. From the viewpoint that the strength of the cured resin body to be obtained is likely to become high, those having an aspect ratio of 10 or more are preferable. Moreover, from the viewpoint of the isotropic shrinkage of resin, a powder shape is more preferable than a fiber shape. From the viewpoint that the fluidity in molding is likely to become good also in high filling, one having a spherical shape is preferable.

Various kinds of the inorganic fillers mentioned above can be used singly or in combination of two or more kinds thereof.

Although the use amount of the component (E) is not particularly limited. The total amount of the component (E) based on the entire thermosetting resin composition (X) is preferably 70% by weight or more, more preferably 80% by weight or more, and still more preferably 90% by weight or more. When the amount of the component (E) is small, the effect of increasing the strength and the hardness, the effect of reducing the coefficient of linear expansion, and the like are difficult to obtain.

As the order of mixing the inorganic filler which is the component (E), various methods can be employed. A method for mixing a mixture of the component (C) and the inorganic filler with the component (A) with the component (B) is preferable from the viewpoint that the storage stability of an intermediate material of the thermosetting resin composition (X) is likely to become good. When employing the method for mixing the component (A) with the mixture of the component (C) and/or the inorganic filler with the component (B), the component (B) is sometimes altered during storage or the like because the component (B) has reactivity with the moisture in the environment and/or the inorganic filler in the presence and/or in the absence of the component (C). Moreover, from the viewpoint that the component (A), the component (B), and the component (C) are sufficiently mixed which are reaction components to easily give a stable molded product, it is preferable to mix a mixture of the component (A), the component (B), and the component (C) with the inorganic filler.

As methods of mixing the inorganic filler which is the component (E), various former methods which are used and/or proposed for an epoxy resin and the like can be used. For example, stirring apparatuses such as a two-roll mill, a three-roll mill, a planetary stirring and defoaming apparatus, a homogenizer, a dissolver, and a planetary mixer, and melt-kneading apparatuses such as a Plastomill. Among the above, a three-roll mill and a melt-kneading apparatus are preferable from the viewpoint that sufficient dispersibility of the inorganic filler is easily obtained even in high filling. The mixing of the inorganic filler may be performed at normal temperature or under heating. Or, the mixing may be performed under normal pressure or under reduced pressure. From the viewpoint that sufficient dispersibility of the inorganic filler is easily obtained even in high filling, it is preferable to mix the same under heating. From the viewpoint that the wettability of the inorganic filler surface is increased and sufficient dispersibility is easily obtained, it is preferable to mix the same under reduced pressure.

It is preferable for the thermosetting resin composition (X) to contain a component (F). The component (F) is a white pigment and has an effect of increasing the optical reflectance of the cured resin body to be obtained.

As the component (F), various kinds of components can be used. For example, titanium oxide, zinc oxide, magnesium oxide, antimony oxide, zirconium oxide, strontium oxide, niobium oxide, boron nitride, barium titanate, zinc sulfide, barium sulfate, magnesium carbonate, inorganic hollow particles, and the like are mentioned. As the inorganic hollow particles, sodium silicate glass, aluminum silicate glass, borosilicate soda glass, white sand, and the like are mentioned, for example. Among the above, titanium oxide or zinc oxide is preferable from the viewpoint of the ease of handling, availability, and cost.

As titanium oxide which is the component (F), various substances can be used and both an anatase type and a rutile type may be used. The rutile type is preferable in terms of the fact that it has no photocatalytic activity and the thermosetting resin composition (X) is likely to become stable. As a method for manufacturing titanium oxide, those manufactured by any method, such as a sulfate method and a chloride method, can be used.

The average particle diameter of the component (F) is not particularly limited and those having various average particle diameters are used. From the viewpoint that the optical reflectance of the cured resin body to be obtained is likely to become high and a tablet of the thermosetting resin composition (X) becomes harder, the average particle diameter is preferably 1 μm or less, more preferably 0.3 μm or less, and still more preferably 0.25 μm or less. The tablet of the thermosetting resin composition (X) is described later. On the other hand, from the viewpoint that the fluidity of the thermosetting resin composition (X) is high, the average particle diameter is preferably 0.05 μm or more and more preferably 0.1 μm or more.

The average particle diameter can be measured using a laser diffraction scattering type particle size distribution meter.

The component (F) may be surface-treated. In the surface treatment of the component (F), the surface of the component (F) is coated with at least one kind selected from inorganic compounds and organic compounds. Mentioned as the inorganic compounds are, for example, an aluminum compound, a silicon compound, a zirconium compound, a tin compound, a titanium compound, an antimony compound, and the like. Mentioned as the organic compounds are polyhydric alcohol, alkanolamine or a derivative thereof, organosilicon compounds such as organosiloxane, higher fatty acid and a metal salt thereof, an organometallic compound, and the like.

The coating of the surface of the component (F) with the inorganic compound or the organic compound can be performed using known methods such as a wet method and a dry method when dry-pulverizing, wet-pulverizing, or slurrying titanium oxide, for example. In addition thereto, various methods, such as a liquid phase method and a gas phase method, are mentioned.

Among the above, it is preferable that the component (F) is treated with organosiloxane from the viewpoint that the optical reflectance of the cured resin body to be obtained is high and the heat resistance and the lightfastness become good. Moreover, by compounding the titanium oxide subjected to the organosiloxane treatment, an excellent light-emitting device in which the light extraction efficiency is high and the light extraction efficiency does not decrease even when used over a long period of time can be obtained.

Herein, various kinds of substances can be used as an organosiloxane treatment agent and, for example, a silane coupling agent, a hexamethyldisiloxane, hexamethyldisilazane, and the like are mentioned. Various silanes can be used as the silane coupling agent. For example, mentioned are polysiloxanes such as polydimethylsiloxane, polymethylphenylsiloxane, polymethylhydrogensiloxane, and copolymers of two or more kinds thereof, cyclosiloxanes such as hexamethylcyclotrisiloxane, heptamethylcyclotetrasiloxane, and 1,3,5,7-tetramethylcyclotetrasiloxane, chlorosilanes such as trimethylchlorosilane, dimethyldichlorosilane, and methyltrichlorosilane, silanes having an epoxy functional group such as 3-glycidoxypropyltrimethoxysilane, 3-glycidoxypropyltriethoxysilane, 2-(3,4-epoxycyclohexyl)ethyltrimethoxysilane, and 2-(3,4-epoxycyclohexyl)ethyltriethoxysilane, silanes having a methacryl group or an acryl group such as 3-methacryloxypropyltrimethoxysilane, 3-methacryloxypropyltriethoxysilane, 3-acryloxypropyltrimethoxysilane, 3-acryloxypropyltriethoxysilane, methacryloxymethyltrimethoxysilane, methacryloxymethyltriethoxysilane, acryloxymethyltrimethoxysilane, and acryloxymethyltriethoxysilane, silanes having a vinyl group such as vinyltrichlorosilane, vinyltrimethoxysilane, vinyltriethoxysilane, vinyltris(β-methoxyethoxy)silane, and vinyltriacetoxysilane, mercaptosilanes such as γ-mercaptopropyltrimethoxysilane and γ-mercaptopropylmethyldimethoxysilane, silanes having an amino group such as γ-aminopropyltriethoxysilane, γ-[bis(β-hydroxyethyl)]aminopropyltriethoxysilane, N-β-(aminoethyl)-γ-aminopropyltrimethoxysilane, γ-(β-aminoethyl)aminopropyldimethoxymethylsilane, N-(trimethoxysilylpropyl)ethylenediamine, N-(dimethoxymethylsilylisopropyl)ethylenediamine, and N-β-N-vinylbenzylaminoethyl)-γ-aminopropyltrimethoxysilane,
silanes having an isocyanate group such as isocyanatepropyltrimethoxysilane and isocyanatepropyltriethoxysilane, silanes having an alkyl group such as methyltrimethoxysilane, methyltriethoxysilane, hexyltrimethoxysilane, hexyltriethoxysilane, octyltrimethoxysilane, and octyltriethoxysilane, and other silanes such as γ-chloropropyltrimethoxysilane and γ-anilinopropyltrimethoxysilane. Among the organosiloxane treatment agents, those not containing a carbon-carbon double bond are preferable. When containing a carbon-carbon double bond, the thermal resistance is likely to decrease. Moreover, surface treatment agents other than the organosiloxanes can be used in combination. As such surface treatment agents, Al, Zr, Zn, and the like are mentioned.

Furthermore, the component (F) may be surface-treated with an inorganic compound. The surface treatment method with an inorganic compound is not particularly limited, and various surface treatments with aluminum compounds, silicon compounds, zirconium compounds, and the like are mentioned. As the surface treatment method, various methods can be applied, and various methods, such as a wet method, a dry method, a liquid phase method, and a gas phase method, can be mentioned as an example. Titanium oxide is surface-treated with an inorganic compound or an organic compound for the purpose of enhancing the durability, increasing the compatibility with solvents, preventing loss of shape in particles, and the like in some cases.

It is considered that due to the fact that the component (F) is surface-treated with an inorganic compound, the compatibility with the components contained in the thermosetting resin composition (X) increases, the dispersibility of the component (F) in the thermosetting resin composition (X) becomes good, and the strength of a cured resin body increases.

The amount of the component (F) is not particularly limited and the amount of the component (F) in the entire thermosetting resin composition (X) is preferably 10% by weight or more, more preferably 15% by weight or more, and still more preferably 20% by weight or more. When the amount is less than 10% by weight, the optical reflectance of the cured resin body to be obtained decreases in some cases.

The total amount of the component (E) and the component (F) is not particularly limited and the total amount of the component (E) and the component (F) in the entire thermosetting resin composition (X) is preferably 85% by weight or more and more preferably 90% by weight or more.

When the total amount of the component (E) and the component (F) is small, an effect of enhancing the strength and the hardness and an effect of reducing the coefficient of linear expansion are difficult to obtain.

With respect to the order of mixing the component (F), various methods can be employed. Preferable aspects are the same as those previously described for the component (E). Moreover, the component (F) and the component (E) may be simultaneously added. As a method for mixing the component (F), the same methods as those for mixing the component (E) can be employed.

The thermosetting resin composition (X) preferably contains a component (G).

The component (G) is a metal soap and it is added for improving the moldability, such as mold releasability, of the thermosetting resin composition (X).

As the component (G), various metal soaps used heretofore are mentioned. The metal soap herein generally refers to one in which a chain fatty acid is bonded to metal ion, and any metal soap can be used insofar as it has a nonpolar or low-polar moiety derived from the fatty acid and a polar moiety derived from the bonding site with the metal in one molecule. Mentioned as the chain fatty acid are saturated fatty acids having 1 to 18 carbon atoms, unsaturated fatty acids having 3 to 18 carbon atoms, aliphatic dicarboxylic acids, and the like. Among the above, saturated fatty acids having 1 to 18 carbon atoms are preferable from the viewpoint of ease of availability and high industrial practicability. Moreover, from the viewpoint of the fact that the mold releasability effect is high, saturated fatty acids having 6 to 18 carbon atoms are more preferable. Mentioned as the metal ion are ions of alkali metal, alkaline earth metal, zinc, cobalt, aluminum, strontium ion, and the like.

Specific examples of the metal soap include lithium stearate, lithium 12-hydroxystearate, lithium laurate, lithium oleate, lithium 2-ethylhexanoate, sodium stearate, sodium 12-hydroxystearate, sodium laurate, sodium oleate, sodium 2-ethylhexanoate, potassium stearate, potassium 12-hydroxystearate, potassium laurate, potassium oleate, potassium 2-ethylhexanoate, magnesium stearate, magnesium 12-hydroxystearate, magnesium laurate, magnesium oleate, magnesium 2-ethylhexanoate, calcium stearate, calcium 12-hydroxystearate, calcium laurate, calcium oleate, calcium 2-ethylhexanoate, barium stearate, barium 12-hydroxystearate, barium laurate, zinc stearate, zinc 12-hydroxystearate, zinc laurate, zinc oleate, zinc 2-ethylhexanoate, lead stearate, lead 12-hydroxystearate, cobalt stearate, aluminum stearate, manganese oleate, barium ricinoleate, and the like. Among these metal soaps, metal stearates are preferable from the viewpoint of ease of availability, high safety, and high industrial practicability. Particularly from the economic viewpoint, one or more selected from the group consisting of calcium stearate, magnesium stearate, and zinc stearate are most preferable.

The addition amount of the metal soap is not particularly limited and is preferably 0.01 part by weight to 5 parts by weight, more preferably 0.025 part by weight to 4 parts by weight, and still more preferably 0.05 part by weight to 4 parts by weight based on 100 parts by weight of the entire thermosetting resin composition (X). When the addition amount is excessively large, the physical properties of the cured resin body to be obtained decrease, while when the addition amount is excessively small, mold releasability is not obtained in some cases.

To the thermosetting resin composition (X), various additives can be added. As the additives, various kinds of additives for use in the cured resin body for surface-mounted light-emitting device can be used and, for example, a curing retardant, an adhesion improvement agent, an antiaging agent, a radical inhibitor, an ultraviolet absorber, a solvent, and additives and a mold release agent for a light-emitting element, and the like are mentioned.

The curing retardant can be used for the purpose of improving the storage stability of the thermosetting resin composition (X) or for the purpose of controlling the reactivity of the hydrosilylation reaction in the manufacturing process. As the curing retardant, compounds containing an aliphatic unsaturated bond, organophosphorus compounds, organosulfur compounds, nitrogen-containing compounds, tin compounds, and organic peroxides, and the like are mentioned.

Mentioned as the compounds containing an aliphatic unsaturated bond are propargyl alcohols such as 3-hydroxy-3-methyl-1-butyne, 3-hydroxy-3-phenyl-1-butyne, and 1-ethynyl-1-cyclohexanol, ene-yne compounds, maleates such as dimethyl maleate, and the like. Mentioned as the organophosphorus compounds are triorganophosphines, diorganophosphines, organophosphones, triorganophosphites, and the like. Mentioned as the organosulfur compounds are organomercaptans, diorganosulfides, hydrogen sulfide, benzothiazole, thiazole, benzothiazole disulfide, and the like. Mentioned as the nitrogen-containing compounds are ammonia, primary, secondary, and tertiary alkylamines, arylamines, urea, hydrazine, and the like. Mentioned as the tin compounds are stannous halide dihydrates, stannous carboxylates, and the like. Mentioned as the organic peroxides are di-tert-butyl peroxide, dicumyl peroxide, benzoyl peroxide, tert-butyl peroxybenzoate, and the like.

Among these curing retardants, benzothiazole, thiazole, dimethyl maleate, 3-hydroxy-3-methyl-1-butyne, and 1-ethynyl-1-cyclohexanol are preferable from the viewpoint of good retardation activity and good availability of the raw materials. These curing retardants can be used singly or in combination of two or more kinds thereof. The addition amount of the curing retardant can be variously set and is preferably $10^{-1}$ mol to $10^3$ mol and more preferably 1 mol to 50 mol per mol of the hydrosilylation catalyst which is the component (C).

Mentioned as the adhesion improving agent are, for example, generally used adhesives, various coupling agents, epoxy compounds, phenol resins, coumarone-indene resins, rosin ester resins, terpene-phenol resins, α-methylstyrene-vinyltoluene copolymers, polyethylmethylstyrene, aromatic polyisocyanates, and the like.

Mentioned as the coupling agents are silane coupling agents, titanate coupling agents, and the like. Examples and preferable examples of the coupling agents are the same as those mentioned above. These coupling agents can be used singly or in combination of two or more kinds thereof. The addition amount of the coupling agent can be variously set and is preferably 0.1 part by weight to 50 parts by weight and more preferably 0.5 part by weight to 25 parts by weight based on 100 parts by weight of the total amount of the component (A) and the component (B). When the addition amount is small, the adhesion improving effect is not demonstrated, while when the addition amount is large, the physical properties of the cured resin body to be obtained are adversely affected in some cases.

Mentioned as the epoxy compounds are novolac phenol epoxy resin, biphenyl epoxy resin, dicyclopentadiene epoxy resin, bisphenol F diglycidyl ether, bisphenol A diglycidyl ether, 2,2'-bis(4-glycidyloxycyclohexyl)propane, 3,4-epoxycyclohexylmethyl-3,4-epoxycyclohexane carboxylate, vinylcyclohexene dioxide, 2-(3,4-epoxycyclohexyl)-5,5-spiro-(3,4-epoxycyclohexane)-1,3-dioxane, bis(3,4-epoxycyclohexyl)adipate, 1,2-cyclopropanedicarboxylic acid bis-glycidyl ester, and triglycidyl isocyanurate, monoallyl diglycidyl isocyanurate, diallyl monoglycidyl isocyanurate, and the like. These epoxy compounds can be used singly or in combination of two or more kinds thereof.

The addition amount of the epoxy compounds is preferably 1 part by weight to 50 parts by weight and more preferably 3 parts by weight to 25 parts by weight based on 100 parts by weight of the total amount of the component (A) and the component (B). When the addition amount is small, the adhesion improving effect is not demonstrated, while when the addition amount is large, the physical properties of the cured resin body are adversely affected in some cases.

In the present invention, a silanol condensation catalyst can also be used in order to enhance the effects of the coupling agent or the epoxy compound. Thus, the enhancement and/or stabilization of the adhesion can be achieved.

Although the silanol condensation catalyst is not particularly limited, at least one selected from boron compounds, aluminum compounds, and titanium compounds is preferable.

Mentioned as the aluminum compounds usable as the silanol condensation catalyst are aluminum alkoxides such as aluminum triisopropoxide, sec-butoxyaluminum diisopropoxide, and aluminum tri-sec-butoxide; aluminum chelates such as ethylacetoacetate aluminum diisopropoxide, aluminum tris(ethylacetoacetate), aluminum chelate M (manufactured by Kawaken Fine Chemicals Co., Ltd., alkylacetoacetate aluminum diisopropoxide), aluminum tris (acetylacetonate), aluminum monoacetylacetonate bis(ethylacetoacetate), and the like. From the viewpoint of handling properties, aluminum chelates are more preferable. Mentioned as the titanium compounds usable as the silanol condensation catalyst are tetraalkoxy titaniums such as tetraisopropoxy titanium and tetrabutoxy titanium; titanium chelates such as titanium tetraacetylacetonate; and general titanate coupling agents having a residue, such as oxyacetate and ethylene glycol.

Mentioned as boron compounds usable as the silanol condensation catalyst are borate esters. As the borate esters, those represented by the following formulae (VII) and V(III) can be suitably used:

$$B(OR^1)_3 \quad (VII)$$

$$B(OCOR^1)_3 \quad (VIII)$$

(In Formulae above, Ills each represent an organic group having 1 to 48 carbon atoms.)

Mentioned as a specific example of the borate esters are tri-2-ethylhexyl borate, normal trioctadecyl borate, trinormal octyl borate, triphenyl borate, trimethylene borate, tris(trimethylsilyl)borate, trinormal butyl borate, tri-sec-butyl borate, tri-tert-butyl borate, triisopropyl borate, trinormal propyl borate, triallyl borate, triethyl borate, trimethyl borate, boron methoxyethoxide, and the like. These borate esters may be used singly or as a mixture of two or more kinds thereof. The mixing may be performed in advance or may be performed upon manufacturing a cured resin body.

Among the borate esters mentioned above, from the viewpoint of ease of availability and high industrial practicability, trimethyl borate, triethyl borate, and trinormal butyl borate are preferable, and in particular, trimethyl borate is more preferable.

From the viewpoint of suppression of volatilization during curing, normal trioctadecyl borate, trinormaloctyl borate, triphenyl borate, trimethylene borate, tris(trimethylsilyl)borate, trinormalbutyl borate, tri-sec-butyl borate, tri-tert-butyl borate, triisopropyl borate, trinormal propyl borate, triallyl borate, and boron methoxyethoxide are preferable, and in particular, normal trioctadecyl borate, tri-tert-butyl borate, triphenyl borate, and trinormalbutyl borate are more preferable.

From the view point of suppressed volatilization and good workability, trinormalbutyl borate, triisopropyl borate, and trinormalpropyl borate are preferable, and particularly trinormalbutyl borate is more preferable. From the viewpoint of less coloring under high temperatures, trimethyl borate and triethyl borate are preferable, and particularly trimethyl borate is more preferable.

The use amount of the silanol condensation catalyst can be variously set and is preferably 0.1 part by weight to 50 parts by weight and more preferably 1 part by weight to 30 parts by weight based on 100 parts by weight of the coupling agent and/or the epoxy compound. When the addition amount is small, the adhesion improving effect is not demonstrated, while when the addition amount is large, the physical properties of the cured resin body are adversely affected in some cases. These silanol condensation catalysts can be used singly or in combination of two or more kinds thereof.

In order to further enhance the adhesion improving effect in the present invention, a silanol source compound can also be used. Thus, the enhancement of adhesion and/or stabilization can be achieved. Mentioned as such a silanol source compound are silanol compounds such as triphenyl silanol and diphenyldihydroxysilane, alkoxysilanes such as diphenyldimethoxysilane, tetramethoxysilane, and methyltrimethoxysilane, and the like. These silanol source compounds can be used singly or in combination of two or more kinds thereof.

The use amount of the silanol source compound can be variously set and is preferably 0.1 part by weight to 50 parts by weight and more preferably 1 part by weight to 30 parts by weight based on 100 parts by weight of the coupling agent and/or the epoxy compound. When the addition amount is small, the adhesion improving effect is not demonstrated, while when the addition amount is large, the physical properties of the cured resin body to be obtained are adversely affected in some cases.

In the present invention, in order to enhance the effects of the coupling agent and the epoxy compound, at least one selected from carboxylic acids and acid anhydrides can be used. Thus, the enhancement of adhesion and/or stabilization can be achieved. Such carboxylic acids and acid anhydrides are not particularly limited. Mentioned are carboxylic acids represented by the following [Chemical Formula 32], 2-ethylhexanoic acid, cyclohexanecarboxylic acid, cyclohexanedicarboxylic acid, methylcyclohexanedicarboxylic acid, tetrahydrophthalic acid, methyltetrahydrophthalic acid, methylhymic acid, norbornenedicarboxylic acid, hydrogenated methylnadic acid, maleic acid, acetylenedicarboxylic acid, lactic acid, malic acid, citric acid, tartaric acid, benzoic acid, hydroxybenzoic acid, cinnamic acid, phthalic acid, trimellitic acid, pyromellitic acid, naphthalenecarboxylic acid, naphthalenedicarboxylic acid, and anhydrides or composite anhydrides thereof. These carboxylic acids and/or acid anhydrides may be used singly or in combination of two or more kinds thereof.

[C. 32]

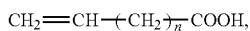

(n represents the number of 0 to 30.)

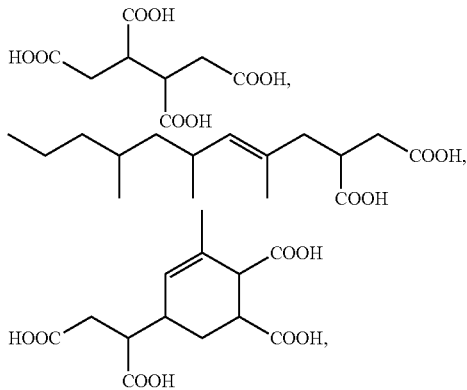

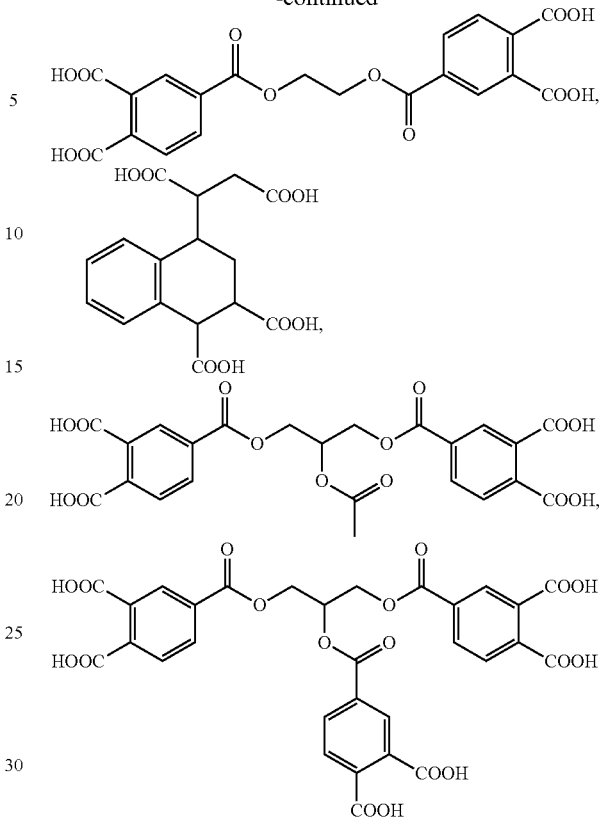

Among these carboxylic acids and acid anhydrides, those containing a carbon-carbon double bond having reactivity with an SiH group are preferable from the viewpoint that they have hydrosilylation reactivity and are less likely to bleed from a cured resin body, so that the physical properties of the cured resin body to be obtained are hard to be impaired. Mentioned as preferable carboxylic acids and/or acid anhydrides are carboxylic acids represented by Formula: $CH_2\!\!=\!\!CH(CH_2)_n COOH$ (In Formula, n represents the number of 0 to 30.), tetrahydrophthalic acid, methyltetrahydrophthalic acid, anhydrides thereof, composite anhydrides thereof, and the like.

The use amount of the carboxylic acids and/or the acid anhydrides can be variously set and is preferably 0.1 part by weight to 50 parts by weight and more preferably 1 part by weight to 10 parts by weight based on 100 parts by weight of the coupling agent and/or the epoxy compound. When the addition amount is small, the adhesion improving effect is not demonstrated, while when the addition amount is large, the physical properties of the cured resin body are adversely affected in some cases.

For the thermosetting resin composition (X) of the present invention, the silane compounds mentioned above can be used. The silane compounds contribute to the enhancement of adhesion to a lead and are effective for preventing invasion of water through the interface between the cured resin body and the lead. A specific example of such silane compounds include dimethyldimethoxysilane, dimethyldiethoxysilane, diphenyldimethoxysilane, diphenyldiethoxysilane, methylphenyldimethoxysilane, methylphenyldiethoxysilane, and the like. Among the above, dimethyldimethoxysilane is particularly preferable.

Mentioned as the antiaging agent are, in addition to generally used antiaging agents such as hindered phenol antiaging agents, citric acid, phosphoric acid, sulfur antiaging agents, and the like.

As the hindered phenol antiaging agents, Irganox 1010 available from Ciba Specialty Chemicals, and other various agents are used.

Mentioned as the sulfur antiaging agents are mercaptans, mercaptan salts, sulfides including sulfide carboxylic acid esters and hindered phenol sulfides, polysulfides, dithiocarboxylic acid salts, thioureas, thiophosphates, sulfonium compounds, thioaldehydes, thioketones, mercaptals, mercaptols, monothio acids, polythio acids, thioamides, sulfoxides, and the like.

These antiaging agents can be used singly or in combination of two or more kinds thereof.

Mentioned as the radical inhibitor are, for example, phenolic radical inhibitors such as 2,6-di-tert-butyl-3-methylphenol (BHT), 2,2'-methylene-bis(4-methyl-6-tert-butylphenol), and tetrakis(methylene-3-(3,5-di-tert-butyl-4-hydroxyphenyl)propionate)methane, aminic radical inhibitors such as phenyl-β-naphthylamine, α-naphthylamine, N,N'-di-sec-butyl-p-phenylenediamine, phenothiazine, and N,N'-diphenyl-p-phenylenediamine, and the like. These radical inhibitors can be used singly or in combination of two or more kinds thereof.

Mentioned as the ultraviolet absorber are, for example, 2(2'-hydroxy-3',5'-di-tert-butylphenyl)benzotriazole, bis(2,2,6,6-tetramethyl-4-piperidine)sebacate, and the like. These ultraviolet absorbers can be used singly or in combination of two or more kinds thereof.

The thermosetting resin composition (X) can be dissolved in a solvent for use. Usable solvents are not particularly limited, and specifically hydrocarbon solvents such as benzene, toluene, hexane, and heptane, ether solvents such as tetrahydrofuran, 1,4-dioxane, 1,3-dioxolane, and diethyl ether, ketone solvents such as acetone, methyl ethyl ketone, and methyl isobutyl ketone, and halogen solvents such as chloroform, methylene chloride, and 1,2-dichloroethane can be suitably used. Among the above, toluene, tetrahydrofuran, 1,3-dioxolane, and chloroform are preferable. These solvents can be used singly or as a mixture of two or more kinds thereof.

The use amount of the solvent can be set as appropriate and is preferably 0.1 mL to 10 mL per g of the thermosetting resin composition (X) to be used. When the amount is small, the effects obtained by using the solvent, such as reduction in viscosity, are difficult to obtain, while when the amount is large, problems, such as thermal cracking due to the solvent remaining in the materials, tend to occur. Moreover, such a large amount is disadvantageous in cost, so that the industrial utility value is lowered.

Additives for a light-emitting element are used for improving various properties of a light-emitting element, for example. Mentioned as the additives are phosphors which absorb light from a light-emitting element to emit long-wavelength fluorescent light, such as cerium-doped yttrium-aluminum-garnet phosphors, colorants which absorb specific wavelengths, such as bluing agents, diffusing materials for diffusing light such as titanium oxide, aluminum oxide, melamine resin, CTU guanamine resin, and benzoguanamine resin, heat conductive fillers including metal oxides such as aluminosilicate, and metal nitrides such as aluminum nitride and boron nitride, and the like. These additives can be used singly or in combination of two or more kinds thereof. The additives may be contained uniformly or with a concentration gradient.

Mold release agents are used in order to improve the mold releasability of the thermosetting resin composition (X) during molding. Mentioned as the mold release agents are the component (G) described above, waxes, and the like. Mentioned as the waxes are natural waxes, synthetic waxes, oxidized or nonoxidized polyolefins, polyethylene waxes, and the like. It is better not to use the mold release agent in the case where sufficient mold releasability is obtained without addition of the mold release agent.

To the thermosetting resin composition (X), other additives, such as colorants, flame retardants, flame retardant promoters, surfactants, antifoaming agents, emulsifiers, leveling agents, cissing inhibitors, ion trapping agents such as antimony-bismuth, thixotropy imparting agents, tackifiers, storage stability improvers, antiozonants, photostabilizers, thickeners, plasticizers, reactive diluents, antioxidants, thermal stabilizers, electrical conductivity-imparting agents, antistatic agents, radiation blockers, nucleating agents, phosphorus-based peroxide decomposers, lubricants, pigments, metal deactivators, thermal conductivity-imparting agents, and property modifiers, can be added insofar as the objects and effects of the present invention are not impaired.

Furthermore, various thermoplastic resins can be added to the thermosetting resin composition (X) for the purpose of improving the properties and the like. Various substances can be used as the thermoplastic resins, and examples thereof include, but not limited to, acrylic resins typified by polymethyl methacrylate resins (for example, Optorez manufactured by Hitachi Chemical Co., Ltd.), such as homopolymers of methyl methacrylate, and random, block, or graft polymers of methyl methacrylate and other monomers, and polybutyl acrylate resins such as homopolymers of butyl acrylate, and random, block, or graft copolymers of butyl acrylate and other monomers; polycarbonate resins (for example, APEC manufactured by Teijin) such as polycarbonate resins containing bisphenol A 3,3,5-trimethylcyclohexylidene bisphenol and the like as a monomer structure; cycloolefin resins (for example, APEL manufactured by Mitsui Chemicals, ZEONOR and ZEONEX manufactured by Zeon Corporation, and ARTON manufactured by JSR Corporation) such as homopolymer or copolymer resins of norbornene derivatives, vinylmonomers, and the like, resins obtained by ring-opening metathesis polymerization of norbornene derivatives, and hydrogenation products thereof; olefin-maleimide resins (for example, TI-PAS manufactured by Tosoh Corporation) such as copolymers of ethylene and maleimide; polyester resins (for example, O-PET manufactured by Kanebo) such as polyesters obtained by polycondensation of bisphenols such as bisphenol A and bis(4-(2-hydroxyethoxy)phenyl)fluorine, or diols such as diethylene glycol, with phthalic acids such as terephthalic acid and isophthalic acid, or aliphatic dicarboxylic acids; polyethersulfone resins; polyarylate resins; polyvinyl acetal resins; polyethylene resins; polypropylene resins; polystyrene resins; polyamide resins; silicone resins; fluorine resins, and the like as well as rubbery resins, such as natural rubber and EPDM.

The thermoplastic resin may contain a carbon-carbon double bond having reactivity with an SiH group and/or an SiH group in the molecules. From the viewpoint that the cured resin body to be obtained is likely to have higher toughness, the thermoplastic resin preferably contains one or more carbon-carbon double bonds having reactivity with an SiH group and/or SiH groups in one molecule on average.

The thermoplastic resin may contain other crosslinkable groups. Mentioned as the crosslinkable groups are an epoxy group, an amino group, a radical-polymerizable unsaturated group, a carboxyl group, an isocyanate group, a hydroxyl group, and an alkoxysilyl group. From the viewpoint that the cured resin body to be obtained is likely to have higher thermal resistance, the thermoplastic resin preferably contains one or more crosslinkable groups in one molecule on average.

Although the molecular weight of the thermoplastic resin is not particularly limited, the number average molecular weight of the thermoplastic resin is preferably 10,000 or less and more preferably 5000 or less from the viewpoint that the compatibility with the component (A) and the component (B) is likely to be good. Meanwhile, the number average molecular weight of the thermoplastic resin is preferably 10,000 or more and more preferably 100,000 or more from the viewpoint that the cured resin body to be obtained is likely to have higher toughness. The molecular weight distribution is also not particularly limited, and is preferably 3 or less, more preferably 2 or less, and still more preferably 1.5 or less from the viewpoint that the viscosity of the thermosetting resin composition (X) is likely to be low and the moldability is likely to be good.

The use amount of the thermoplastic resin is not particularly limited and is preferably 5% by weight to 50% by weight and more preferably 10% by weight to 30% by weight based on the entire thermosetting resin composition (X). When the addition amount is small, the cured resin body to be obtained is likely to be brittle, while when the addition amount is large, the thermal resistance (elastic modulus at a high temperature) is likely to be low.

The thermoplastic resin can be used singly or in combination of two or more kinds thereof.

The thermoplastic resin may, for example, be uniformly dissolved in the component (A) and/or the component (B) and then mixed, be crushed into particles and then mixed, or be dissolved in a solvent and then mixed for dispersion. From the viewpoint that a cured resin body to be obtained is likely to have higher transparency, the thermoplastic resin is preferably uniformly dissolved in the component (A) and/or the component (B) and then mixed. Also in this case, the thermoplastic resin may be directly dissolved in the component (A) and/or the component (B). Alternatively, the thermoplastic resin may be uniformly mixed using a solvent or the like, and the solvent may then be removed so as to give a uniform dispersion and/or mixture.

In the case of dispersing the thermoplastic resin for use, the average particle size can be variously set and is preferably 10 nm to 10 μm. The thermoplastic resin may have a particle size distribution and may either be monodispersed or have a plurality of peak particle sizes. From the viewpoint that the viscosity of the thermosetting resin composition (X) is likely to be low and the moldability is likely to be good, the coefficient of variation of the particle size is preferably 10% or less.

Furthermore, particles of other thermosetting resins may be mixed with the thermosetting resin composition (X). The thermosetting resin particles can be obtained by curing the thermosetting resin, and then crushing the same. In the case of dispersing the thermoplastic resin particles in the thermoplastic resin composition (X) for use, the average particle size can be variously set and is preferably 10 nm to 10 μm. The thermoplastic resin may have a particle size distribution and may either be monodispersed or have a plurality of peak particle sizes. From the viewpoint that the viscosity of the thermosetting resin composition (X) is likely to be low and the moldability is likely to be good, the coefficient of variation of the particle size is preferably 10% or less.

The thermosetting resin composition (X) can be prepared by mixing the essential components (A) to (E), (F) to (G), and other arbitrary components described above according to the above-described method, for example. The thermosetting resin composition (X) thus obtained can be used as a liquid substance or a paste substance as it is. Furthermore, the thermosetting resin composition (X) may be used after partially reacted (B-staged) by heating or the like after mixing the components, additives, and the like. The B-staging enables viscosity adjustment and adjustment of the moldability during transfer molding. Moreover, the B-staging has an effect of further suppressing shrinkage on curing.

From the viewpoint that the moldability during transfer molding or the like is good, the thermosetting resin composition (X) preferably has fluidity at a temperature of 150° C. or less.

The curability of the thermosetting resin composition (X) can be appropriately set. From the viewpoint that the molding cycle can be shortened, the gelation time at 120° C. is preferably 120 seconds or shorter and more preferably 60 seconds or shorter. The gelation time at 150° C. is preferably 60 seconds or shorter and more preferably 30 seconds or shorter. The gelation time at 100° C. is preferably 180 seconds or shorter and more preferably 120 seconds or shorter.

The gelation time in this case can be measured as follows. A 50 μm thick aluminum foil is placed on an electric hot plate set to a predetermined temperature, and then 100 mg of the thermosetting resin composition (X) is placed on the foil. Then, the time thereafter until the thermosetting resin composition (X) is gelated is measured and determined as the gelation time.

In the process of manufacturing a molded resin body using the thermosetting resin composition (X), from the viewpoint that processing problems due to the formation of voids in the thermosetting resin composition (X) and outgas from the thermosetting resin composition (X) are hard to occur, the weight loss during curing is preferably 5% by weight or less, more preferably 3% by weight or less, and still more preferably 1% by weight or less. The weight loss during curing can determined as follows. 10 mg of a sample (thermosetting resin composition (X)) is heated from room temperature to 150° C. at a temperature elevation rate of 10° C. /min using a thermogravimetric analyzer, and then the ratio of the weight lost to the initial weight is defined as the weight loss.

From the viewpoint that the thermosetting resin composition (X) is hard to cause a problem of silicone contamination when used for electronic materials, the content of an Si atom in a volatile component is preferably 1% or less.

It is desirable for the thermosetting resin composition (X) to contain an N element due to the following reason. Electrical and electronic components are generally demanded to have flame retardancy and halogen flame retardants have been mainly used heretofore but, for reducing the environmental load, a shift to non-halogen flame retardants occurs. Moreover, flame retardants considering the environment have been desired also from the regulation of the electrical industries, such as compliance with RoHS (Restriction of Hazardous Substances).

For example, the non-halogen flame retardant containing phosphinic acid metal salt and an organic phosphorus flame retardant described in JP-A No. 2010-77333, a non-halogen flame retardant containing at least one kind of nitrogen containing flame retardant selected from the group consisting of triazine, guanidine, cyanurate, and isocyanurate, phosphinic acid salt or diphosphinic acid salt and/or a polymer thereof, and a charring polymer described in JP-T (Translation of PCT Application) No. 2007-514828, a non-halogen flame retardant containing an amine salt generated by a reaction of an amine compound containing at least one nitrogen atom and at least one kind of acid selected from phosphoric acid, pyrophoric acid, condensed phosphoric acid, and cyanuric acid and a reactant of tris(2-hydroxyethyl)isocyanurate and an isocyanate compound described in JP-A No. 2002-128969, a triazine nitrogen containing compound obtained by an addition reaction of tris(2-hydroxyalkyl)isocyanurate and an organic diisocyanate compound described in JP-A No. 2002-60385, or the like is one of promising non-halogen flame retardants. Therefore, also in the molded resin body of the present invention, it is particularly preferable to contain a nitrogen atom in a resin component. In particular, a skeleton in which an isocyanurate skeleton which is a main skeleton as a nitrogen flame retardant is included is particularly preferable.

Nitrogen containing organic compounds, such as tributyl amine, tetramethylethylene diamine, benzotriazole, benzothiazole, and thiazole, described in JP-A Nos. H05-148423, 2004-67948, 2009-117809, and 2010-77333, and the like act also as a reaction retardant in a hydrosilylation curing reaction. Therefore, by adding these nitrogen compounds to the thermosetting resin composition which gives a molded resin body, sufficient storage stability can be given to the thermosetting resin and also the thermosetting resin composition can be completely cured. Also from such a viewpoint, it is preferable for the resin component to contain a nitrogen atom. Moreover, separately from the resin skeleton, nitrogen containing organic compounds which are known reaction control agents of a hydrosilylation reaction, such as tributyl amine, tetramethylethylene diamine, and benzotriazole, may be coexist.

A method for determining the N content in the thermosetting resin composition is not particularly limited. The N atom contained in the resin skeleton or the N atom of the nitrogen containing organic compound can be detected by the measurement by $^{14}$N-NMR or $^{14}$N-solid NMR. The N content in the thermosetting resin composition is not particularly limited and is preferably 1000 ppm or more. No problems arise when containing nitrogen containing inorganic fillers, such as boron nitride and aluminum nitride, as a filler component and both the flame retardant effect obtained due to the fact that the organic component itself contains an N atom and the flame retardant effect obtained due to the fact that the inorganic filler contains an N atom may be brought out.

From the viewpoint that the thermal resistance is good, the Tg of a cured resin body to be obtained by curing the thermosetting resin composition (X) is preferably 100° C. or higher and more preferably 150° C. or higher. The Tg is determined as follows. A dynamic viscoelasticity measurement is performed using a dynamic viscoelasticity meter (DVA-200 manufactured by IT Keisoku Seigyo) at a 3 mm×5 mm×30 mm prism shaped sample under the predetermined measurement conditions (Tensile mode; Measurement frequency of 10 Hz, Strain of 0.1%, Static/dynamic load ratio of 1.5, and Temperature elevation rate of 5° C./min), and then the tan δ peak temperature in the measurement result is defined as Tg.

From the viewpoint that problems, such as ion migration, are hard to occur in a lead frame or the like and the reliability becomes high, the content of ions extracted from a cured resin body is preferably less than 10 ppm, more preferably less than 5 ppm, and still more preferably less than 1 ppm.

In this case, the content of extracted ions is determined in the following manner. 1 g of cut pieces of a cured resin body is put together with 50 mL of ultrapure water into a Teflon (Registered trademark) container, and the container is then sealed and treated at 121° C. and 2 atm for 20 hours. The obtained extract is analyzed by ICP mass spectrometer (Product name: HP-4500, manufactured by Yokogawa Analytical Systems), and the obtained values of the contents of Na and K are converted into concentrations in the cured resin body as a sample. Meanwhile, the same extract is analyzed by ion chromatography (using DX-500 manufactured by Dionex; Column: AS12-SC), and the obtained values of the contents of Cl and Br are converted into concentrations in the cured resin body as a sample. The contents of Na, K, Cl and Br in the cured resin body thus obtained are summed to be defined as the content of extracted ions.

The coefficient of linear expansion of the cured resin body is not particularly limited and, in terms of the fact that the adhesion with a lead frame containing metal and the like is likely to be good, the average coefficient of linear expansion between 23° C. and 150° C. is preferably 30 ppm or less, more preferably 20 ppm or less, and still more preferably 10 ppm or less.

In the thermosetting resin composition (X), it is desirable that the optical reflectance (In this specification, a reflectance at a specific wavelength is referred to as an optical reflectance) at each of 420 nm, 440 nm, and 460 nm after curing is 80R % or more and that the optical reflectance retention rate (Optical reflectance after thermal resistance test/Initial optical reflectance×100) is 90% or more after a thermal resistance test at a temperature of 180° C.×72 hours. From the viewpoint that the light extraction efficiency of a light-emitting element is likely to become high, the optical reflectance is preferably 75% or more and more preferably 80% or more in a wavelength band of 420 to 700 nm.

The optical reflectance of the cured resin body is the reflectance at each wavelength measured at wavelengths of 400 nm to 700 nm (20 nm interval) using a micro spectrocolorimeter (Product name: VSS400 produced by Nippon Denshoku Industries Co., Ltd). For example, the reflectance at a wavelength of 460 nm is defined as an optical reflectance at 460 nm and the reflectance at a wavelength of 500 nm is defined as an optical reflectance at 500 nm. Herein, as the measurement value (reflectance) at each wavelength, an average of measurement values at arbitrary four points (measurement area: 0.1 mmϕ) on the opening surface of the concave portion of a molded resin body is employed.

The retention rate of an optical reflectance after a thermal resistance test (for example, test with heating in a 180° C. oven for 72 hours) to the initial optical reflectance is determined according to the following equation:

Retention rate (%)=[(Optical reflectance after thermal resistance test)/(Initial optical reflectance)]×100.

From the viewpoint that the reliability in use for electronic materials is high, the retention rate is preferably 80% or more, more preferably 85% or more, and still more preferably 90% or more.

The surface of a molded body obtained by curing the thermosetting resin composition (X) has an optical reflectance at a wavelength of 460 nm of preferably 90% or more, more preferably 95% or more, still more preferably 97% or more, and particularly preferably 99% or more.

The thermosetting resin composition (X) can be formed into a tablet when containing at least the component (F) in addition to the components (A) to (E). The tablet used herein refers to a solid which maintains a given shape at room temperature, do not substantially change in shape with time, and do not adhere to or integrate one another when brought into contact with each another. The shape of the tablet is not particularly limited and includes shapes such as a cylindrical shape, a prism shape, a disk shape, and a spherical shape and is preferably a cylindrical shape generally used for transfer molding.

Specifically, the tablet has a feature of containing the components (A) and (B), at least one of which is liquid having a viscosity at a temperature of 23° C. of 50 Pa·s or less, the component (C) for curing the components (A) and (B), the components (E) and (F), which are both powder, as well as the component (D). With respect to such a tablet, the entire thermosetting resin composition (X) becomes flowable due to the fact that the viscosities of the components (A) and (B) decrease at a high temperature. When heating is further continued, a curing reaction proceeds to allow molding into a desired shape.

The molding method is not particularly limited, and molding methods generally used for molding the thermosetting resin composition, such as transfer molding and compression molding, can be used. In the case of using the molding methods, when the thermosetting resin composition as a raw material is in the form of paste or clay, a given shape cannot be maintained so that mutual adhesion, integration, or deformation occurs. Thus, it is very difficult to measure, transfer, and supply the same to a molding machine. In contrast, when the thermosetting resin composition is in a tablet shape, it can be easily measured, transferred, and supplied to a molding machine and also allows automation, which significantly increases productivity.

The total ratio (hereinafter, also referred to as a "filling proportion") of the component (E) and the component (F) in the tablet is preferably 70% to 95% by weight. The ratio of the component (E) and the component (F) in the filling proportion is not particularly limited and can be freely set. When the filling proportion is less than 70% by weight, the following problems occur: the coefficient of thermal expansion of a cured resin body to be obtained becomes high, leading to changes in the size of the molded resin body and the thermosetting resin composition (X) to be obtained is in the form of hard paste or clay so that it cannot be formed into a tablet. When the filling proportion exceeds 95% by weight, the viscosity at a high temperature of the thermosetting resin composition (X) becomes excessively high, so that the moldability decreases or a tablet to be obtained becomes excessively brittle.

In the thermosetting resin composition (X), when at least one of the component (A) and the component (B) is liquid at normal temperature, the thermosetting resin composition (X) is likely to be in the form of paste or clay when the filling proportion is low. In this case, although the thermosetting resin composition (X) cannot be formed into a tablet, it is likely to have better moldability at a high temperature. In contrast, when the filling proportion is high, the thermosetting resin composition (X) is likely to be in the form of flake or powder due to a low amount of flowing components. These shapes can be pressed into a tablet by compression but they tend to have poor fluidity at a high temperature, leading to lower moldability. Heretofore, it has been difficult to achieve both formability into tablets and moldability by simply increasing the filling proportion.

However, the present inventors have found that it is possible for the thermosetting resin composition (X) to achieve both formability into a tablet and moldability when setting the proportion of particles having a size of 12 μm or less to 40% by volume or more of the total powder of the component (E) and the component (F).

The reason is presumably thought as follows. In a mixed system of liquids and particles, the liquid components are supposed to cover the surface of the particles, and excess liquid components remaining after covering all the particles are considered to contribute to deformation. Therefore, it is considered that even when the filling proportion is the same, the larger the proportion of small particles, the greater the total surface area, and then the amount of the liquid components consumed for covering increases, so that the deformation is hard to occur. It is considered that since the viscosity of liquid noticeably decreases at a high temperature, changes in fluidity at a high temperature to the proportion of small particles are small. On the other hand, since the viscosity is high at a low temperature, when the amount of small particles is large, it cannot flow like a paste or clay shape, and therefore it has a flake or powder shape.

In other words, by increasing the proportion of small particles in particles, it is possible to harden the thermosetting resin composition at normal temperature while maintaining the fluidity of the thermosetting resin composition at a high temperature. This finding is not obvious from the documents (JP-A Nos. 2008-112977 and 2009-155415) in which epoxy resin or silicone resin which are solid at normal temperature is used or from Patent Document 3 which does not refer to the particle size distribution but only describes the average particle size.

[Method for Manufacturing Molded Resin Body]

The molded resin body of the present invention can be manufactured by a manufacturing method including, for example, a process (1) of holding and fixing a plurality of leads by a mold, a process (2) of injecting a liquid thermosetting resin into the mold, a process (3) of curing the liquid thermosetting resin injected into the mold, and a process (4) of releasing a molded resin body from the mold. As the mold, the same one as a former transfer molding mold can be used, except that the mold has an upper mold and a lower mold and the surface corresponding to the opening surface of the concave portion of the molded resin body in the upper mold has a predetermined ten-point average roughness (Rz). Hereinafter, the processes (1) to (4) are described in detail.

In the process (1), using a mold having the upper mold having an upper mating surface in which an upper concave portion is formed at a predetermined position, the lower mold having a flat lower mating surface, and a resin injection hole, a plurality of leads are held and fixed by the upper mating surface and the lower mating surface.

More specifically, the process (1) is carried out as illustrated in FIG. 10. FIG. 10 illustrate cross sectional views schematically illustrating the process (1) in one embodiment of the manufacturing method for the molded resin body according to the present invention. In FIG. 10, a direction extending in the horizontal direction is defined as a longitudinal direction and a direction perpendicular to the longitudinal direction in the plane of a lower mating surface 36 of a mold 20 is defined as a width direction. The same applies also to FIG. 11 to FIG. 13.

The mold 20 illustrated in FIG. 10(a) has an upper mold 30 having an upper mating surface 31, a lower mold 35 having a lower mating surface 36, a resin injection hole, a plunger 41 provided in the lower mold 35 in such a manner as to communicate with the resin injection hole, a mold heating device which is not illustrated, and a vacuum pump which is not illustrated. The resin injection hole is formed by a second convex portion 34 formed on the surface of the upper mating surface 31 and the lower mating surface 36 when the upper mating surface 31 and the lower mating surface 36 are superposed with each other and is illustrated as a resin injection hole 40 in FIG. 11, for example. The second convex portion 34 is described later.

The upper mold 30 and the lower mold 35 are disposed in such a manner that the upper mating surface 31 and the lower mating surface 36 are disposed in parallel to each other.

The upper mold 30 is disposed above in the perpendicular direction of the lower mold 35 and is supported by a drive unit which is not illustrated in such a manner as to be movable up and down. On the upper mating surface 31 of the upper mold 30, a plurality of first convex portions 32 are formed at predetermined positions. In the upper mating surface 31 of the upper mold 30, a plurality of upper concave portions 33 having the first convex portions 32 are formed. It is preferable that the first convex portions 32 are formed at almost equal intervals with a predetermined space in the longitudinal direction and in the transverse direction.

Then, internal spaces which are adjacent to each other and communicate with each other are formed by three continuously adjacent first convex portions 32. The internal spaces correspond to the three dimensional shape of the cured resin body to be obtained. Among the three continuously adjacent first convex portions 32, the tip surface of the first convex portion 32 at the middle is positioned in such a manner as to contact an inner lead portion of a first lead 23 and an inner lead portion of a second lead 24 in a frame unit 22 (FIG. 14) constituting a lead frame 21 described later. Into such a contact portion, the liquid thermosetting resin does not flow.

The ten-point average roughness (Rz) of the bottom surface 33a of the upper concave portion 33 is 0.5 µM or more and 15 µm or less. By the use of the mold having the bottom surface 33a having such Rz, a molded resin body in which the Rz of the opening surface of the concave portion is 1 to 10 µm can be obtained. When the Rz exceeds 15 µm, cohesive failure is likely to occur due to the anchor effect. When the balance of the mold releasability of the cured resin body and the influence on the optical reflectance of the molded resin body is taken into consideration, the range of the ten-point average roughness (Rz) of the bottom surface 33a is preferably 0.5 µm or more and 12 µm or less, more preferably 0.5 µm or more and 11 µm or less, and still more preferably 0.9 µm or more and 10.6 µm or less. When the internal space of the upper concave portion 33 is filled with the liquid thermosetting resin, and then cured by heating, an aggregate of the molded resin bodies in which a through-hole opens in the center and the three dimensional shape of the internal space of the concave portion is a reverse truncated cone shape is obtained. As a method for adjusting the Rz of the bottom surface 33a of the upper concave portion 33 to the range mentioned above, an electrical discharge processing method described in Japanese Patent No. 3907948, and the like is mentioned, for example. More specifically, according to the electrical discharge processing method, a green compact formed electrode obtained by filling a female mold of a mold to be subjected to electric discharge surface treatment with a material powder such as metallic powder and metallic compound powder, and then pressurizing and molding the material powder in the female mold using a male mold of the mold is used to generate pulse-like electric discharge between the green compact formed electrode and the female mold or the male mold of the mold to thereby deposit an electrode material by the electric discharge energy or a substance generated by a reaction of the electrode material caused by the electric discharge energy on the mold surface of the female mold or the male mold, thereby performing the electric discharge surface treatment of the mold surface of the mold.

Furthermore, as illustrated in FIG. 11, when the upper mating surface 31 and the lower mating surface 36 are superposed with each other, a second convex portion 34 having a cross-sectional shape of almost a right triangle is formed on the upper mating surface 31 near a plunger pot 44 provided in the lower mating surface 36. The second convex portion 34 extends in the width direction of the upper mold 30 in the upper mating surface 31, the height thereof becomes continuously larger as the second convex portion 34 is closer to the first convex portion 32, and the height is slightly smaller than the height of the first convex portion 32 at the position closest to the first convex portion 32. Thus, when the upper mating surface 31 and the lower mating surface 36 are superposed with each other, a runner 42 which communicates with the plunger pot 44 and through which a molten liquid of the thermosetting resin flows down and a resin injection hole 40 which is continuous to the runner 42 are formed by the second convex portion 34 and the lower mating surface 36.

The resin injection hole 40 is formed in such a manner that the diameter becomes small from the entrance toward the exit of the liquid thermosetting resin. It is preferable for the resin injection hole 40 to have a cross-sectional shape of a semi-circle shape from the viewpoint of facilitating the injection of the mold 20 of the liquid thermosetting resin into the internal space. In this embodiment, the runner 42 is configured so that the diameter becomes continuously small from the vicinity of the plunger 41 towards the resin injection hole 40. However, the invention is not limited thereto, and a runner (not illustrated) having a fixed width may be provided by taking a configuration in which the undersurface of the second convex portion 34 in the upper mating surface 31 is parallel to the lower mating surface 36, for example.

The lower mold 35 is fixed by a support unit which is not illustrated. The lower mold 35 has a flat lower mating surface 36. Moreover, a through-hole 43 in the thickness direction is formed in the lower mold 35 and the plunger 41 is disposed in the through-hole 43 in such a manner as to be movable up and down by the drive unit which is not illustrated. The plunger 41 may have a heating unit thereinside. By lowering the plunger 41, the plunger pot 44 is formed. The plunger pot 44 is filled with a thermosetting resin tablet which forms a liquid thermosetting resin by heating or a liquid thermosetting resin. The liquid thermosetting resin in the plunger pot 44 is injected under pressure into the upper concave portion 33 from the resin injection hole 40 through the runner 42 by elevating the plunger 41.

In FIG. 10(b), a lead frame 21 having a plane shape of a rectangle is placed on the lower mating surface 36 of the lower mold 35. FIG. 14 is a plan view of the frame units 22 constituting the lead frame 21.

In the lead frame 21, a plurality of the frame units 22 illustrated in FIG. 14 are disposed in parallel in the width direction and in the longitudinal direction and are integrated. In one frame unit 22, a first lead 23 and a second lead 24 are disposed in such a manner as to be separated from each other. By the use of the lead frame 21 in which the plurality of frame units 22 are disposed in the width direction and in the longitudinal direction, a plurality of molded resin bodies can be produced at once, and therefore the mass production properties of the molded resin body improve. The material of the lead frame 21 is not particularly limited and is preferably a metal material such as copper. For the surface of the substrate containing a ceramics material or a plastic material, a lead frame on which the first lead 23 and the second lead 24 are printed can be used.

In the surface of the lead frame 21, notched portions (not illustrated) are formed in length and width directions along the boundary of the frame units 22. The notched portion is held by a flat region in which the first convex portion 32 and the second convex portion 34 in the upper mating surface 31 are not formed and the lower mating surface 36. Or, the notched portion may be positioned in such a manner as to be held by the tip surface of the first convex portion 32 of the upper mating surface 31 and the lower mating surface 36. Thus, flapping of the lead frame 21 due to the notched portion is suppressed, and the formation of a resin burr can be reduced. In the process (2) described later, the notched portion is filled with a liquid thermosetting resin. Furthermore, in the process (3) described later, the liquid thermosetting resin charged into the notched portion is cured by heating to form a part of a cured resin body.

Thus, the contact surface area of the lead frame 21 and the cured resin body 12 increases, so that the adhesion thereof improves. In the case where the cured resin body is integrally molded with the surface of each frame unit 22 to produce an aggregate of the plurality of molded resin bodies, when cut along the notched portion, the thickness of the metal to be cut becomes smaller. As a result, the molded resin bodies are easily separated one by one, so that the mass production properties further improve.

Furthermore, a metal layer, such as a plating layer, may be formed on at least one surface in the thickness direction of the lead frame 21. As the material of the metal layer, gold, silver, copper, aluminum, and the like are mentioned, for example. Thus, a complicated operation of plating the lead of the individualized molded resin bodies can be omitted.

The lead frame 21 is placed on the lower mating surface 36 in such a manner that the upper concave portion 33 and the frame unit 22 are superposed with each other at a predetermined position when the upper mating surface 31 and the lower mating surface 36 are superposed with each other.

In FIG. 10(c), by filling the plunger pot 44 with a thermosetting resin tablet 45, and then lowering the upper mold 30 in the perpendicular direction, the upper mating surface 31 and the lower mating surface 36 hold and fix the lead frame 21. Then, the process proceeds to the process (2).

In the process (2), a liquid thermosetting resin is injected into the internal space for molding in the mold 20 from the resin injection hole 40. Herein, the internal space for molding is formed by the upper concave portion 33 and the lead frame 21 or the upper concave portion 33 and the lower mating surface 36.

More specifically, the process (2) is carried out as illustrated in FIG. 11. FIG. 11 illustrate cross sectional views schematically illustrating the process (2) in one embodiment of the manufacturing method for the molded resin body according to the present invention. In FIG. 11(a), by holding the lead frame 21 by the upper mating surface 31 and the lower mating surface 36 in the process (1) above, the internal space for molding is formed in the mold 20 by the upper concave portion 33 and the lead frame 21 and the upper concave portion 33 and the lower mating surface 36. Then, the thermosetting resin tablet 45 charged into the plunger 41 and the plunger pot 44 is elevated.

In FIG. 11(b), the liquid thermosetting resin 45 obtained by heating the thermosetting resin tablet 45 by the plunger 41 is charged into the internal space for molding through the resin injection hole 40 from the runner 42 by further elevation of the plunger 41 and reducing the pressure in the internal space for molding in the mold 20 with a vacuum pump (not illustrated). The internal space between the first lead 23 and the second lead 24 in the frame unit 22 is also filled with the liquid thermosetting resin. Then, the process proceeds to the process (3).

In the process (3), by heating the mold in which the plurality of internal spaces are filled with the liquid thermosetting resin at a predetermined temperature, the liquid thermosetting resin is cured to produce an aggregate of the molded resin bodies in which the cured resin body is integrally molded at a predetermined position of the lead frame.

More specifically, the process (3) is carried out as illustrated in FIG. 12. FIG. 12 is a cross sectional view schematically illustrating the process (3) in one embodiment of the manufacturing method for the molded resin body according to the present invention. Herein, the internal spaces for molding in the mold 20 are filled with the liquid thermosetting resin. In this state, the mold 20 is heated by a heating unit provided in the mold 20. The heating temperature and the heating time are selected as appropriate according to the curing temperature of the thermosetting resin charged into the internal spaces. Thus, an aggregate 25 of the molded resin bodies in which the cured resin body 12 is integrally molded with the surface of each frame unit 22 constituting the lead frame 21 is obtained. The Rz of the bottom surface 33a is transferred to the surface (opening surface of the concave portion 13) contacting the bottom surface 33a of the upper concave portion 33 of the cured resin body 12, so that the Rz is set to 1 to 10 μm. Then, the process proceeds to the process (4).

In the process (4), the lead frame 25 with the cured resin body is released from the mold. More specifically, the process (4) is carried out as illustrated in FIG. 13. FIG. 13 illustrate cross sectional views schematically illustrating the process (4) in one embodiment of the manufacturing method for the molded resin body according to the present invention. In the process (4) illustrated in FIG. 13, by elevating the upper mold 30 and releasing the lead frame with the cured resin body 25 from the mold 20, the cured resin body 12 is integrally molded with one surface of the lead frame 21, and then the lead frame with the cured resin body 25 which is an aggregate of the molded resin bodies is released from the mold 20. The lead frame with the cured resin body 25 which is an aggregate of the molded resin bodies has desirably the following dimension range: Length of 40 to 55 mm, Width of 40 to 50 mm, Thickness of the lead frame portion of 0.20 mm to 0.30 mm, and Height of the concave portion of 0.10 mm to 0.55 mm and the warpage after the curing is ±1.0 mm or less.

In this case, since the Rz of the surface (opening surface of the concave portion 13) contacting the bottom surface 33a of the upper concave portion 33 of the cured resin body 12 is in the range of 1 μM to 10 μm, the mold releasability of the cured resin body 12 from the upper mold 30 notably improves. Thus, the deformation and the cohesive failure of the molded resin body also including the cured resin body 12 are notably suppressed, so that the defective product ratio becomes very low. The mold releasability of the cured resin body 12 from the upper mold 30 more notably improves when using the above-described thermosetting resin composition (X) as the thermosetting resin or the thermosetting resin composition which gives the cured resin body 12.

The lead frame with the cured resin body 25 thus obtained has the configuration as illustrated in FIG. 15, for example. FIG. 15 shows views schematically illustrating the configuration of the molded resin body to be obtained by the manufacturing method for the molded resin body according to the present invention. FIG. 15(a) is a plan view, FIG. 15(b) is a partially enlarged plan view, and FIG. 15(c) is a partially enlarged cross sectional view along the X-X line in FIG. 15(b). The lead frame with the cured resin body 25 is an integrally molded body of the cured resin body 12 and the lead frame 21, in which the plurality of concave portions 13 are disposed in length and width directions, and the first and second leads constituting the lead frame 21 are exposed (not illustrated) to the bottom surface of each concave portion 13 through the insulating layer of the cured resin body 12. More specifically, the lead frame with the cured resin body 25 is an aggregate of the plurality of molded resin bodies. The lead frame with the cured resin body 25 as it is may be subjected to a mounting process of a light-emitting element or each molded resin body to be obtained by cutting the same may be subjected to a mounting process of a light-emitting element.

Although the transfer molding is used as the molding method for manufacturing a molded resin body in this embodiment, the invention is not limited thereto and various molding methods generally used for thermosetting resin such as thermoplastic resin, epoxy resin, and silicone resin, such as injection molding, RIM molding, casting molding, press molding, and compression molding, are used. Among the above, the transfer molding is preferable in terms of the fact that the molding cycle is short and the molding properties are good. The molding conditions can also be arbitrarily set. For example, the molding temperature is also arbitrarily set and is preferably 100° C. or more, more preferably 120° C. or more, and still more preferably 150° C. or more in terms of the fact that the curing is quickly achieved, the molding cycle is short, and the molding properties are likely to become good. After molding by the various methods mentioned above, post-curing (after cure) as required is also arbitrarily performed. The post-curing is likely to increase the heat resistance.

The molding may be performed at a fixed temperature or the temperature may be changed in a multistage manner or continuously as required. The reaction performed while changing the temperature in multistage manner or continuously is more preferable than the reaction performed at a fixed temperature in terms of the fact that a distortion-free uniform cured resin body is easily obtained. On the other hand, the reaction performed at a fixed temperature is preferable in terms of the fact that the molding cycle can be shortened.

The curing time can also be variously set. The reaction performed at a relatively low temperature for a long period of time is preferable in terms of the fact that a distortion-free uniform cured resin body is easily obtained. On the other hand, the reaction performed at a high temperature for a short period of time is preferable in terms of the fact that the molding cycle can be shortened.

The pressure in molding can also be variously set as required and the molding can also be performed at normal pressure, high pressure, or reduced pressure. The curing at reduced pressure is preferable in terms of the fact that the generation of voids is suppressed, the filling properties are improved, and volatile matter generated depending on the circumstances is easily removed. On the other hand, the curing in a pressurized state is preferable in terms of the fact that cracks in the molded body can be prevented.

[Surface-Mounted Light-Emitting Device]

A surface-mounted light-emitting device (hereinafter simply referred to as a "light-emitting device") of the present invention has a cured resin body integrally molded with a plurality of leads and a concave portion to which the plurality of leads are exposed at a bottom portion, in which the Rz of the opening surface of the concave portion is 1 μm or more and 10 μm or less, and has a molded resin body having a predetermined glass transition temperature, a predetermined optical reflectance, and a predetermined optical reflectance retention rate, a light-emitting element mounted on the bottom portion of the concave portion of the molded resin body and connected to the plurality of leads in such a manner that electricity can be conducted therebetween, and a transparent resin layer which seals the light-emitting element. On the bottom portion of the concave portion of the molded resin body, a plurality of light-emitting elements may be mounted.

More specifically, the light-emitting device of the present invention can have the same configuration as that of a former surface-mounted light-emitting device, except using a molded resin body having a cured resin body integrally molded with a plurality of leads, having a concave portion to which the plurality of leads are exposed at the bottom portion, and having an Rz of the opening surface of the concave portion of 1 μm or more and 10 μm or less as a molded resin body.

Herein, as the molded resin body, various kinds of molded resin bodies described above can be used. Moreover, all light-emitting elements formed heretofore can be used as the light-emitting element and, for example, a light-emitting diode (LED), a laser diode (LD), and the like are mentioned. The light-emitting diode includes a blue LED chip, an ultraviolet LED chip, a red LED chip, a green LED chip, a yellowish green LED chip, and the like and includes a chip having a PN junction structure or an NPN junction structure, a chip in which two electrodes are disposed in a horizontal manner or a vertical manner, and the like, for example.

The light-emitting element is connected to the plurality of leads in such a manner that electricity can be conducted therebetween, for example, by known connection methods such as wire bonding and flip chip bonding. The connection in such a manner that electricity can be conducted refers to a connection in which, when the light-emitting element has two electrodes and the plurality of leads have a first lead and a second lead, one electrode of the light-emitting element is connected to an inner lead portion of the first lead and the other electrode is connected to an inner lead portion of the second lead.

As a method for fixing the light-emitting element to the bottom portion of the concave portion of the molded resin body, a method for bonding the same using an adhesive is mentioned, for example. As the adhesive, silver paste, eutectic solder (AuSn, AuGe, AuSi, and the like), a golden bump, and the like are used, for example. The melting point of the eutectic solder is preferably in the range of 200° C. to 350° C. When using high output type LED, the p-n junction temperature increases. Therefore, it is preferable to use an eutectic solder, a golden bump, and the like which obtain a stable junction strength at a high temperature. The light-emitting element is fixed to the lead surface by forming an adhesive layer on the lead surface having a plating layer of the bottom portion of the concave portion of the molded resin body (At this time, the lead and the adhesive layer are electrically connected), placing the light-emitting element thereon, and then heating and melting the same, for example. The adhesive layer can be formed by general techniques such as printing of a paste material, dispensing, preforming, foil molding, metallizing, and a ball molding, for example.

The heat dissipation properties of the light-emitting device can be increased by providing the adhesive layer containing metal.

In the region where the light-emitting element is bonded on the lead surface, the flatness is preferably 0.001 to 50 μm. The flatness is indicated as the height at the center of the measurement region to a reference plane when a plane including three arbitrary corners of the region to be measured is defined as the reference plane. When the flatness is less than 0.001 μm, the surface of the plating layer formed on the lead surface becomes excessively smooth, so that the adhesion strength of the plating layer and the adhesive layer decreases, and the adhesive layer tends to be easily separated. When the flatness exceeds 50 μm, the junction area of the plating layer and the adhesive layer becomes small. As a result, there is a tendency that the heat dissipation properties of the light-emitting device decrease or the junction strength of the light-emitting element and the lead frame decreases.

As the transparent resin which seals the light-emitting element, all transparent resins for sealing used heretofore for the surface-mounted light-emitting device can be used and, for example, epoxy resin, silicone resin, acrylic resin, urea resin, imide resin, and the like are mentioned. Moreover, a thermosetting resin composition containing an aliphatic organic compound having at least two carbon-carbon double bonds having reactivity with an SiH group in one molecule, a compound containing at least two SiH groups in one molecule, and a hydrosilylation catalyst as proposed in JP-A Nos. 2002-80733 and 2002-88244 are preferably used as a sealing material from the viewpoint of the adhesion with the cured resin body contained in the molded resin body, transparency, and lightfastness.

The transparent resin layer may be obtained by injecting a liquid transparent resin into a cup, a cavity, a package (molded resin body) concave portion, and the like in which the light-emitting element is disposed at the bottom portion by a dispenser or another method, and then curing the same by heating or the like, for example. A solid-like composition or a high viscosity liquid-like composition may be made to flow by heating or the like, injected into a package concave portion or the like similarly as above, and then cured by heating or the like. The transparent resin can be formed also by transfer molding, injection molding, or insert molding.

Furthermore, a lens, in place of the transparent resin, may also be attached to the concave portion of the molded resin body after mounting the light-emitting element. The lens is not particularly limited and all lenses generally used in the field of the surface-mounted light-emitting element can be used or a transparent resin may be molded into a lens shape for use. On the other hand, hermetic sealing can also be performed by covering the same with glass or the like, without sealing with a transparent resin or attaching a lens.

The shape of the light-emitting device is not limited and various shapes used in the field of the surface-mounted light-emitting device can be adopted and a MAP type in which a cured resin body adheres to one surface of a metal lead frame is preferable. By the use of the MAP type, the effects of the present invention are easily obtained.

The light-emitting device of the present invention can be used in various known applications. Specifically, the light-emitting device of the present invention can be used in applications including backlights for liquid crystal display devices and the like, lighting devices, sensor light sources, vehicle instrument light sources, signaling lights, indicator lights, indicating devices, light sources of planar light emitters, displays, ornaments, various lights, and the like.

EXAMPLES

Hereinafter, the present invention is more specifically described with reference to Examples and Comparative Examples. In Examples, the ten-point average roughness (Rz), the glass transition temperature (Tg), the optical reflectance, and the solid $^{13}$CNMR spectrum were measured as follows.

[Ten-Point Average Roughness (Rz)]

The ten-point average roughness (Rz) of the opening surface of the concave portion of the molded resin body was measured under the conditions of Stylus R: 2 μm based on JISB0633:01/ISO04288:96 using a contour measuring instrument (SURFCOM500DX, manufactured by Tokyo Seimitsu Co., Ltd.).

[Glass Transition Temperature (Tg)]

A resin sample having a size of 2 to 5 mm in the longitudinal direction×0.5 to 1 mm in the width direction× Thickness of 0.5 to 1 mm was cut out from the molded resin body using a scalpel for operation manufactured by ELP. The sample was placed in a thermomechanical analyzer (Product name: TMA, Model: TMA/SS6100, manufactured by SII Nanotechnology), and changes in the coefficient of expansion were measured under nitrogen gas flow at a temperature elevation/lowering rate of 5° C./min in the range of −50° C. to 250° C. and a compression load of 29.4 mN to calculate the glass transition temperature. The average coefficient of thermal expansion at 23° C. to 150° C. in the measurement above can be defined as an average coefficient of linear expansion.

[Optical Reflectance]

The reflectance at wavelengths of 400 nm to 700 nm (20 nm interval) was measured using a micro spectrocolorimeter (Product name: VSS400 manufactured by Nippon Denshoku Industries Co., Ltd) to be defined as the optical reflectance. Herein, the measurement was performed at arbitrary four points (measurement area: 0.1 mmφ) of the opening surface of the concave portion of the molded resin body, and an average value of the obtained measurement values was defined as the optical reflectance at the wavelength.

The retention rate (%) of the optical reflectance after a thermal resistance test (test with heating in a 180° C. oven for 72 hours) (B) to the initial optical reflectance (A) was determined according to the following equation:

Retention rate (%)=[Optical reflectance (B)/(Optical reflectance (A)]×100.

[Solid $^{13}$CNMR Spectrum]

0.5 g of a resin sample was cut out from the molded resin body, crushed by a mortar, and then charged into a 3.2 mmφ solid NMR sample tube. The sample tube was loaded into a VARIAN NMR device (600 MHz), and then the $^{13}$C CP/MAS NMR measurement was carried out at a magic angle spinning speed of 20 kHz to determine the solid $^{13}$CNMR spectrum of the sample.

Synthesis Example 1

A stirrer, a dropping funnel, and a condenser tube were set in a four-necked 5-L flask. To this flask were added 1,800 g of toluene and 1,440 g of 1,3,5,7-tetramethylcyclotetrasiloxane, and then the flask was heated and stirred in a 120° C. oil bath. A mixed liquid of 200 g of triallyl isocyanurate, 200 g of toluene, and 1.44 mL of a xylene solution of platinum-vinylsiloxane complex (platinum content: 3% by weight) was added dropwise over 50 minutes. The obtained solution was heated and stirred as it was for 6 hours, and then unreacted 1,3,5,7-tetramethylcyclotetrasiloxane and toluene were distilled off under reduced pressure. It was found by the ¹H-NMR measurement that the obtained compound had the structure obtained by a reaction of a part of the SiH groups of 1,3,5,7-tetramethylcyclotetrasiloxane with triallyl isocyanurate shown in the following [Chemical Formula 33].

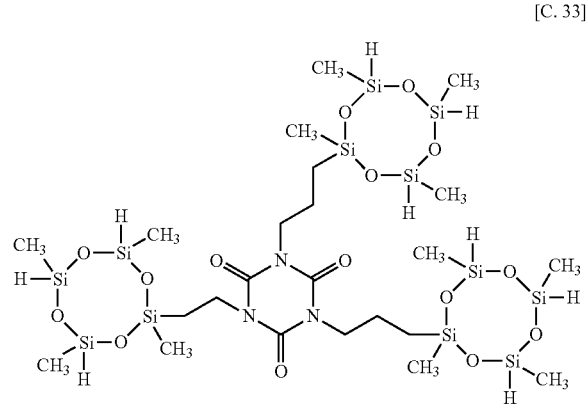 [SMILES: C[SiH]1O[SiH](C)O[Si](C)(CCCn2c(=O)n(CCC[Si]3(C)O[SiH](C)O[SiH](C)O[SiH](C)O3)c(=O)n(CC[Si]3(C)O[SiH](C)O[SiH](C)O[SiH](C)O3)c2=O)O[SiH](C)O1]

[C. 33]

Synthesis Example 2

A 2 L autoclave was charged with 720 g of toluene and 240 g of 1,3,5,7-tetramethylcyclotetrasiloxane. Then, the gas phase was replaced by nitrogen, and then heated and stirred at a jacket temperature of 50° C. A mixed liquid of 171 g of allyl glycidyl ether, 171 g of toluene, and 0.049 g of a xylene solution of platinum-vinylsiloxane complex (platinum content: 3% by weight) was added dropwise over 90 minutes. After the completion of the dropwise addition, the jacket temperature was raised to 60° C., and then a reaction was allowed to proceed for 40 minutes. It was confirmed that the reaction rate of allyl groups was 95% or more by the ¹H-NMR.

A mixed liquid of 17 g of triallyl isocyanurate and 17 g of toluene was added dropwise to the obtained reaction mixture. Then, the jacket temperature was raised to 105° C., and then a mixed liquid of 66 g of triallyl isocyanurate, 66 g of toluene, and 0.033 g of a xylene solution of platinum-vinylsiloxane complex (platinum content: 3% by weight) was further added dropwise over 30 minutes. Four hours after the completion of the dropwise addition, it was confirmed that the reaction rate of allyl groups was 95% or more by the ¹H-NMR, and then the reaction was stopped by cooling.

The ratio of unreacted 1,3,5,7-tetramethylcyclotetrasiloxane was 0.8%. The unreacted 1,3,5,7-tetramethylcyclotetrasiloxane, toluene, and byproducts of allyl glycidyl ether ((cis and trans products) via internal rearrangement of the vinyl group of allyl glycidyl ether) were distilled off under reduced pressure so as to be present in 5,000 ppm or less in total, so that a colorless transparent liquid was obtained. It was found by the ¹H-NMR measurement that the obtained compound was a compound obtained by a reaction of a part of the SiH groups of 1,3,5,7-tetramethylcyclotetrasiloxane with allyl glycidyl ether and triallyl isocyanurate and having the structure shown in the following [Chemical Formula 34] on average. In the following [Chemical Formula 34], a+b=3, c+d=3, e+f=3, a+c+e=3.5, b+d+f=5.5 were established.

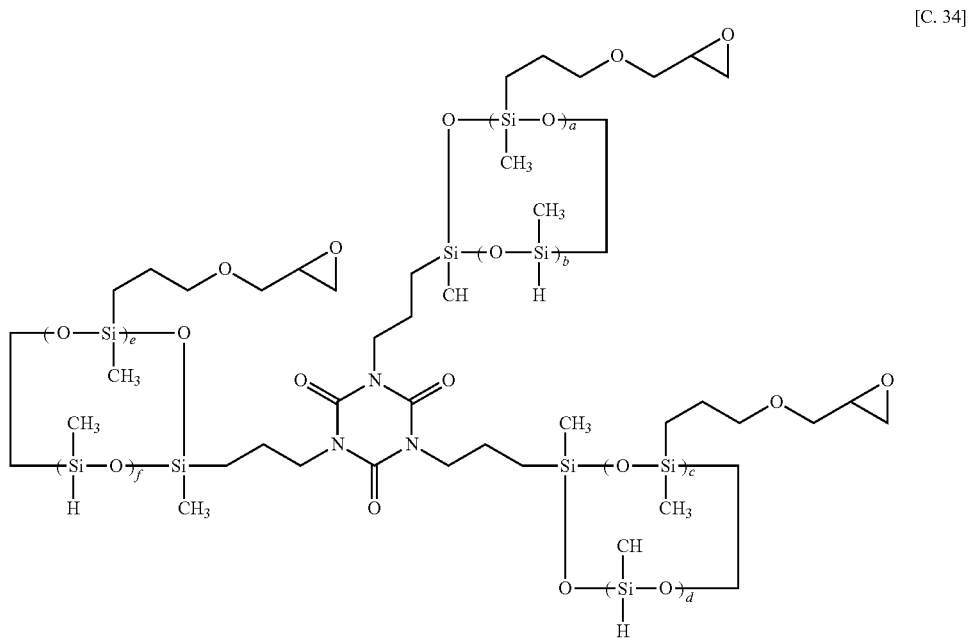

[C. 34]

Formulation Example 1

Components were mixed in the proportions shown in Table 1 to prepare thermosetting resin compositions A to D.

TABLE 1

| Components | | Thermosetting resin composition | | | |
|---|---|---|---|---|---|
| Type | Compound name | A | B | C | D |
| (A) | Triallylisocyanurate | 40.2 g | 2.9 g | 19.4 g | 58.3 g |
|  | Diallyl monoglycidyl isocyanurate |  | 28.1 g | 13.9 g | 41.71 g |
| (B) | Product of Synthesis Example 1 | 59.8 g |  | 29.3 g | 88.21 g |
|  | Product of Synthesis Example 2 |  | 60.0 g | 37.4 g | 112.48 g |
| (C) | Xylene solution of platinum-vinylsiloxane complex | 0.05 g | 0.018 g | 0.029 g | 0.09 g |
| Curing retardant | 1-ethynyl-1-cyclohexanol | 0.3 g | 0.1 g | 0.2 g | 0.49 g |

Example 1

50 parts by weight of the thermosetting resin composition C obtained in the formulation example shown in Table 1, 27 parts by weight of the following component (D), 557 parts by weight of the following component (E), and 239 parts by weight of the following component (F) were uniformly mixed to prepare a thermosetting resin composition (Xa). The components were weighed out in such a manner as to give 100 g in total with the ratio of each component, and then uniformly mixed. The same applied to the following Examples.

Component (D): Linear methyl phenyl silicone containing a vinyl group at both terminals thereof (Product name: PDV2331, manufactured by Gelest, Amount of the phenyl group based on all the substituents of 22 to 25% by mol.)

Component (E): Spherical silica (Product name: MSR-2212-TN, manufactured by Tatsumori Ltd., Specific gravity: 2.2, Average particle size: 24.8 µm, Ratio of particles having a size of 12 µm or less: 28%)

Component (F): Titanium oxide (Product name: TIPAQUE PC-3, manufactured by Ishihara Sangyo Kaisha, Ltd., Rutile type, Specific gravity: 4.2, Chloride process, Surface organic material: Al, Si; polymethylhydrogensiloxane, Average particle size: 0.21 µm, Ratio of particles having a size of 12 µm or less: 100%)

(Production of Molded Resin Body with MAP (Mold Array Package)-Like Lead Frame)

A Cu lead frame whose surface is plated with 3 µm thick Ag having a size of 50 mm in length, 55 mm in width, and 0.25 mm in thickness is prepared. The lead frame is an integrally molded article in which the frame units 22 illustrated in FIG. 14 are disposed in parallel to each other with vertical 15 rows and horizontal 12 rows. In each frame unit 22 of the lead frame, 180 molded resin bodies (reflector) were formed with an interval in length and width directions of 1.1 mm. Each molded resin body has a shape of the internal space of the concave portion of a reverse truncated cone shape in which the diameter of the opening surface of the concave portion was 2.1 mm, the diameter of the bottom portion of the concave portion was 1.8 mm, the inclination angle to the bottom surface of the concave portion of the inner wall surface of the concave portion was 75°, and the height was 0.55 mm, has an insulation portion having a width of about 0.2 mm extending in the vertical direction at a position 0.45 mm from the right end along the horizontal diameter of the bottom portion of the concave portion, and electrically insulates the first and second leads 23 and 24 of the frame unit 22.

The transfer molding was carried out using a G-Line manual press manufactured by Apic Yamada Corporation. The mold clamping force was 30 ton, the injection pressure was 7.7 MPa, and the injection rate was 3 mm/s. 5.0 g of a white compound (thermosetting resin composition (Xa)) was weighed out, formed into a cylindrical shape to form a tablet, and then loaded in a plunger pot. A spray type fluorine mold releasing agent (Product name: DAIFREE GA-7500, manufactured by Daikin Industries, Ltd.) was applied to the surface facing the internal space for molding of the mold. The molding conditions were 170° C./3 minutes and 7.8 to 13.7 MPa. In the mold used for the transfer molding, the Rz of the bottom surface of the upper concave portion formed in the upper mating surface of the upper mold was adjusted to 6.0 µm.

Furthermore, after the molding, 1 hour curing was performed at 180° C. When releasing the molded resin body from the upper mold, deformation of the molded resin body or breakage due to adhesive failure did not occur.

The obtained molded resin body was measured for the ten-point average roughness (Rz), the glass transition temperature (Tg), the optical reflectance, and the solid $^{13}$CNMR spectrum. The results are shown in Table 2.

[Evaluation of Warpage of Lead Frame with Cured Resin Body as Aggregate of Molded Resin Bodies]

The lead frame with the cured resin body was placed on a steel ruler having a surface roughness (Rz) of 0.8 µm, a flatness of 0.01 mm, and a size of 320 mm×212 mm×18 mm in such a manner that the cured resin body faced upward and the lead frame faced the ruler, a straight edge ruler (manufactured by Shinwa Rules Co., Ltd., Stainless steel linear scale of 150 mm) was positioned at right angle to a space between the lead frame with the cured resin body and the ruler, and then the distance of the space was measured to be defined as a warpage value. Or, a thickness gauge (manufactured by NAGAI GAUGES, 0.1 mm to 1.0 mm: 0.1 mm interval) was inserted into the space, and the value of the maximum gauge which can be inserted into space was defined as a warpage value. The value (mm) most distant from the ruler among the four sides of the lead frame with the cured resin body was defined as a warpage value of the lead frame with the cured resin body. The case where a concave shape is formed when the molded resin body is seen from the side is defined as a forward warpage (+) and the case where a convex shape is formed when the molded resin body is seen from the side is defined as a reverse warpage (−).

Example 2

5.25 parts by weight of the thermosetting resin composition D obtained in the formulation example shown in Table 1, 2.81 parts by weight of the following component (D), 58.23 parts by weight of the following component (E), 33.51 parts by weight of the following component (F), and 0.20 part by weight of the following component (G) were mixed to prepare a thermosetting resin composition (Xb).

Component (D): Linear methyl phenyl silicone containing a vinyl group at both terminals thereof (Product name: PDV-2331)

Component (E): Silica (MSR-2212-TN)

Component (F): Zinc oxide (One kind of zinc oxide, Specific gravity of 5.6, Average particle diameter of 0.6 μm, manufactured by Sakai Chemical Industry Co., Ltd.)

Component (G): Calcium stearate

A molded resin body was produced in the same manner as in Example 1, except using the thermosetting resin composition (Xb) obtained above in place of the thermosetting resin composition (Xa). When releasing the molded resin body from the upper mold, deformation of the molded resin body or breakage due to adhesive failure did not occur. The obtained molded resin body was measured for the ten-point average roughness (Rz), the glass transition temperature (Tg), the optical reflectance, and the solid $^{13}$CNMR spectrum. The results are shown in Table 2.

Even when the thermosetting resin compositions A and B shown in Table 1 were used in place of the thermosetting resin composition C in Example 1, the same results as those of Example 1 were obtained.

Comparative Example 1

100 parts by weight of methyltrichlorosilane and 200 parts by weight of toluene were put into a 1 L flask, and then a mixed liquid of 8 parts by weight of water and 60 parts by weight of isopropyl alcohol was added dropwise into the liquid under ice cooling while setting the internal temperature to −5 to 0° C. over 5 to 20 hours. Thereafter, the reaction mixture was heated, and then stirred at a reflux temperature for 20 minutes. Then, the mixture was cooled to room temperature, 12 parts by weight of water was added dropwise at 30° C. or less in 30 minutes, and then stirred for 20 minutes. Furthermore, 25 parts by weight of water was added dropwise, and then the mixture was stirred at 40 to 45° C. for 60 minutes. Thereafter, 200 parts by weight of water was added to separate the organic layer. By washing the organic layer until it became neutral, and then performing azeotropic dehydration, filtration, and vacuum strip, 36.0 parts by mass of thermosetting organopolysiloxane which was a colorless and transparent solid (Melting point of 76° C.) represented by the following formula was obtained.

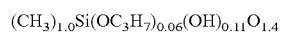

$(CH_3)_{1.0}Si(OC_3H_7)_{0.06}(OH)_{0.11}O_{1.4}$ 100 parts by weight of the thermosetting organopolysiloxane obtained above, 100 parts by weight of titanium dioxide (White pigment, Rutile type, Average particle diameter of 0.3 μm, Product name: PFC-104, manufactured by Ishihara Sangyo Kaisha, Ltd.), 560 parts by weight of an inorganic filler (Spherical fused silica, Average particle diameter of 20 μm, Product name: MSR-200, manufactured by Tatsumori Ltd.), 40 parts by weight of an inorganic filler (Spherical fused silica, Average particle diameter of 0.5 μm, Product name: Admafine S0-25R, manufactured by Admatechs), and 3 parts by weight of a curing catalyst (Zinc benzoate, manufactured by Wako Pure Chemical Industries, Ltd.) were uniformly molten and mixed with a continuous kneading kneader, and then cooled and crushed to prepare a silicone thermosetting resin composition.

A molded resin body was produced in the same manner as in Example 1, except using the silicone thermosetting resin composition obtained above and not adjusting the Rz of the bottom surface of the upper concave portion formed in the upper mold. When releasing the molded resin body from the upper mold, deformation and breakage of the molded resin body occurred. The obtained molded resin body was measured for the ten-point average roughness (Rz) of the opening surface of the concave portion, the glass transition temperature (Tg), the optical reflectance, and the solid $^{13}$CNMR spectrum. The results are shown in Table 2.

Comparative Example 2

From a commercially-available white LED electric bulb (Product name: EVERLEDS, manufactured by Panasonic Corporation), a light-emitting device was taken out, and then the molded resin body was measured for the ten-point average roughness (Rz), the glass transition temperature (Tg), the optical reflectance, and the solid $^{13}$CNMR spectrum. The results are shown in Table 2.

TABLE 2

|  |  | Examples | | Comparative Examples | |
| --- | --- | --- | --- | --- | --- |
|  |  | 1 | 2 | 1 | 2 |
| Molded resin body (cured resin body) materials | | Xa | Xb | *1 | *2 |
| Rz of opening surface of concave portion (μm) | | 6.4 | 8.6 | | 2.1 |
| Glass transitium temperature (Tg, ° C.) | | 158 | 120 | −2 | 169 |
| Optical reflectance (460 nm, %) | Initial optical reflectance | 95 | 92 | 91 | 90 |
|  | Optical reflectance after thermal resistance test 180° C. × 72 h | 94 | 91 | | 76 |
| Reflectance retention rate (%) | | 98 | 99 | | 69 |
| Yellowing after thermal resistance test (Appearance) | Before less | White | White | White | White |
|  | After test | White | White | White | Light yellow |
| Solid $^{13}$C NMR (Peak position) | [−1 to 2 ppm] | ○ (Observed) | ○ (Observed) | ○ (Observed) | X (Non-observed) |
|  | [13 to 18 ppm] | ○ (Observed) | ○ (Observed) | X (Non-observed) | X (Non-observed) |
| Average coefficient of linear expansion (23° C. to 150° C.) | [ppm] | 11 | 14 | 19 | 11 |
| Warpage of lead frame with cured resin body | Warpage [mm] | (Non-observed) 0 | Forward 0.3 | | |

*1 Silicone resin base
*2 EVERLEDS (Product name, manufactured by Panasonic Corporation) mounted LED package By adjusting the Rz of the opening surface of the concave portion in the molded resin body to be 1 µm to 10 µm as in Examples 1 and 2, when releasing the molded resin body from the upper mold, the occurrence of deformation of the molded resin body and breakage due to adhesive failure were notably suppressed.

The comparison of Examples 1 and 2 and Comparative Examples 1 and 2 in Table 2 shows that the use of the thermosetting resin composition (X) notably increases the optical reflectance, the heat resistance, and the reflectance retention rate. Although Comparative Example 1 shows good optical reflectance, the glass transition temperature is as low as −2° C., and therefore the strength when separating from the mold is not sufficient and the mechanical strength becomes insufficient when performing cutting processing associated with individualization of the molded resin body, so that sufficient quality as products is not satisfied, such as chipping of the molded resin portion.

Examples 3 to 10, Comparative Examples 3 and 4

To an upper mold of an upper and lower press plate of a precision hot press (Product name: CYPF-10, manufactured by Sintokogio, Ltd. Co., Ltd.), mold inserts different in the surface roughness (Ten-point average roughness (Rz)=0.9, 2.5, 5.8, 10.6, and 15.6 (µm)] were attached and a mold having a ten-point average roughness (Rz)=0.9 was attached to a lower mold thereof. Using the device, press molding of the thermosetting resin composition (Xa) or (Xb) was performed in such a manner as to achieve 170° C. for a curing time of 2 minutes, a mold releasing rate of 0.2 mm/s, and a sample shape of φ30×1 mm in thickness. Thereafter, the release mode of the molded product when opening the mold was evaluated.

In this case, the case where the molded resin body was released from the mold interface in the state where defects, such as cracks and breakage, did not occur in the molded resin body is defined as AF: Adhesive Failure and the case where cracking and breakage occurred in the molded resin body, such as sticking to the mold, was defined as CF: Cohesive failure.

When a flat plate sample was obtained, the ten-point average roughness Rz (µm) of the molded body surface and the optical reflectance (%)(@460 nm, N=5 on average) of the molded body surface were measured, and the surface appearance was observed. The surface state (unevenness) was observed with the naked eye, and evaluated. One having surface gloss and smoothness was evaluated as ○, one having surface gloss and unevenness which can be observed with the naked eye was evaluated as Δ, and one having low surface gloss and unevenness which can be observed with the naked eye was evaluated as x.

Moreover, the solid $^{13}$CNMR spectrum was measured.

The results of Examples 3 to 6 and Comparative Example 3 are shown in Table 3. The results of Examples 7 to 10 and Comparative Example 4 are shown in Table 4.

TABLE 3

|  | Example 3 | Example 4 | Example 5 | Example 6 | Comparative Example 3 |
|---|---|---|---|---|---|
| Thermosetting resin composition | Xa | Xa | Xa | Xa | Xa |
| Rz of upper mold surface (µm) | 0.9 | 2.5 | 5.8 | 10.6 | 15.6 |
| Release mode | AF | AF | AF | AF | AF |
| Rz of molded resin body surface (µm) | 1.9 | 4.4 | 5.4 | 5.8 | 14.7 |
| Optical reflectance of molded resin body surface (%) (N = 6 on average) | 92 | 92 | 92 | 92 | 90 |
| Appearance of molded resin body surface (Smoothness, Glass) | ○ | ○ | ○ | ○ | Δ |
| Sold $^{13}$C-NMR  [−1 to 2 ppm] peak top         [13 to 18 ppm] |  |  | ○ (Observed) ○ (Observed) |  |  |

TABLE 4

|  | Example 7 | Example 8 | Example 9 | Example 10 | Comparative Example 4 |
|---|---|---|---|---|---|
| Thermosetting resin composition | Xb | Xb | Xb | Xb | Xb |
| Rz of upper mold surface (µm) | 0.9 | 2.5 | 5.8 | 10.6 | 15.6 |
| Release mode | AF | AF | AF | AF | AF |
| Rz of molded resin body surface (µm) | 2 | 3.5 | 9 | 6.4 | 11.5 |
| Optical reflectance of molded resin body surface (%) (N = 5 on average) | 90 | 90 | 89 | 90 | 88 |
| Appearance of molded resin body surface (Smoothness, Glass) | ○ | ○ | ○ | ○ | X |
| Sold $^{13}$C-NMR  [−1 to 2 ppm] peak top         [13 to 18 ppm] |  |  | ○ (Observed) ○ (Observed) |  |  |

From Tables 3 and 4, the molded resin bodies obtained from the thermosetting resin compositions (Xa, Xb) used in Examples 3 to 6 and Examples 7 to 10 showed outstanding mold releasability and mechanical strength when molded using molds different in the ten-point average roughness (Rz=0.9 to 10.6).

Moreover, when the Rz of the molded resin body surface was 10 or more (Comparative Example 3, Comparative Example 4), the optical reflectance of the molded body surface decreased by about 2% as compared with the molded body obtained in Examples 3 to 6 and 7 to 10. Furthermore, by visual observation, the gloss degree decreased and the surface unevenness was observed with the naked eye.

Thus, by specifying the Rz of the molded body surface, the conditions under which a molded resin body having excellent optical reflectance is obtained became clear.

Formulation Example 2

Components shown in Table 5 below were mixed in the proportions shown in Table 5 to prepare thermosetting resin compositions (Xc) and (Xd).

TABLE 5

| Components | | Thermosetting resin composition | | | |
|---|---|---|---|---|---|
| Type | Compound name or Product name | Xc | | Xd | |
| | | wt % | vol % | wt % | vol % |
| Curable component | OE 6630 (A/B = 1/4)[1] | 9.34 | 24.1 | — | — |
| | ME-500/HV-540 = 1:1[2] | — | — | 9.34 | 21.6 |
| Component E | Spherical silica | 47.89 | 55.9 | 47.89 | 57.7 |
| Component F | Zinc oxide | 42.57 | 19.6 | 42.57 | 20.2 |
| Component G | Stearic acid Ca | 0.2 | 0.5 | 0.2 | 0.5 |

[1]Silicone resin (Product name: OE6630 A/B kit, A agent and B agent were mixed with a weight ratio of 1:4., manufactured by Dow Corning Toray Co., Ltd.)
[2]Epoxy resin (Product name: Pelnox (Registered trademark) ME-500, manufactured by Pelnox Ltd.) and a curing agent (Product name: Pelcure (Registered trademark) HV-540, manufactured by Pelnox Ltd.) were mixed with a weight ratio of 1:1.

Reference Examples 1 to 10

Press molding was carried out as follows under the same conditions as those of Examples 3 to 10 and Comparative Examples 3 and 4. To an upper mold of an upper and lower press plate of a precision hot press (CYPF-10), mold inserts different in the surface roughness (Ten-point average roughness (Rz)=0.9, 2.5, 5.8, 10.6, and 15.6 (μm)] were attached and a mold having a ten-point average roughness (Rz)=0.9 was attached to a lower mold. Using the device, press molding of the thermosetting resin composition (X) was performed in such a manner as to achieve 170° C. for a curing time of 2 minutes, a mold releasing rate of 0.2 mm/s, and a sample shape of φ30×1 mm in thickness. Thereafter, the release mode of the molded product when opening the mold was evaluated and the solid $^{13}$CNMR spectrum was evaluated. The results of Reference Examples 1 to 5 are shown in Table 6 and the results of Reference Examples 6 to 10 are shown in Table 7.

Under the applied curing conditions (170° C.×2 minutes), as shown in Tables 6 and 7, cohesive failure (CF) occurred in all the molded resin bodies containing the thermosetting resin compositions (Xc) and (Xd), the mold releasability was poor, and the resin strength was low irrespective of the mold roughness, so that a satisfactory molded body was not able to be obtained. Therefore, the glass transition temperature (Tg) was not able to be measured.

TABLE 6

| | Reference Example 1 | Reference Example 2 | Reference Example 3 | Reference Example 4 | Reference Example 5 |
|---|---|---|---|---|---|
| Thermosetting resin composition | Xc | Xc | Xc | Xc | Xc |
| Rz of mold surface (μm) | 0.9 | 2.5 | 5.8 | 10.6 | 15.6 |
| Release mode | CF | CF | CF | CF | CF |
| Rz of molded resin body surface (μm) | | | Unmeasurable | | |
| Optical reflectance of molded resin body surface (%) (N = 5 on average) | | | Unmeasurable | | |
| Appearance of molded resin body surface (Smoothness, Gloss) | | | Unobservable | | |
| Tg of molded resin body | | | Unmeasurable due to brittleness | | |
| Solid $^{13}$C-NMR peak top [−1 to 2 ppm] | | | ○ (Observed) | | |
| [13 to 18 ppm] | | | ○ (Observed) | | |

TABLE 7

| | Reference Example 6 | Reference Example 7 | Reference Example 8 | Reference Example 9 | Reference Example 10 |
|---|---|---|---|---|---|
| Thermosetting resin composition | Xd | Xd | Xd | Xd | Xd |
| Rz of mold surface (μm) | 0.9 | 2.5 | 5.8 | 10.6 | 15.6 |
| Release mode | CF | CF | CF | CF | CF |
| Rz of molded resin body surface (μm) | | | Unmeasurable | | |
| Optical reflectance of molded resin body surface (%) (N = 5 on average) | | | Unmeasurable | | |
| Appearance of molded resin body surface (Smoothness, Glass) | | | Unmeasurable | | |
| Tg of molded resin body | | | Unmeasurable due to brittleness | | |
| Sold $^{13}$C-NMR peak top [−1 to 2 ppm] | | | X (Non-observed) | | |
| [13 to 18 ppm] | | | X (Non-observed) | | |

Example 11

5.25 parts by weight of the thermosetting resin composition D, 2.81 parts by weight of the following component (D), 58.23 parts by weight of the following component (E), 33.51 parts by weight of the following component (F), and 0.20 part by weight of the following component (G) were mixed to prepare a thermosetting resin composition (Xb) in the same manner as in Example 2. Using this thermosetting resin composition (Xb), an aggregate of molded resin bodies was produced as follows.

Component (D): Linear methyl phenyl silicone containing a vinyl group at both terminals thereof (PDV-2331)
Component (E): Silica (MSR-2212-TN)
Component (F): Zinc oxide (One kind of zinc oxide, Specific gravity of 5.6, Average particle diameter of 0.6 μm, manufactured by Sakai Chemical Industry Co., Ltd.)
Component (G): Calcium stearate
(Production of MAP (Mold Array Package)-Type Molded Resin Body with Lead Frame)

A Cu lead frame having a size of 50 mm in length, 55 mm in width, and 0.25 mm in thickness is prepared. The lead frame is an integrally molded article in which the frame units 22 illustrated in FIG. 14 are disposed in parallel to each other with vertical 15 rows and horizontal 12 rows. On the lead frame surface, a 3 μm thick Ag plating layer was formed, and further an Au plating layer was formed on the surface of the Ag plating layer with a thickness in the range of 0.005 μm to 0.006 μm. In each frame unit 22 of the lead frame, 180 molded resin bodies (reflector) were formed with an interval in length and width directions of 1.1 mm. Each molded resin body has a shape of the internal space of the concave portion of a reverse truncated cone shape in which the diameter of the opening surface of the concave portion was 2.1 mm, the diameter of the bottom portion of the concave portion was 1.8 mm, the inclination angle to the bottom surface of the concave portion of the inner wall surface of the concave portion was 75°, and the height was 0.55 mm, has an insulation portion having a width of about 0.2 mm extending in the vertical direction at a position 0.45 mm from the right end along the horizontal diameter of the bottom portion of the concave portion, and electrically insulates the first and second leads 23 and 24 of the frame unit 22.

The transfer molding was carried out using a compact manual molding device (Product name: G-Line manual system, manufactured by Apic Yamada Corporation). The mold clamping force was 30 ton, the injection pressure was 7.7 MPa, and the injection rate was 3 mm/s. 5.0 g of a white compound (thermosetting resin composition Xb) was weighed out, formed into a cylindrical shape to form a tablet, and then loaded in a plunger pot. A spray type fluorine mold releasing agent (Product name: DAIFREE GA-7500, manufactured by Daikin Industries, Ltd.) was applied to the surface facing the internal space for molding of the mold. The molding conditions were 170° C./3 minutes and 7.8 to 13.7 MPa. In the mold used for the transfer molding, the Rz of the bottom surface of the upper concave portion formed in the upper mating surface of the upper mold was adjusted to 6.0 μm. Furthermore, after the molding, 1 hour curing was performed at 180° C. When releasing the molded resin body from the upper mold, deformation of the molded resin body or breakage due to adhesive failure did not occur.

Example 12

A three-layer plating layer of Ni—Pd—Au was formed on the surface of a Cu lead frame having 50 mm in length, 55 mm in width, and 0.25 mm in thickness in such a manner that the Au plating layer was the outermost surface layer. The thickness of the Ni plating layer was set in the range of 0.5 to 2.0 μm. The thickness of the Pd plating layer was set in the range of 0.01 to 0.15 μm. The thickness of the Au plating layer was set in the range of 0.003 to 0.01 μm. An aggregate of molded resin bodies was produced in the same manner as in Example 11, except using the lead frame.

Example 13

An aggregate of molded resin bodies was produced in the same manner as in Example 11, except using a Cu lead frame having 50 mm in length, 55 mm in width, and 0.25 mm in thickness on the surface of which an Ag plating layer having a thickness in the range of 2 to 5 μm was formed.

The molded resin bodies obtained in Examples 11 to 13 were measured for the ten-point average roughness (Rz) of the opening surface of the concave portion, the glass transition temperature (Tg), the optical reflectance, the initial luminance of a light-emitting device on which a light-emitting element was mounted, and the sulfuration resistance of the used lead frame. The results are shown in Table 8.

[Evaluation of Light Emission Properties]

A light-emitting element (Product name: B1213, manufactured by Genetits) was bonded to each concave portion of the aggregate of molded resin bodies (molded resin body with the lead frame) obtained above using a die bonder device and an epoxy die bond agent (Product name: DX-20C, manufactured by Henkel), and then first and second inner lead portions exposed to the bottom portion of each concave portion and the light-emitting element were wire-connected by a wire bonding device. Subsequently, to each concave portion, a silicone sealing material (OE6630, manufactured by Dow Corning Toray Co., Ltd., Transparent curable resin in which A agent and B agent were mixed with a ratio of 1:4, respectively) was dispensed with a dispenser device to seal a portion where the light-emitting element was mounted. Thereafter, curing at 150° C. for 2 hours was carried out to thereby obtain a set board of a surface-mounted light-emitting device. Dicing of the set board was carried out to the size of 30 mm×30 mm with a dicing device to obtain individualized surface-mounted light-emitting devices. The evaluation of the light emission properties was performed using a luminous intensity meter according to CIE127 (Condition B). A surface-mounted light-emitting device was mounted on a printed circuit board for evaluating energization, a 20 mA constant current was applied, and then the initial luminance at that time (cd: Equivalent to Candela) was measured.

[Sulfuration Resistance Test of Lead Frame]

The sulfuration resistance of a Cu lead frame subjected to Ag plating, Au—Ag plating, and Au—Pd—Ni plating was evaluated by the following technique. The previous gloss degree (value) of the lead frame surface was measured. Subsequently, 200 mL of pure water and 5 mL of a polysulfide component (Product name: Yu no moto, manufactured by Murakami Shokai) were put in a beaker (1 L), and then warmed to 80° C. under stirring with a heater with a magnetic stirrer. Each lead frame was stuck to an acrylic board, and then the beaker was covered in such a manner that the lead frame enters an opening portion of the beaker. During the process, hydrogen sulfide was generated, and exposed to the lead frame. 30 minutes later, the beaker was uncovered, and the reflection density (BLK value) of a lead frame sample was measured using a micro spectrocolorimeter (Product name: VSS400, manufactured by Nippon Denshoku, Industries Co., Ltd.)

[Sulfuration Resistance Test of Surface-Mounted Light-Emitting Device]

The individualized surface-mounted light-emitting devices were allowed to stand for 96 hours under an environment of 60° C., a humidity of 80%, and 3 ppm of hydrogen sulfide. Thereafter, the light-emitting devices were taken out, and then the color change of the lead frame (visual observation) and the initial luminance were measured by the above-described technique.

TABLE 8

| | | Example 11 | Example 12 | Example 13 |
|---|---|---|---|---|
| Lead frame plating material | | Au—Ag | Au—Pd—Ni | Ag |
| Rz of opening surface of concave portion (μm) | | 5.6 | 5.7 | 5.7 |
| Glass transition temperature (Tg. ° C.) | | 120 | 120 | 120 |
| Optical reflectance (460 nm, %) | Initial optical reflectance | 92 | 92 | 92 |
| | Optical reflectance after thermal resistance test (180° C. × 72 h) | 91 | 91 | 91 |
| Optical reflectance retention rate (%) | | 99 | 99 | 99 |
| Yellowing after thermal resistance test (Appearance) | | White | White | White |
| Initial luminance of light-emitting device (Equivalent to ed. N2) | | 0.74 | 0.58 | 0.98 |
| Initial luminance of light-emitting device after sulfuration test (Equivalent to ed. N2) | | 0.74 | 0.56 | 0.69 |
| Color of lead frame immediately under sealing resin after sulfuration test | | Light gold | Light gold | Dark brown |
| Lead frame surface before sulfuration test | Previous BLK value | 1.3 | 1.0 | 1.4 |
| | Appearance | Light gold | Light gold | Silver |
| Lead frame surface after sulfuration test | Post BLK value | 1.3 | 1.0 | 1.0 |
| | Appearance | Light gold | Light gold | Black |
| ΔBLK After sulfuration test − Before sulfuration test | | 0.0 | 0.0 | −0.4 |

In all the molded resin bodies of Examples 11 to 13, deformation and breakage did not occur when releasing them from the mold, the optical reflectance and the optical reflectance retention rate are also good, and the initial luminance before and after the sulfuration test is in the range of about 0.5 to about 1, so that the molded resin bodies are sufficiently practically used. In the molded resin body of Example 13, the Ag plating layer was colored into dark brown after the sulfuration test and the initial luminance decreased to a level of about 70% before and after the sulfuration test. On the other hand, in the molded resin bodies of Examples 11 and 12, a slight reduction in the initial luminance before the sulfuration test which is considered to result from the plating material due to the formation of the Au plating layer as the outermost surface layer was observed but the changes in the initial luminance before and after the sulfuration test were not observed. Therefore, it was clarified that, by forming the Au plating layer of a predetermined thickness as the outermost surface layer, a reduction in the light emission luminance was suppressed and the long-term reliability of the surface-mounted light-emitting element can be further increased.

Examples 14 to 16

In the mold 20 illustrated in FIG. 10, the peripheral surface 32b of the first convex portion 32 was divided into a first peripheral surface continuous to a top surface 32a of the first convex portion 32 and a second peripheral surface continuous to the first peripheral surface. The inclination angle (Angle of the corner formed by the top surface 32a and the first peripheral surface) to the top surface 32a of the first peripheral surface was set to 90° (Examples 14 and 15) or 120° (Example 16), the inclination angle (Angle of the corner formed by the top surface 32a and the extension of the second peripheral surface) to the top surface 32 of the second peripheral surface was set to 140° (Example 14) or 150° (Examples 15 and 16), and the boundary of the first peripheral surface and the second peripheral surface was defined as a region at a height of 100 μm (Examples 14 and 15) or 50 μm (Example 16) from the top surface 32a in the peripheral surface 32b. A first convex portion 32 having the peripheral surface 32b formed by the first peripheral surface and the second peripheral surface and a first convex portion 32 having a peripheral surface 32b in which the inclination angle to the bottom surface 32a is fixed to 140° were alternately provided in length and width directions. The ten-point average roughness Rz of a bottom surface 33a of the upper concave portion 33 was adjusted to 6.0 μm.

A MAP-type molded resin body with lead frame was produced in the same manner as in Example 1, except using the mold and using the thermosetting resin composition (Xb) in place of the thermosetting resin composition (Xa). When releasing the obtained molded resin body from the upper mold, deformation and breakage due to adhesive failure of the molded resin body did not occur and resin chipping or an adhesion of a resin flash burr (hereinafter simply referred to as a "resin burr") to the lead frame in a portion contacting the lead frame of the cured resin body also did not occur. According to the Examples, aggregates of the molded resin bodies having a concave portion were obtained in which an inclination angle α1 of a first inclined surface 61, an inclination angle α2 of a second inclined surface 60, and, with respect to the boundary of the first inclined surface 61 and the second inclined surface 60, the height (h) from the bottom surface 13a in the inner wall surface of the concave portion 13b illustrated in FIG. 8 were values as shown in FIG. 9.

Examples 17 and 18

A MAP-type molded resin body with lead frame was produced in the same manner as in Example 14, except not dividing the peripheral surface 32b of the first convex portion 32 into the first peripheral surface and the second peripheral surface and setting the angle of the corner formed by the top surface 32a and the peripheral surface 32b to 150° (Example 17) or 140° (Example 18). When releasing the obtained molded resin body from the upper mold, deformation and breakage due to adhesive failure of the molded resin body hardly occurred. According to the Examples, aggregates of the molded resin bodies having a concave portion in which the inclination angle to the bottom surface 13a of the inner wall surface 13b was a value shown in Table 9 were obtained.

TABLE 9

|  | Example 14 | Example 15 | Example 16 | Example 17 | Example 18 |
|---|---|---|---|---|---|
| a1 (°) | 40 | 30 | 30 | 30 | 40 |
| a2 (°) | 90 | 90 | 60 | 30 | 40 |
| h (μm) | 100 | 100 | 50 | 0 | 0 |
| Resin chipping | Non-observed | Non-observed | Non-observed | Observed | Observed |
| Resin burr | Non-observed | Non-observed | Non-observed | Observed | Observed |

After molding, when the interface of the cured resin body and the lead frame and the lead frame exposed to the concave portion were visually observed, resin chipping and a resin burr were hardly observed in the aggregates of the molded resin bodies of Examples 14 to 16. On the other hand, in the aggregates of molded bodies of oil and fats in Examples 17 and 18, resin chipping and a resin burr were slightly visually observed and very minute resin chipping and resin burr were observed by the confirmation under an optical microscope. It is clarified from the comparison of Examples 14 to 16 and Examples 17 and 18 that the occurrence of resin chipping or a resin burr is notably suppressed by forming the concave portion having the inner wall surface formed by the second inclined surface having an inclination angle of 45° to 90° and the first inclined surface having an inclination angle of more than 0° and 45° or less.

REFERENCE SIGNS LIST 1, 2, 3, 4, 5, 6 Molded resin body
1a, 4a, 4b, 4c, 4d Outer surface
10, 56a First lead
10a First inner lead portion
10b First outer lead portion
11, 56b Second lead
11a Second inner lead portion
11b Second outer lead portion
12, 14, 16, 17, 57 Cured resin body
12a Reflective portion
12b, 17b Insulation portion
12c, 17c Opening surface of concave portion
13, 15 Concave portion
13a Bottom portion
13b Inner wall surface
18 Plating Layer
18a Outermost surface layer
18b Second metal layer
20 Mold
21 Lead frame
22 Frame unit
23 First Lead
24 Second Lead
25 Lead frame with cured resin body
30 Upper mold
31 Upper mating surface
32 First convex portion
34 Second convex portion
33 Upper concave portion
33a Bottom surface
35 Lower mold
36 Lower mating surface
40 Resin injection hole
41 Plunger
42 Runner
43 Through-hole
44 Plunger pot
45 Thermosetting resin tablet or Liquid thermosetting resin
50 Surface-mounted light-emitting device
51 Light-emitting element
52a First gold wire
52b Second gold wire
55 Former molded resin body
58 Resin burr
59 Resin chipping
60 Second inclined surface
61 First inclined surface

The invention claimed is:
1. A molded resin body for surface-mounted light-emitting device, comprising:
a cured resin body integrally molded with a plurality of leads and a concave portion to which the plurality of leads are exposed at a bottom portion of the concave portion,
wherein a ten-point average roughness (Rz) of an opening surface of the concave portion is 1 μm or more and 10 μm or less,
a glass transition temperature of the cured resin body is 10° C. or higher and the glass transition temperature is a value measured using a thermomechanical analyzer (TMA) under conditions of a temperature range of −50 to 250° C., a temperature elevation rate of 5° C./min, and a sample size length of 1 to 5 mm, and
an optical reflectance at 460 nm of the opening surface of the concave portion is 80% or more and an optical reflectance retention rate on the opening surface after heating the molded resin body at 180° C. for 72 hours is 90% or more,
wherein the opening surface of the concave portion is a surface where the concave portion opens in a thickness direction of the molded resin body, and
the cured resin body is a cured substance of a thermosetting resin composition (X) containing (A) an organic compound containing at least two carbon-carbon double bonds having reactivity with an SiH group in one molecule, (B) a compound containing at least two SiH groups in one molecule, (C) a hydrosilylation catalyst, (D) a silicone compound containing (i) a skeleton formed by a Si—O—Si bond, (ii) at least one group selected from the group consisting of an alkyl group, an aryl group, an alkoxy group, and a hydroxyl group, as a substituent to be bonded to a skeleton, and (iii) at least one carbon-carbon double bond having reactivity with an SiH group in one molecule, and (E) an inorganic filler.
2. The molded resin body for surface-mounted light-emitting device according to claim 1, wherein at least one peak top in a solid $^{13}$C-nuclear magnetic resonance spectrum of the cured resin body is present in a range of −1 ppm to 2 ppm and 13 ppm to 18 ppm.

3. The molded resin body for surface-mounted light-emitting device according to claim 1, wherein at least one of the plurality of leads has a metal layer on a surface thereof, the metal layer has an outermost surface layer on a surface side thereof, and the outermost surface layer is an Au layer, an Au alloy layer, or a glossy Ni layer having a thickness of 0.003 to 0.05 μm.

4. The molded resin body for surface-mounted light-emitting device according to claim 3, wherein the metal layer has the outermost surface layer and a second metal layer provided between the surface of the at least one of the plurality of leads and the outermost surface layer, and the second metal layer is an Ag layer, a Pd layer, or a laminated body of an Ag layer and a Pd layer.

5. The molded resin body for surface-mounted light-emitting device according to claim 3, wherein the metal layer is a plating layer.

6. The molded resin body for surface-mounted light-emitting device according to claim 1, wherein
the concave portion has a bottom surface which is a surface of the plurality of leads exposed at the bottom portion,
an inner wall surface of the concave portion has a second inclined surface which is continuous to the bottom surface and rises from a periphery of the bottom surface and has an inclination angle to the bottom surface of 45° to 90° and a first inclined surface which is continuous to the second inclined surface and rises from a periphery of the second inclined surface towards the opening surface and has an inclination angle to the bottom surface of more than 0° and 45° or less, and a boundary of the first inclined surface and the second inclined surface is located at a position where a height from the bottom surface to the boundary of the first inclined surface and the second inclined surface is more than 0 μm and 100 μm or less.

7. The molded resin body for surface-mounted light-emitting device according to claim 1, wherein
the plurality of leads include a first lead and a second lead which are disposed in such a manner as to be separated from each other,
the cured resin body contains an insulation portion which is provided between the first lead and the second lead and insulates the leads, and the insulation portion is exposed to the bottom portion of the concave portion in a state where the insulation portion is sandwiched between the first lead and the second lead.

8. The molded resin body for surface-mounted light-emitting device according to claim 7, wherein the first lead contains a first inner lead portion exposed to the bottom portion of the concave portion and a first outer lead portion in contact with the cured resin body and the second lead contains a second inner lead portion exposed to the bottom portion of the concave portion and a second outer lead portion in contact with the cured resin body.

9. The molded resin body for surface-mounted light-emitting device according to claim 8, wherein at least one of the first outer lead portion or the second outer lead portion is projecting beyond a side surface of the cured resin body.

10. The molded resin body for surface-mounted light-emitting device according to claim 8, wherein a side surface of the cured resin body and a side surface of the first outer lead portion and/or the second outer lead portion integrally form a plane surface on a side surface of the molded resin body.

11. The molded resin body for surface-mounted light-emitting device according to claim 8, wherein the first inner lead portion and the second inner lead portion have a metal layer on surfaces thereof and the first outer lead portion and the second outer lead portion do not have a metal layer on the surfaces thereof.

12. The molded resin body for surface-mounted light-emitting device according to claim 1, wherein the (D) silicone compound is straight chain polysiloxane having a vinyl group at both ends of the skeleton formed by the Si—O—Si bond.

13. A surface-mounted light-emitting device, comprising:
the molded resin body for surface-mounted light-emitting device according to claim 1
a light-emitting element which is mounted on the bottom portion of the concave portion of the molded resin body and is connected to the plurality of leads in such a manner that electricity can be conducted therebetween, and
a transparent resin that fills the concave portion and thereby seals the light-emitting element.

14. The surface-mounted light-emitting device according to claim 13, wherein the light-emitting element comprises a plurality of light-emitting elements, and the plurality of light-emitting elements are mounted on the bottom portion of the concave portion.

* * * * *